(12) United States Patent
Gilson

(10) Patent No.: US 7,525,457 B2
(45) Date of Patent: Apr. 28, 2009

(54) TRANSFORMING DESIGN OBJECTS IN A COMPUTER BY CONVERTING DATA SETS BETWEEN DATA SET TYPES

(75) Inventor: Kent L. Gilson, Draper, UT (US)

(73) Assignee: Star Bridge Systems, Inc., Midvale, UT (US)

( * ) Notice: Subject to any disclaimer, the term of this patent is extended or adjusted under 35 U.S.C. 154(b) by 0 days.

(21) Appl. No.: 11/623,019

(22) Filed: Jan. 12, 2007

(65) Prior Publication Data

US 2007/0150501 A1 Jun. 28, 2007

Related U.S. Application Data

(62) Division of application No. 09/747,602, filed on Dec. 22, 2000, now Pat. No. 7,197,505.

(60) Provisional application No. 60/258,112, filed on Dec. 22, 2000.

(51) Int. Cl.
*H03M 5/00* (2006.01)

(52) U.S. Cl. .................. 341/55; 707/102; 708/524; 712/204; 712/225; 712/221

(58) Field of Classification Search ............ 341/50–90; 707/102; 708/524; 712/204, 225, 221
See application file for complete search history.

(56) References Cited

U.S. PATENT DOCUMENTS

| 4,775,950 A | 10/1988 | Terada et al. |
| 5,111,413 A | 5/1992 | Lazansky et al. |
| 5,422,833 A | 6/1995 | Kelem et al. |
| 5,499,192 A | 3/1996 | Knapp et al. |
| 5,555,201 A | 9/1996 | Dangelo et al. |
| 5,594,443 A * | 1/1997 | Lam .......................... 341/144 |
| 5,600,568 A | 2/1997 | Iwakura et al. |
| 5,613,117 A | 3/1997 | Davidson et al. |
| 5,633,813 A | 5/1997 | Srinivasan |
| 5,692,183 A | 11/1997 | Hapner et al. |

(Continued)

FOREIGN PATENT DOCUMENTS

JP 05-143675 11/1991

(Continued)

OTHER PUBLICATIONS

Chung, M.J. et al., *An Object-Oriented VHDL Design Environment*, (1990) 27th ACM/IEEE Design Automation Conference, Paper 24.3, pp. 431-432.

(Continued)

*Primary Examiner*—Lam T Mai
(74) *Attorney, Agent, or Firm*—Workman Nydegger

(57) ABSTRACT

A computer implemented method converts a data set of a first type to a data set type of a second type. The method includes casting up a first data set of a first type to a prescribed data set type that is large enough to encompass a data set of a second type. The method then includes casting down the casted up first data set from the prescribed data set type to the second data set of the second data set type.

9 Claims, 63 Drawing Sheets

U.S. PATENT DOCUMENTS

| | | | |
|---|---|---|---|
| 5,761,426 | A | 6/1998 | Ishizaki et al. |
| 5,815,402 | A | 9/1998 | Taylor et al. |
| 5,950,201 | A | 9/1999 | Van Huben et al. |
| 5,986,589 | A * | 11/1999 | Rosefield et al. ............... 341/61 |
| 6,044,211 | A | 3/2000 | Jain |
| 6,075,932 | A | 6/2000 | Khouja et al. |
| 6,094,654 | A | 7/2000 | Van Huben et al. |
| 6,132,969 | A | 10/2000 | Stoughton et al. |
| 6,135,647 | A | 10/2000 | Balakrishnan et al. |
| 6,195,665 | B1 | 2/2001 | Jarett |
| 6,230,307 | B1 | 5/2001 | Davis et al. |
| 6,922,685 | B2 | 7/2005 | Greene et al. |
| 7,072,818 | B1 | 7/2006 | Beardslee et al. |
| 7,145,480 | B2 * | 12/2006 | Ford et al. .................... 341/10 |
| 7,197,505 | B2 * | 3/2007 | Gilson ......................... 707/102 |
| 7,227,478 | B1 * | 6/2007 | Hendrix et al. ............... 341/61 |
| 2001/0011254 | A1 | 8/2001 | Clark |
| 2007/0130179 | A1 | 6/2007 | Gilson |
| 2007/0130196 | A1 | 6/2007 | Gilson |
| 2007/0150858 | A1 | 6/2007 | Gilson |
| 2007/0150860 | A1 | 6/2007 | Gilson |

FOREIGN PATENT DOCUMENTS

| | | |
|---|---|---|
| JP | 11-53424 | 8/1997 |
| WO | WO 02/052412 | 7/2002 |

OTHER PUBLICATIONS

DiMora, A.J. et al., *License and Lease Agreement between Star Bridge Systems, Inc., and Ceristar, Inc.* (executed Oct. 7, 1999), 21 pgs.

DiMora, A.J. et al., *License and Agreement of Sale between Star Bridge Systems, Inc., and icaveo, Inc.* (executed Apr. 30, 1999), 22 pgs.

Jin, Lan et al., *Introducing Java into the teaching of distributed systems*, IEEE, 1999, pp. 12b3-16 to 12b3-21.

Yu, Ge et al., *Transaction management for a distributed object storage WAKASHI-design, implementation and performance*, IEEE, 1996, pp. 460-468.

Supplementary Partial European Search Report (Jul. 28, 2005) for EP patent application No. 01992272, 4 pgs.

Kossman, Donald et al., *Iterative Dynamic Programming: A New Class of Query Optimization Algorithms*, ACM, 2000, pp. 43-82.

El-Kwae, Essam A. et al., *A Robust Framework for Content-Based Retrieval by Spatial Similarity in Image Databases*, ACM, 1999, pp. 174-198.

U.S. Appl. No. 11/623,012, mailed Nov. 24, 2008, Office Action.

* cited by examiner

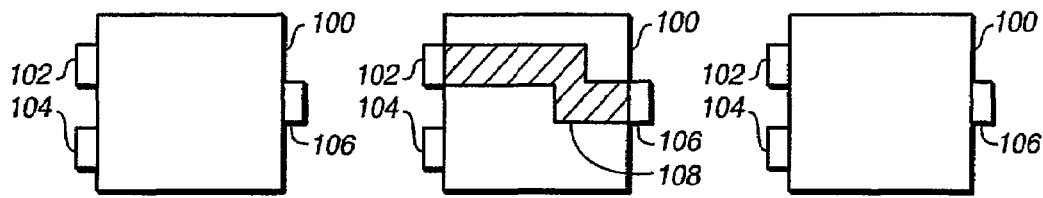
FIG._A1    FIG._A2    FIG._A3
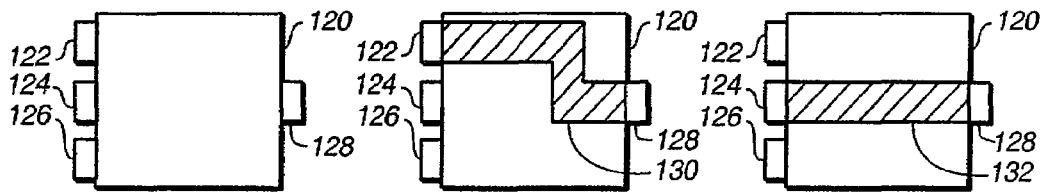
FIG._B1    FIG._B2    FIG._B3
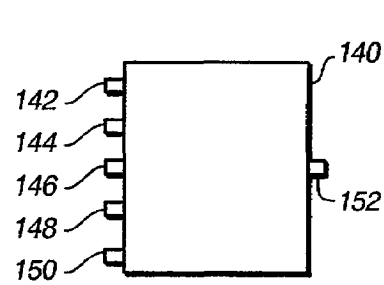
FIG._C1
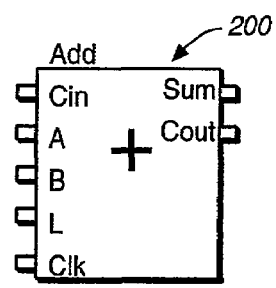
FIG._D1
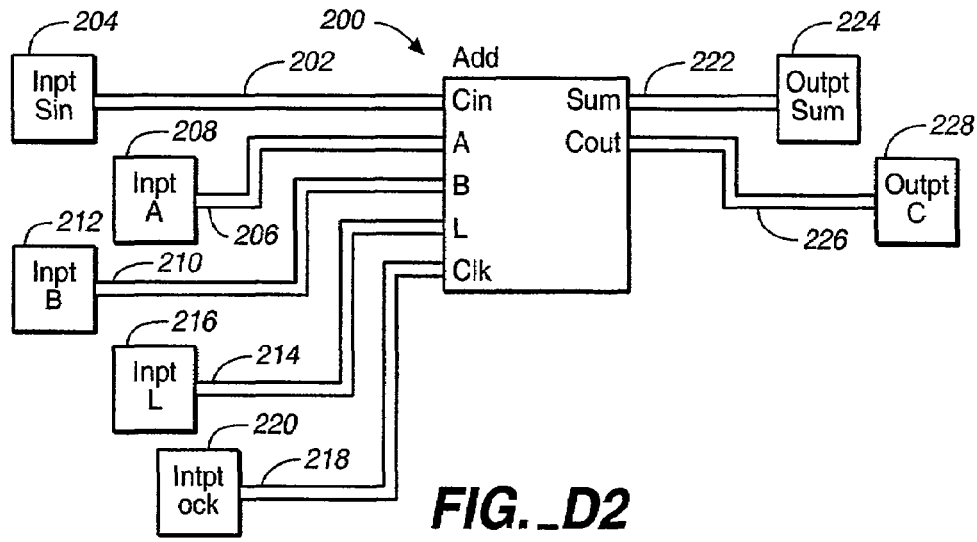
FIG._D2

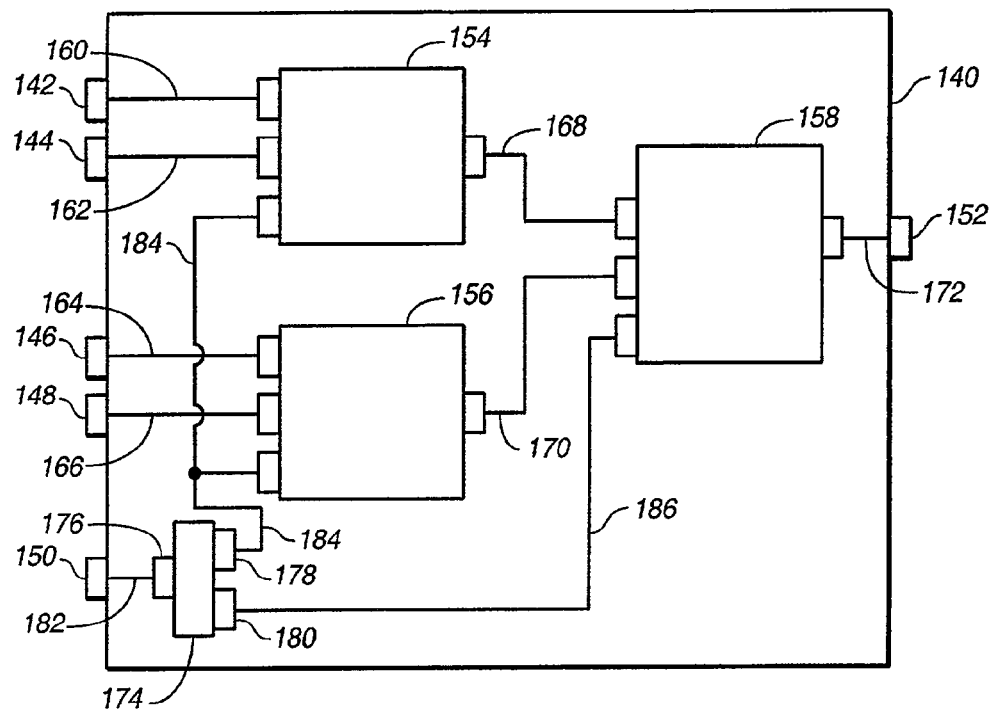
FIG._C2
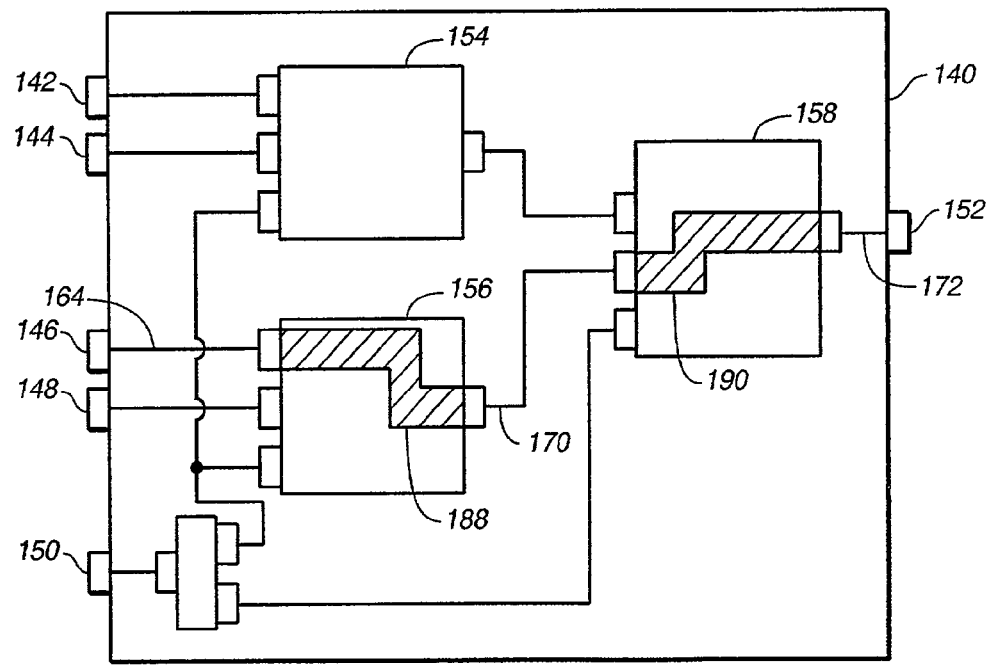
FIG._C3

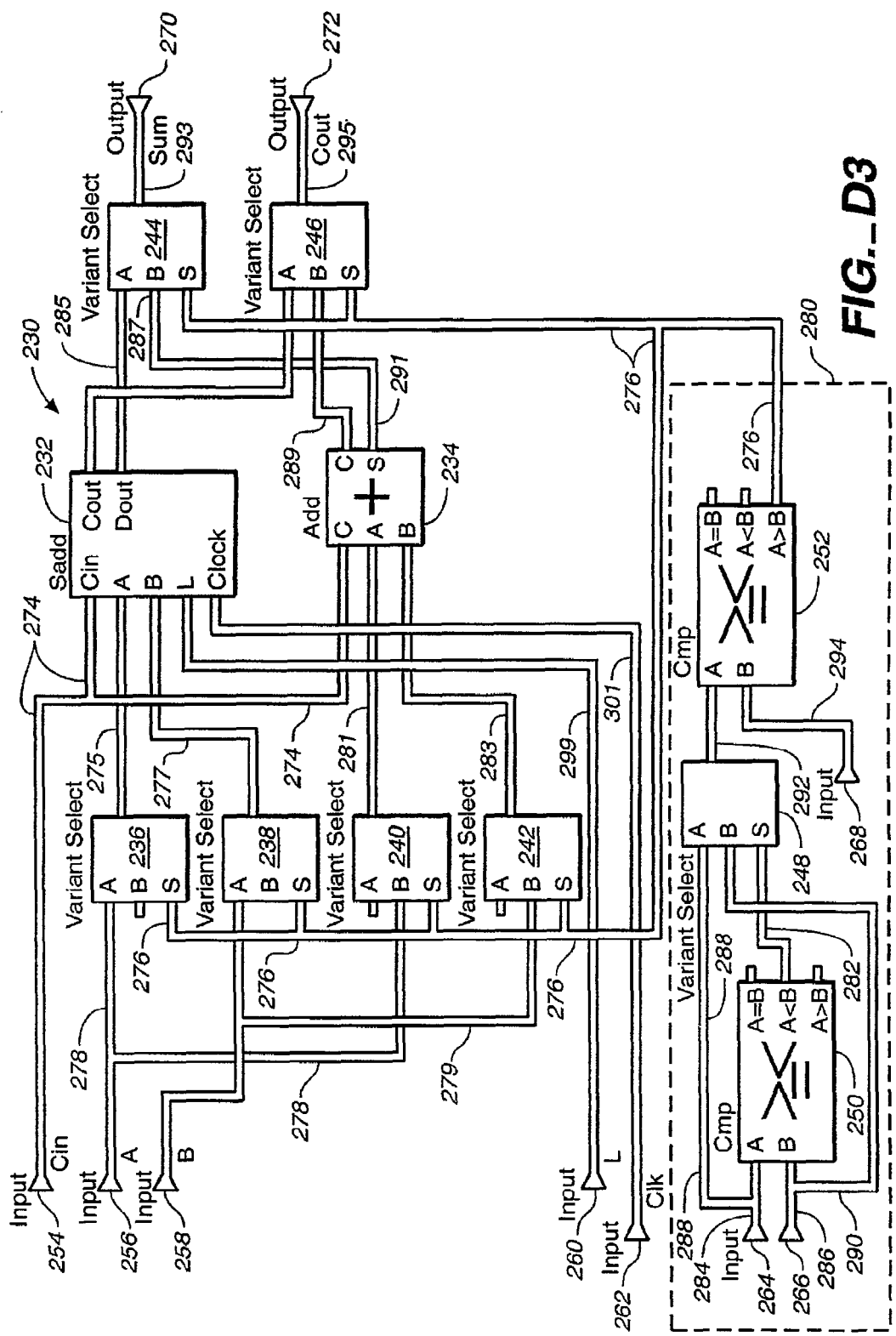
FIG._D3

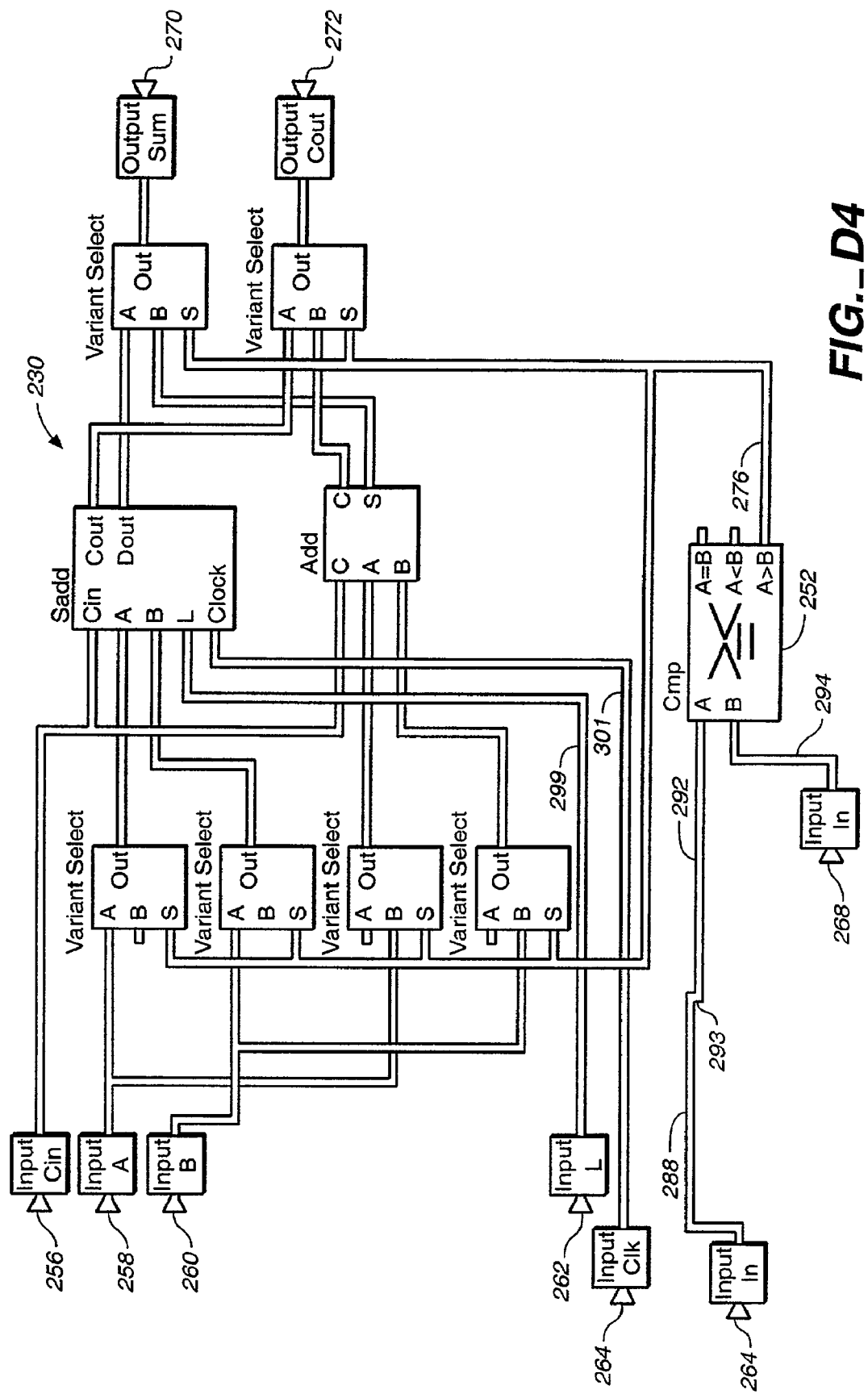
FIG._D4

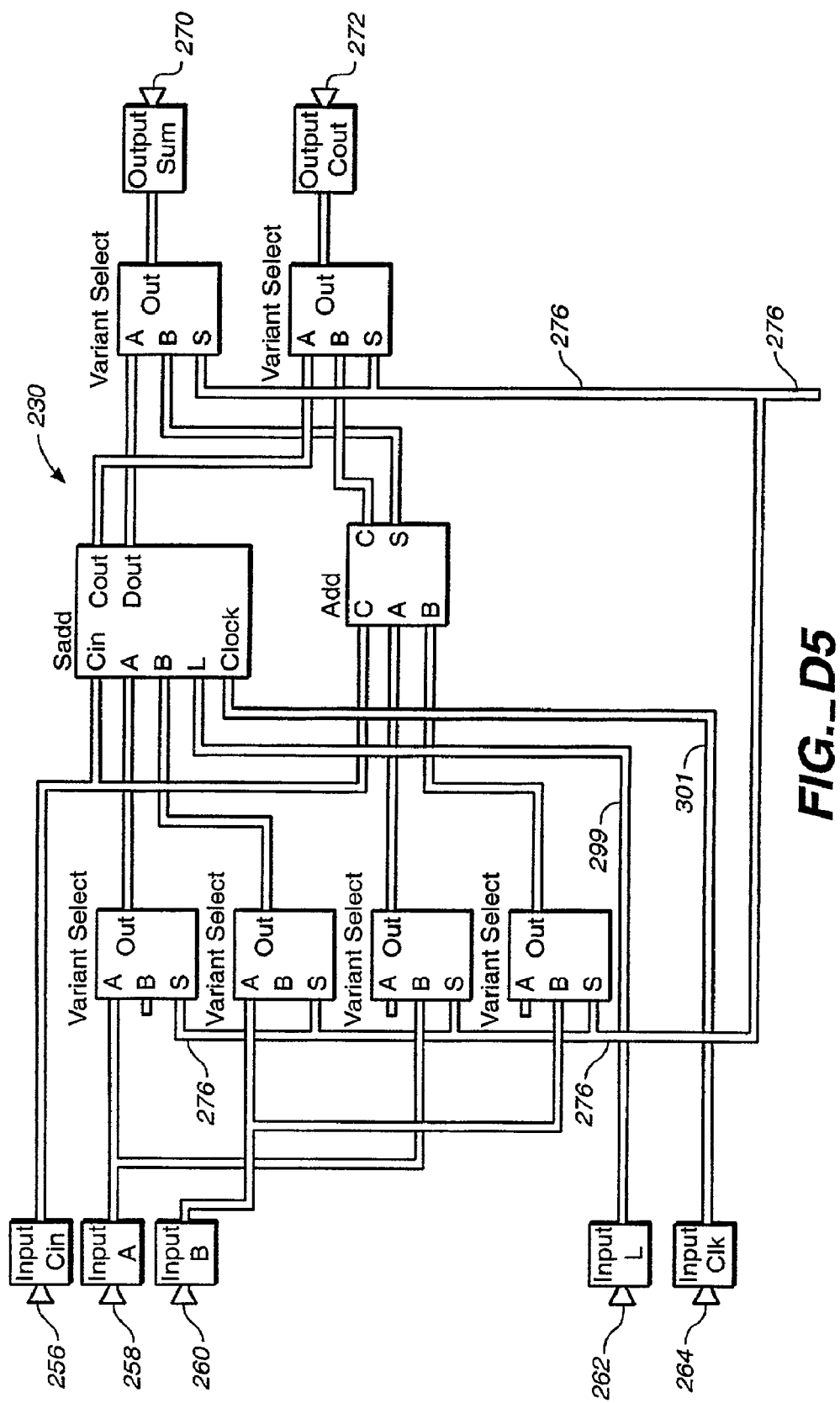
FIG._D5

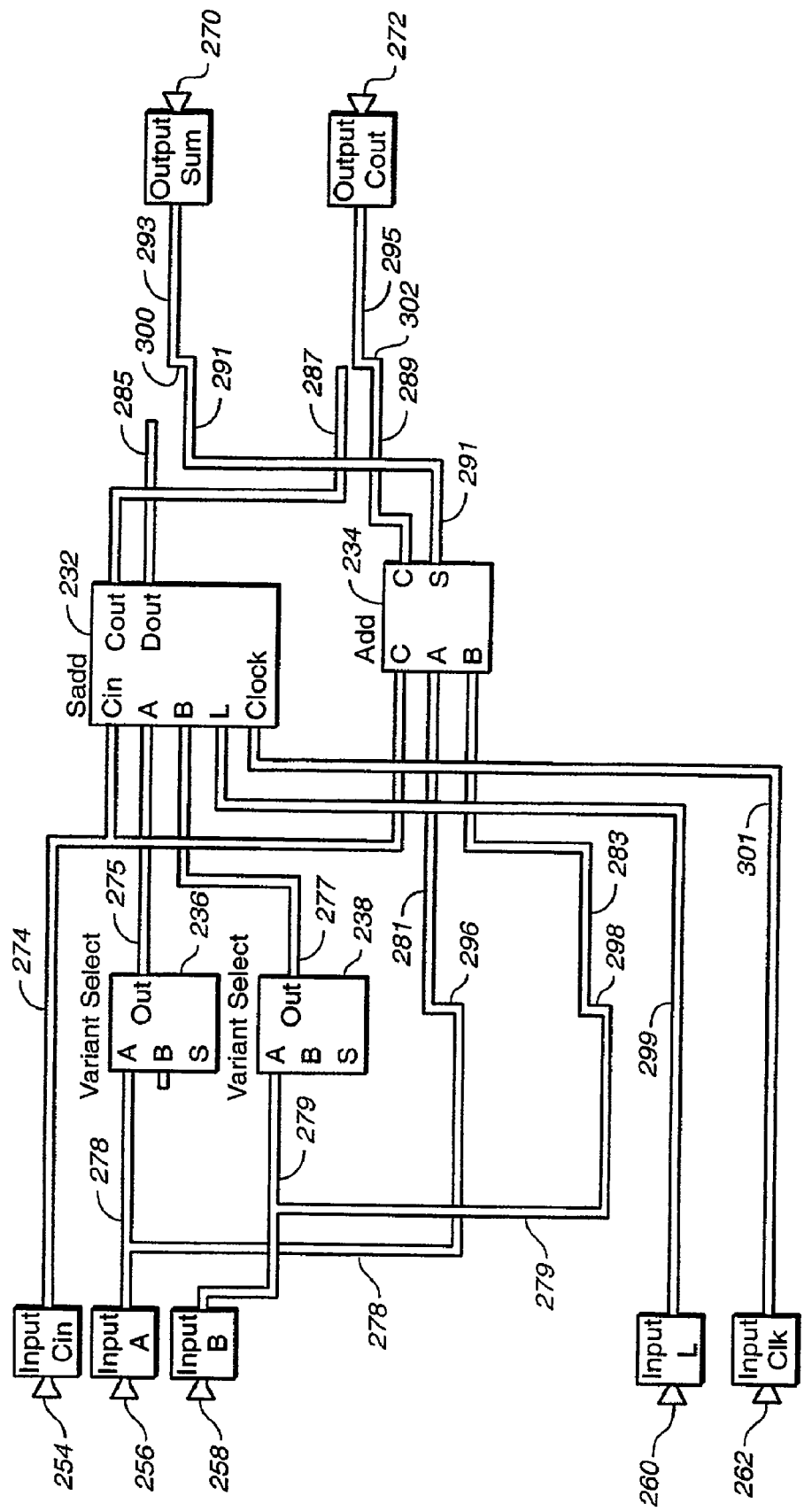
FIG._D6

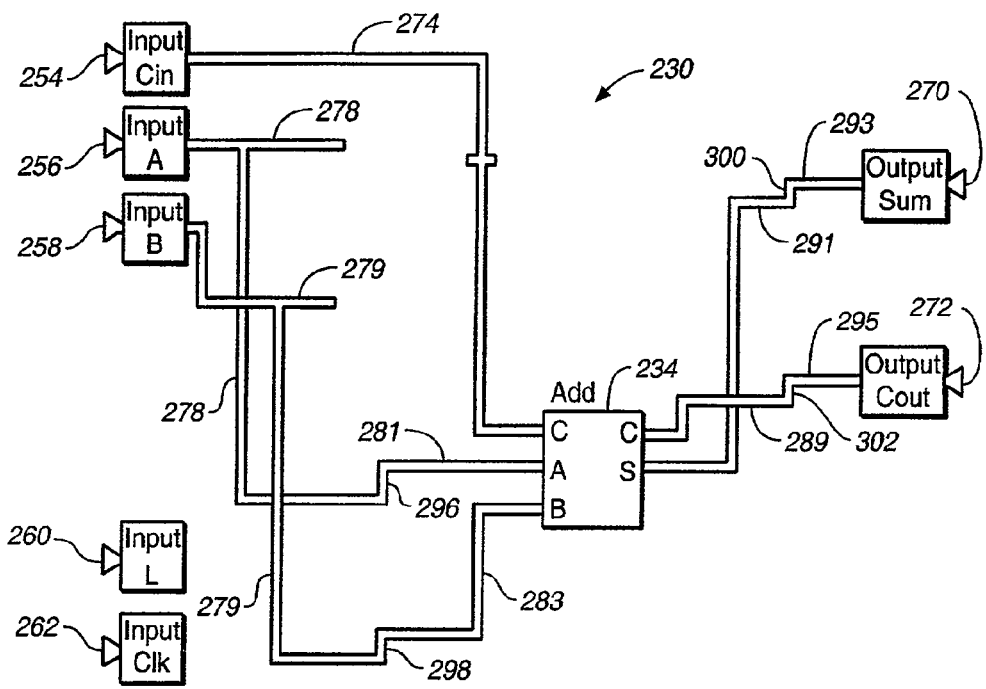
FIG._D7
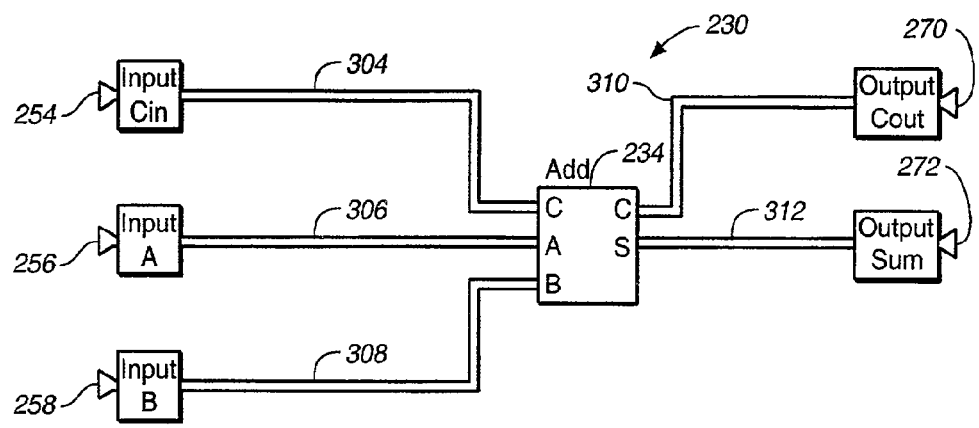
FIG._D8

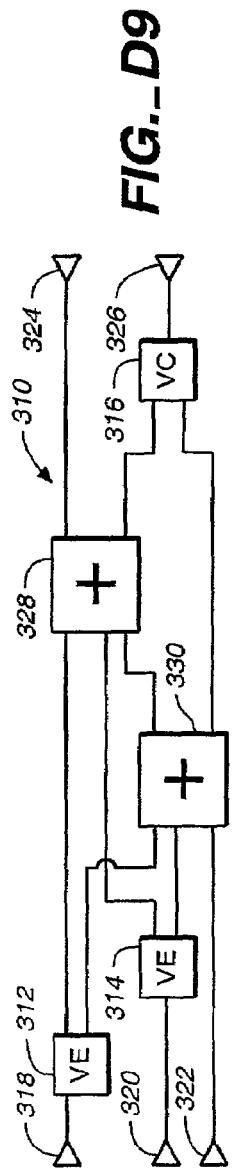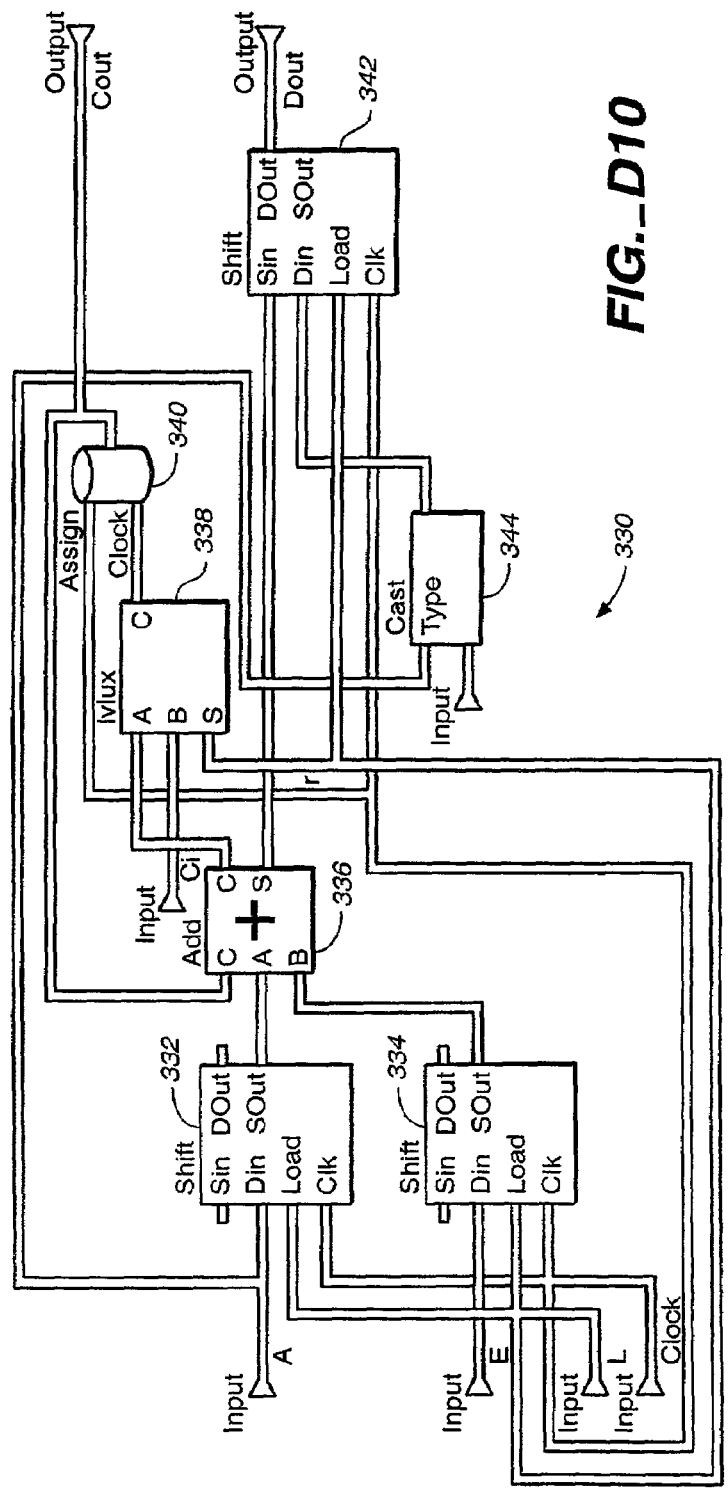

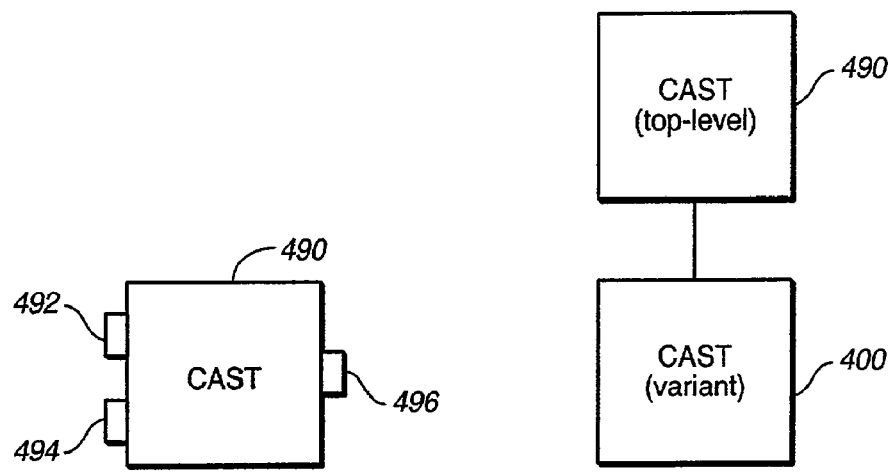
FIG._E1A
FIG._E1B
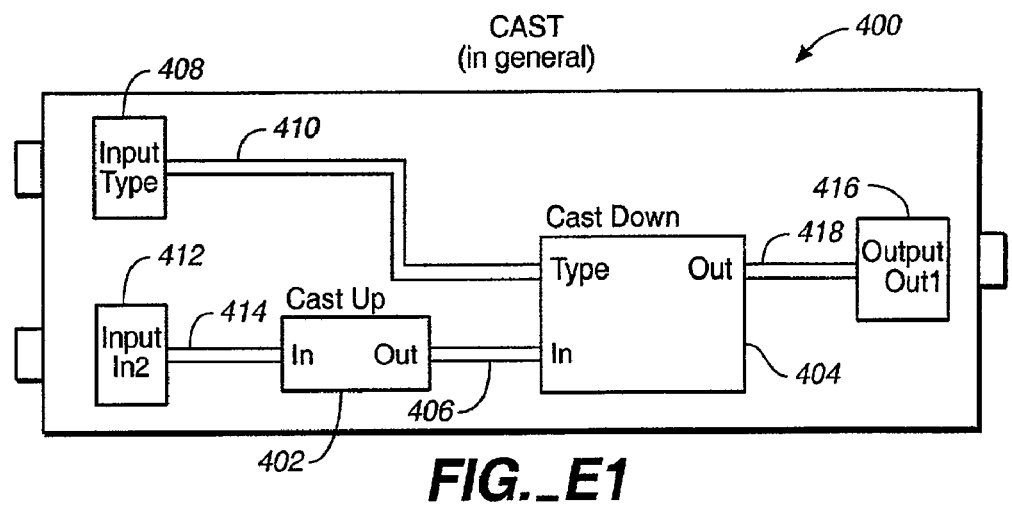
FIG._E1
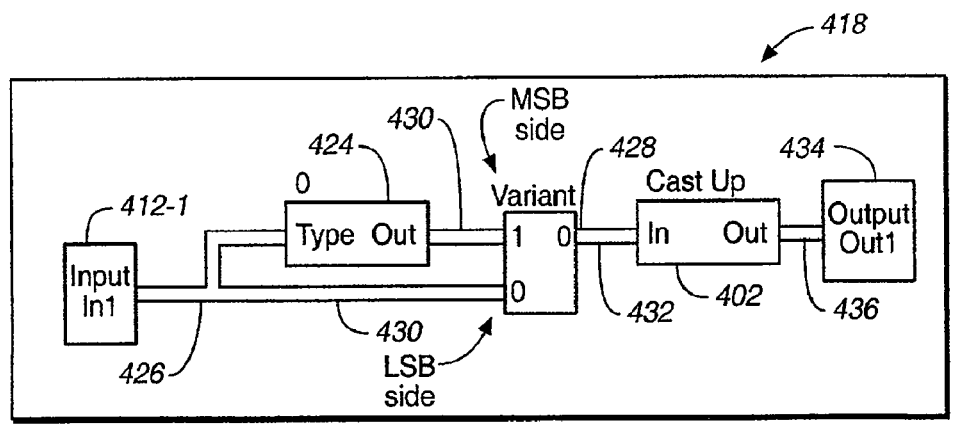
FIG._E2

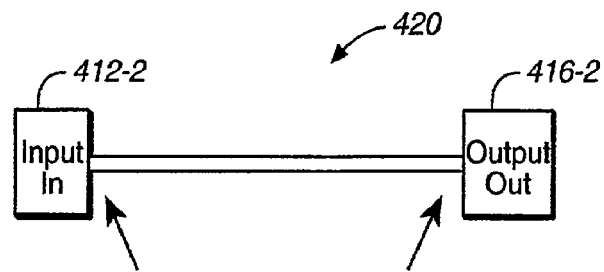
FIG._E3
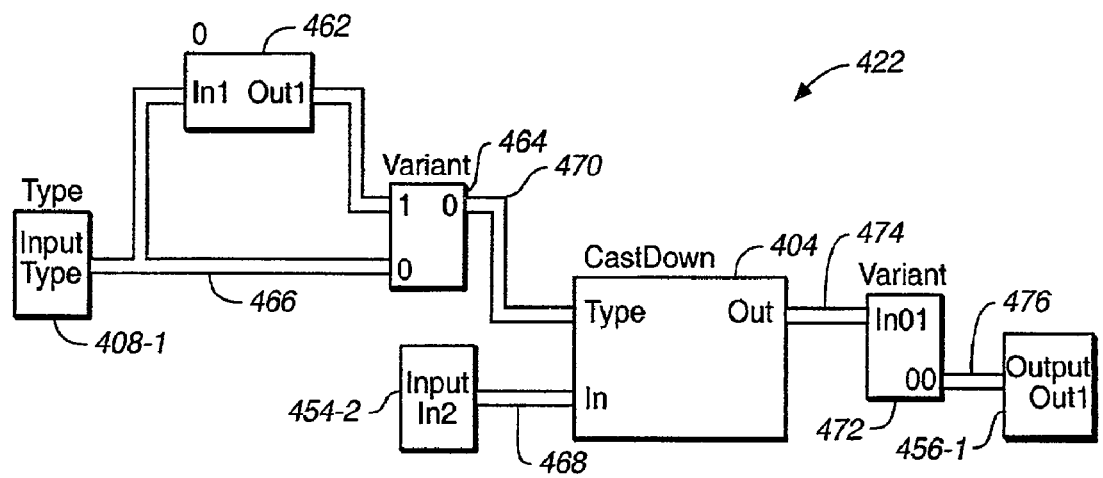
FIG._E4

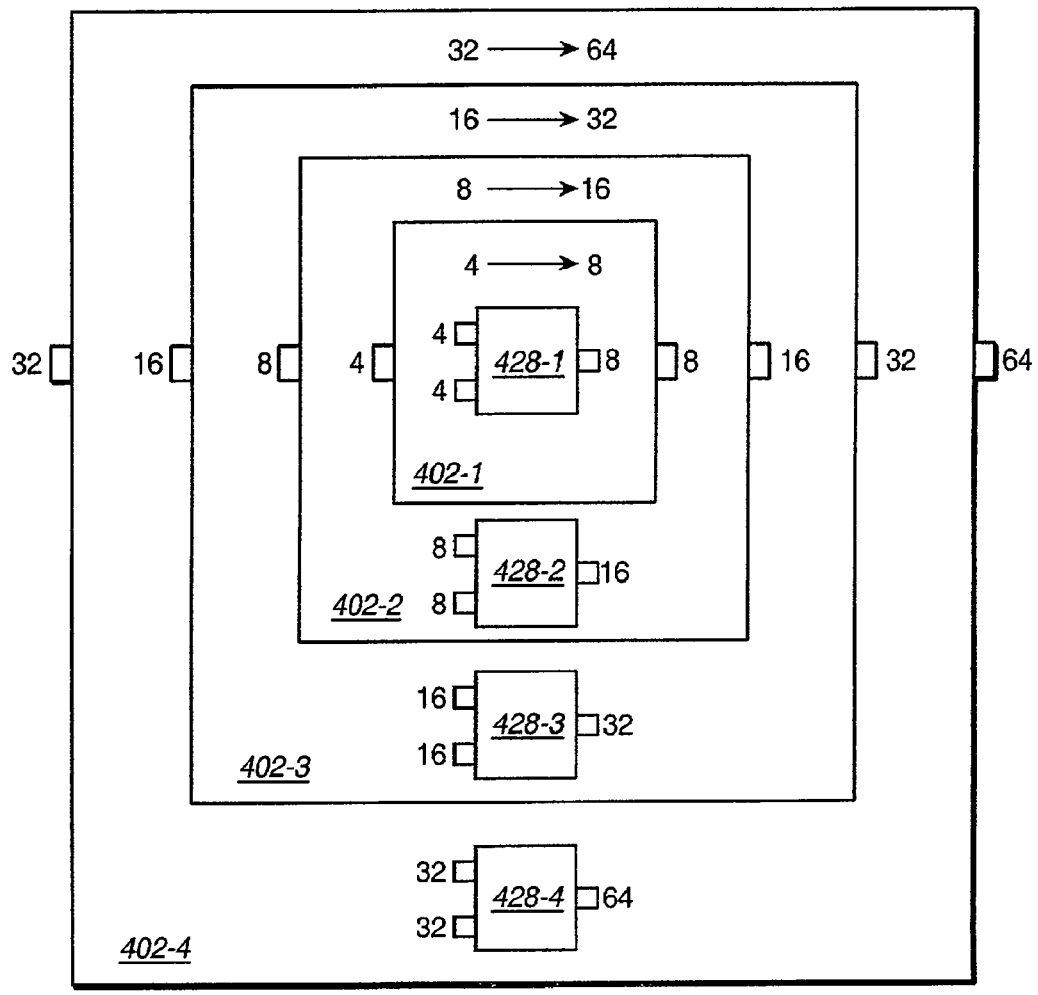
FIG._E5

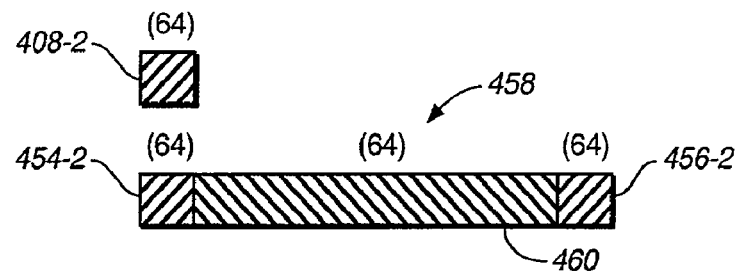
FIG._E6
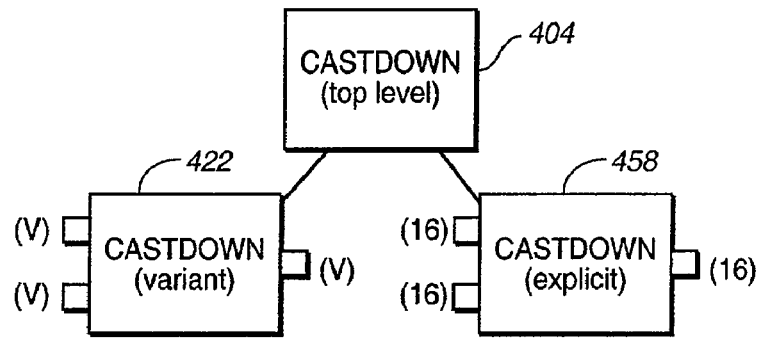
FIG._E7
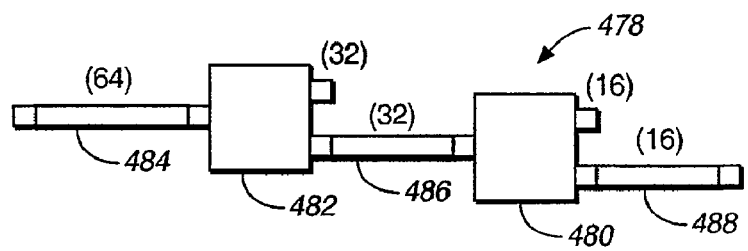
FIG._E8
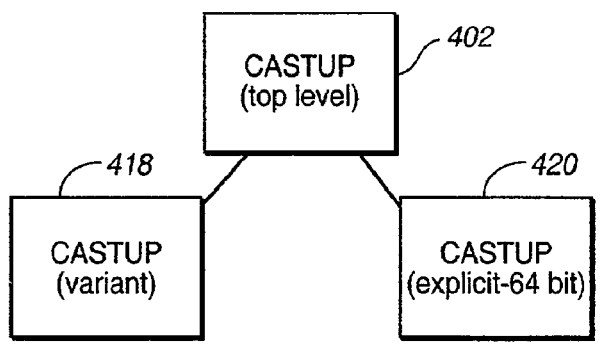
FIG._E9

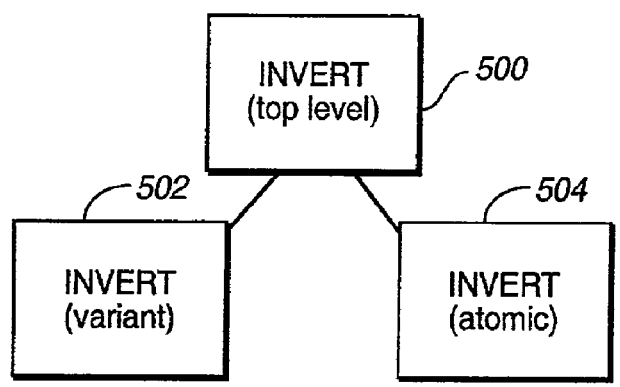
FIG._F1
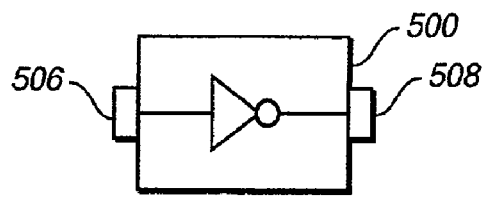
FIG._F2
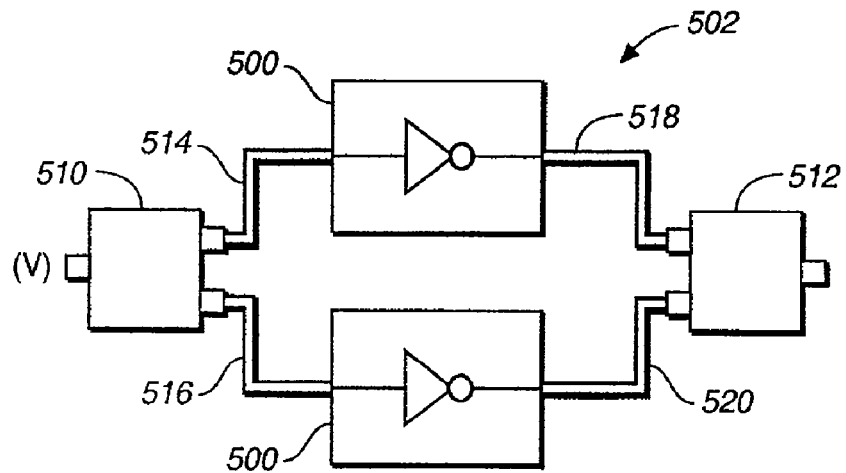
FIG._F3

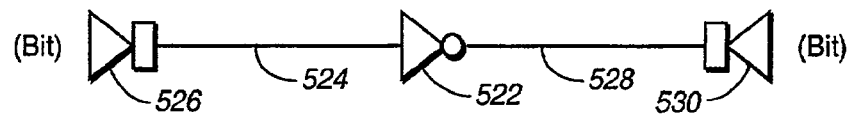
FIG._F4
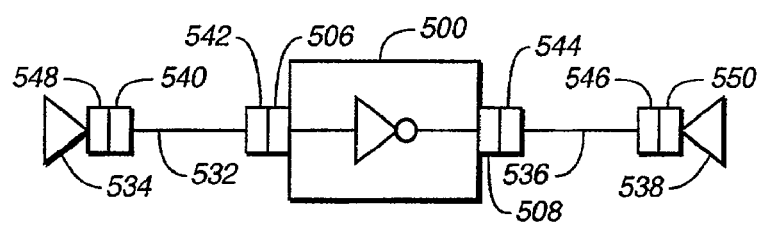
FIG._F5
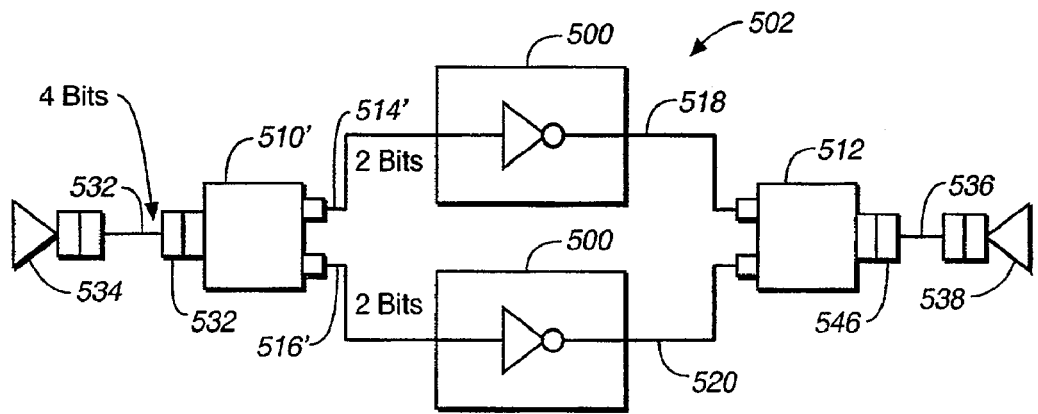
FIG._F6

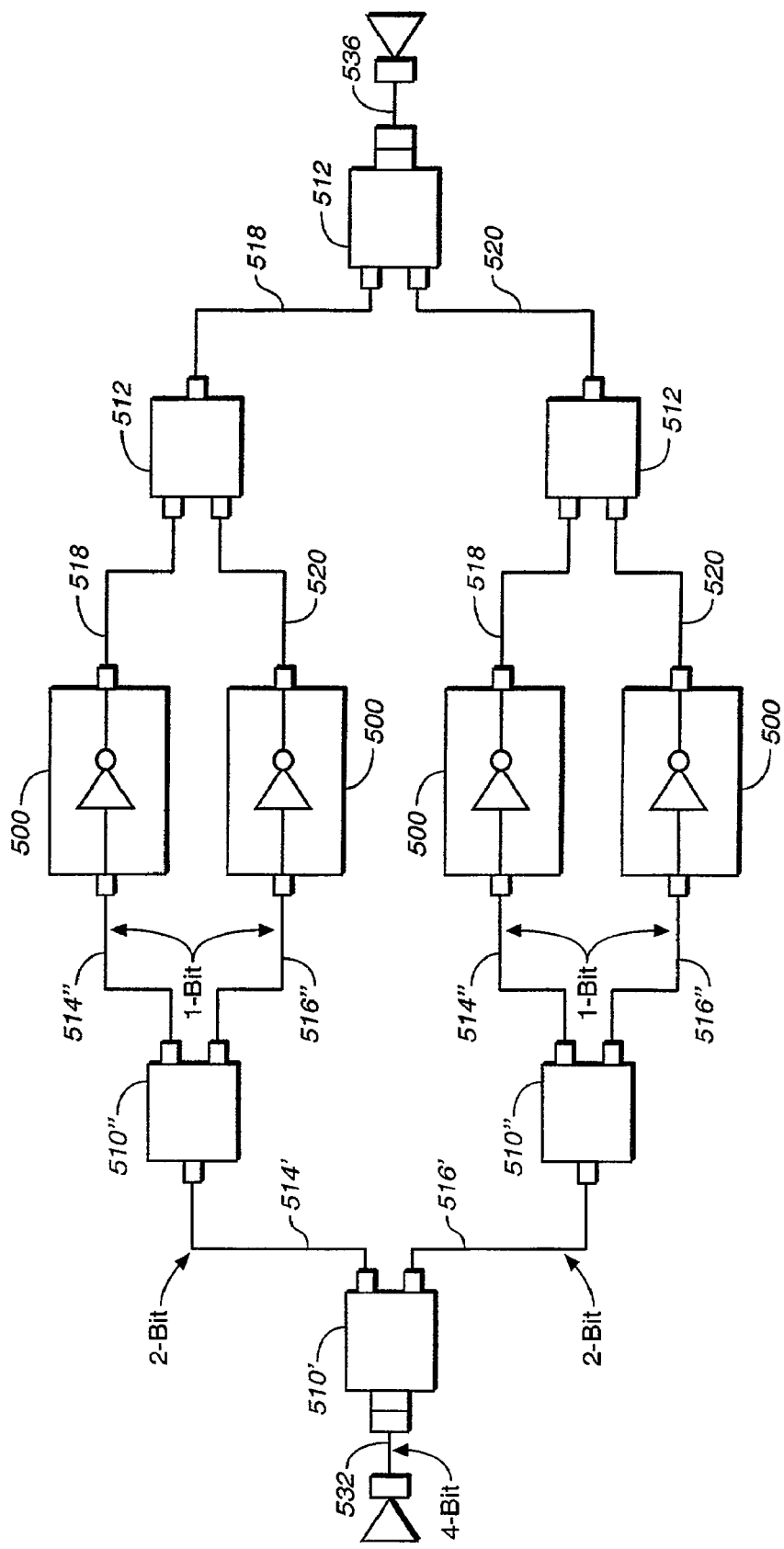
FIG._F7

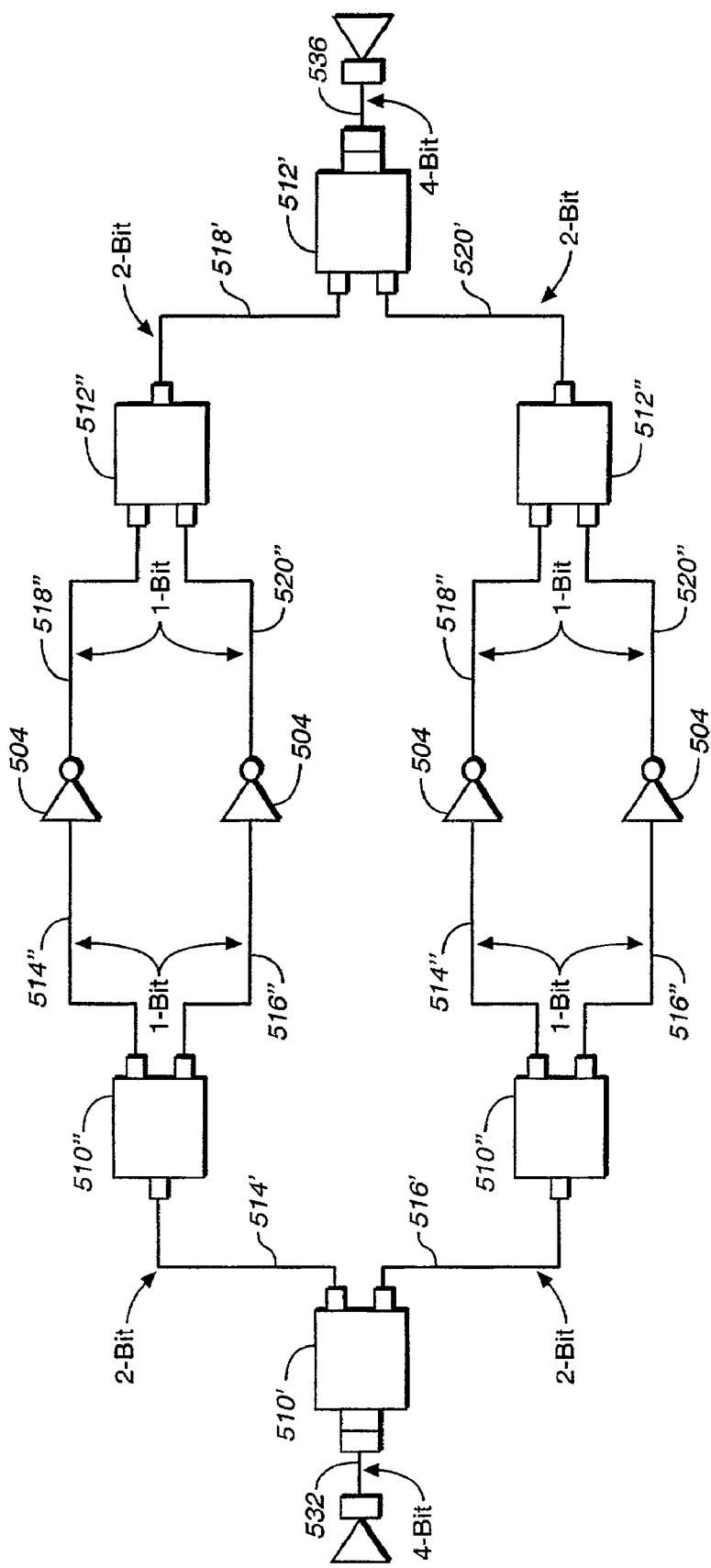
FIG._F8

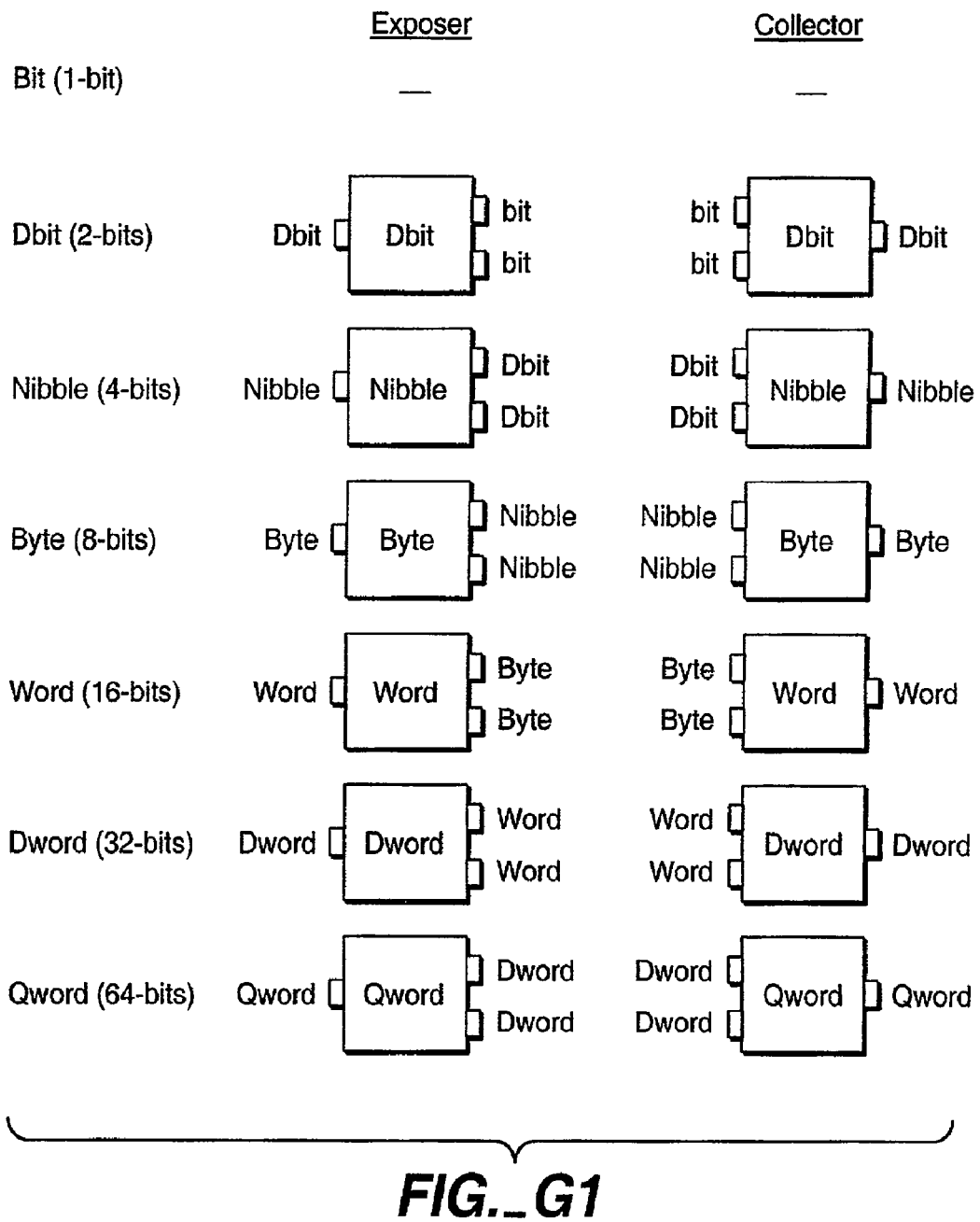
FIG._G1

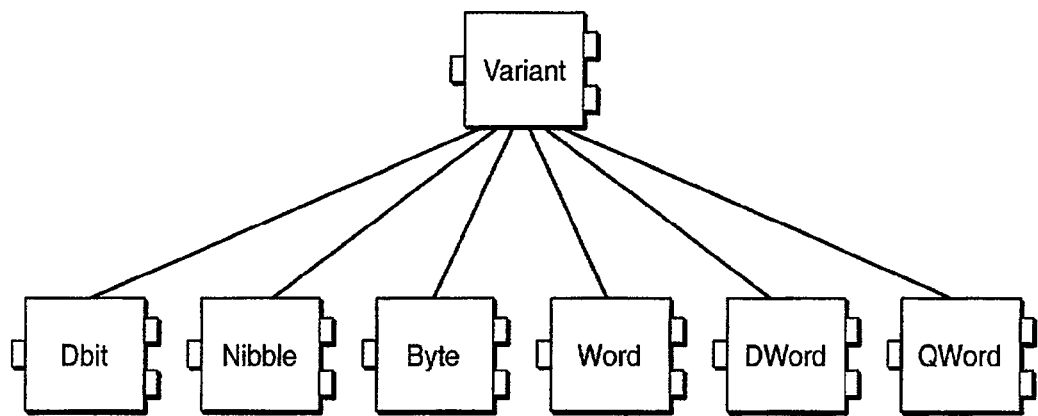
FIG._G2
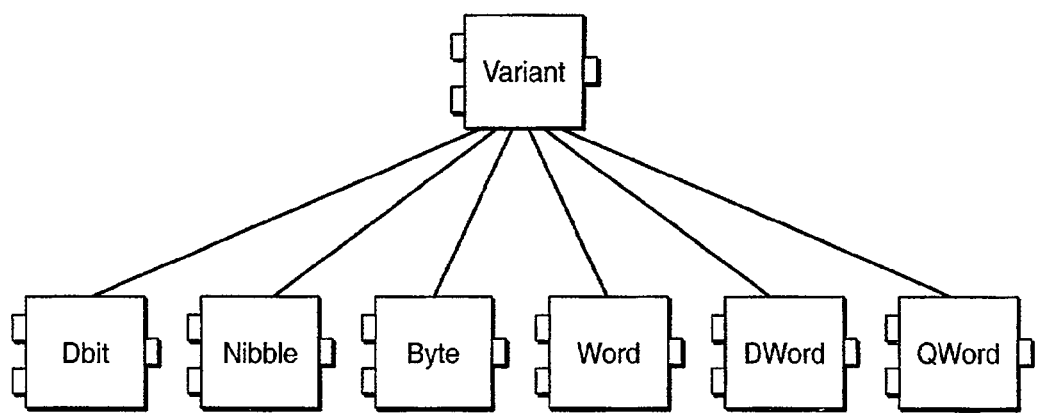
FIG._G3

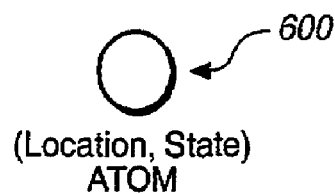
(Location, State)
ATOM
*FIG._H1*
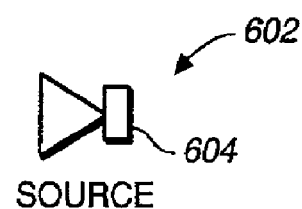
SOURCE
*FIG._H2*
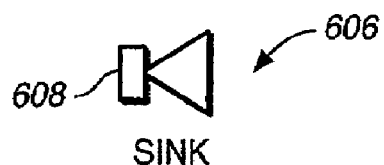
SINK
*FIG._H3*
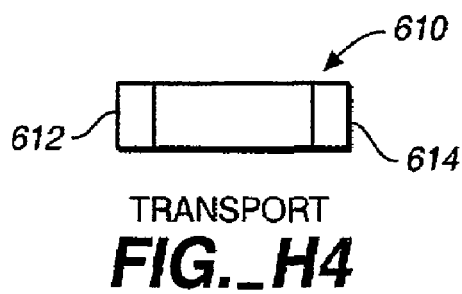
TRANSPORT
*FIG._H4*
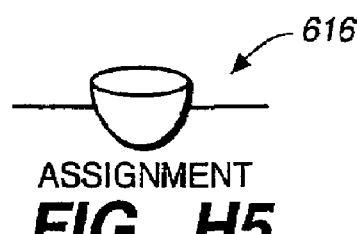
ASSIGNMENT
*FIG._H5*
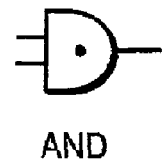
AND
*FIG._H6*
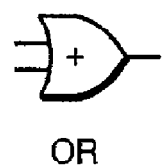
OR
*FIG._H7*
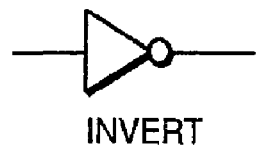
INVERT
*FIG._H8*
EXPOSER
*FIG._I1*
COLLECTOR
*FIG._I2*

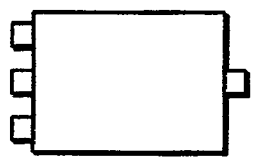
VARIANT SELECTOR
*FIG._13*
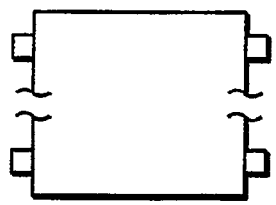
COMPOSITE OBJECT
*FIG._14*
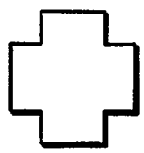
TRANSPORT JUNCTION
*FIG._15*
Menu Commands
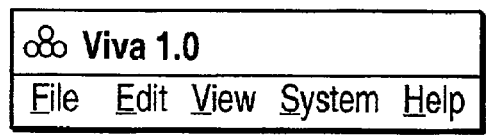
*FIG._J-1*

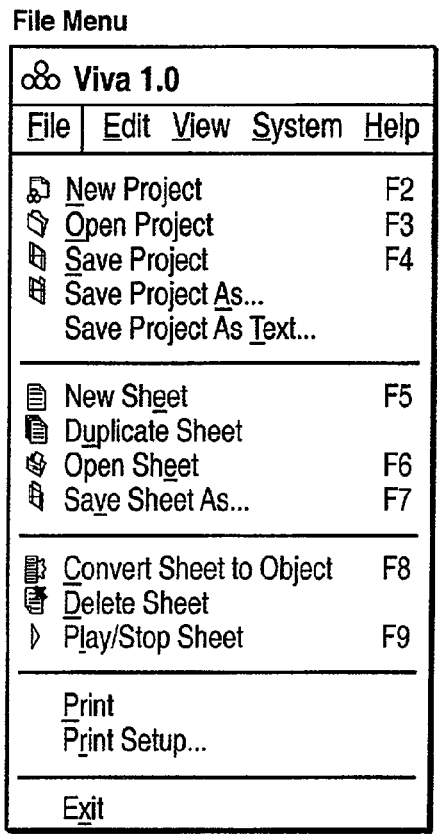
FIG._J-2
FIG._J-3
Quits VIVA.

New Project Command
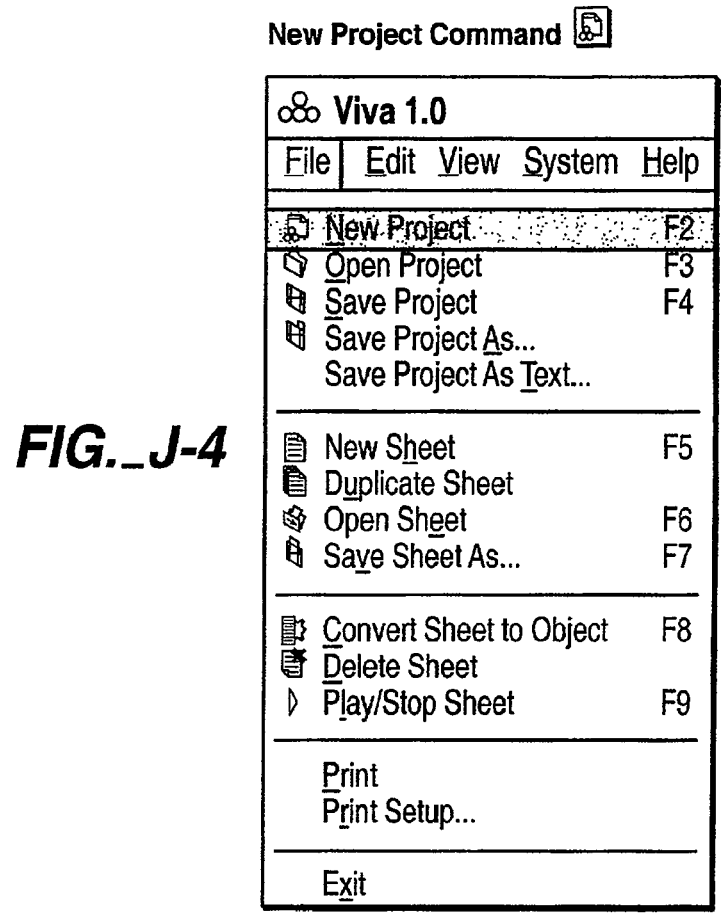
FIG._J-4
Open Project Command
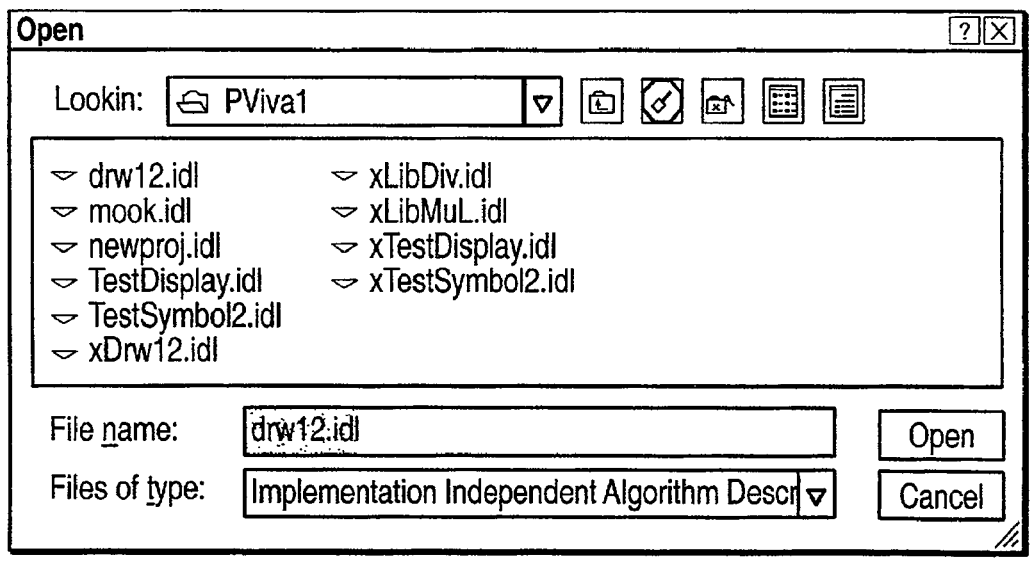
FIG._J-5

Save Project Command
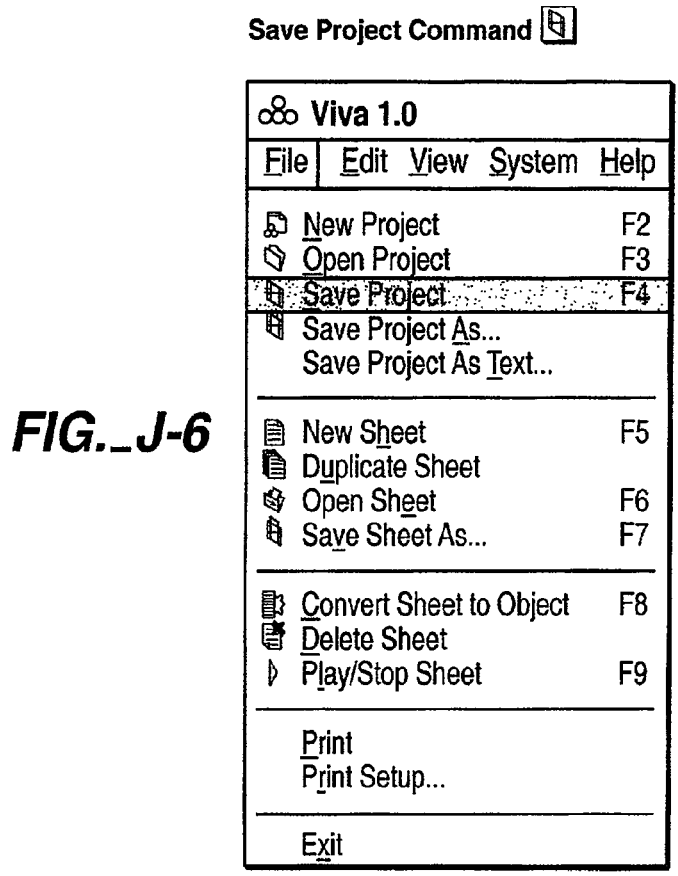
FIG._J-6
Save Project As Command
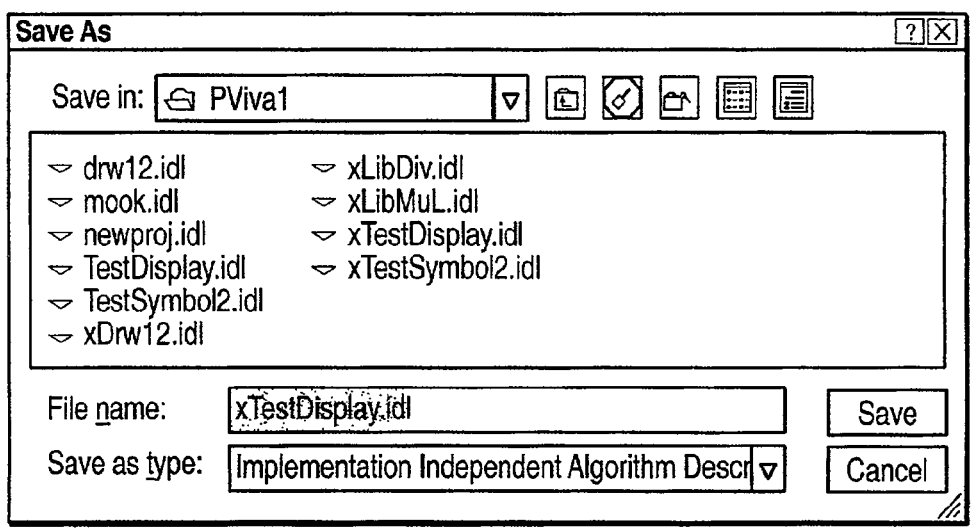
FIG._J-7

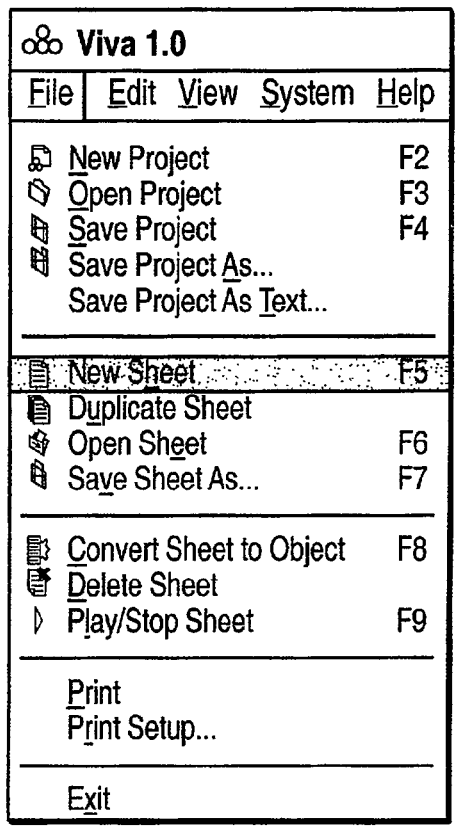
FIG._J-8
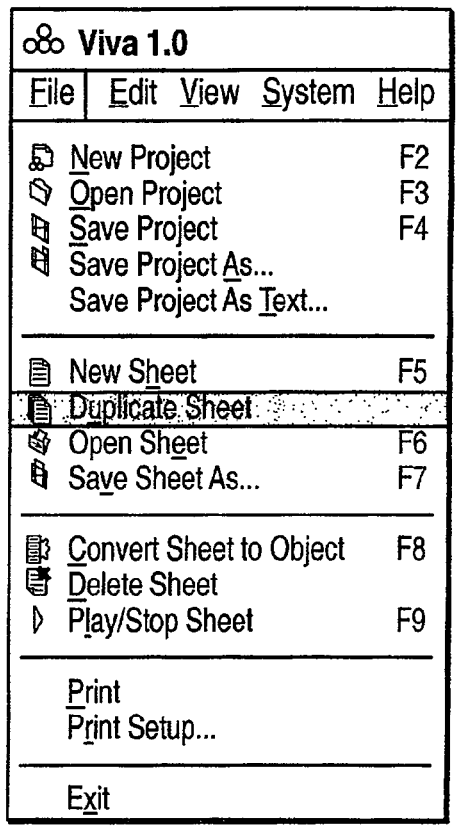
FIG._J-9
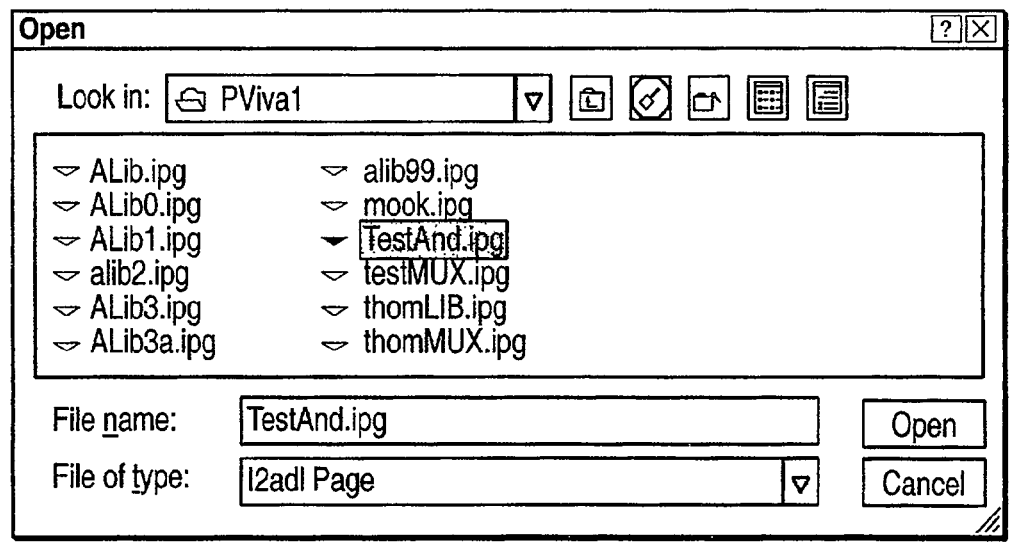
FIG._J-10

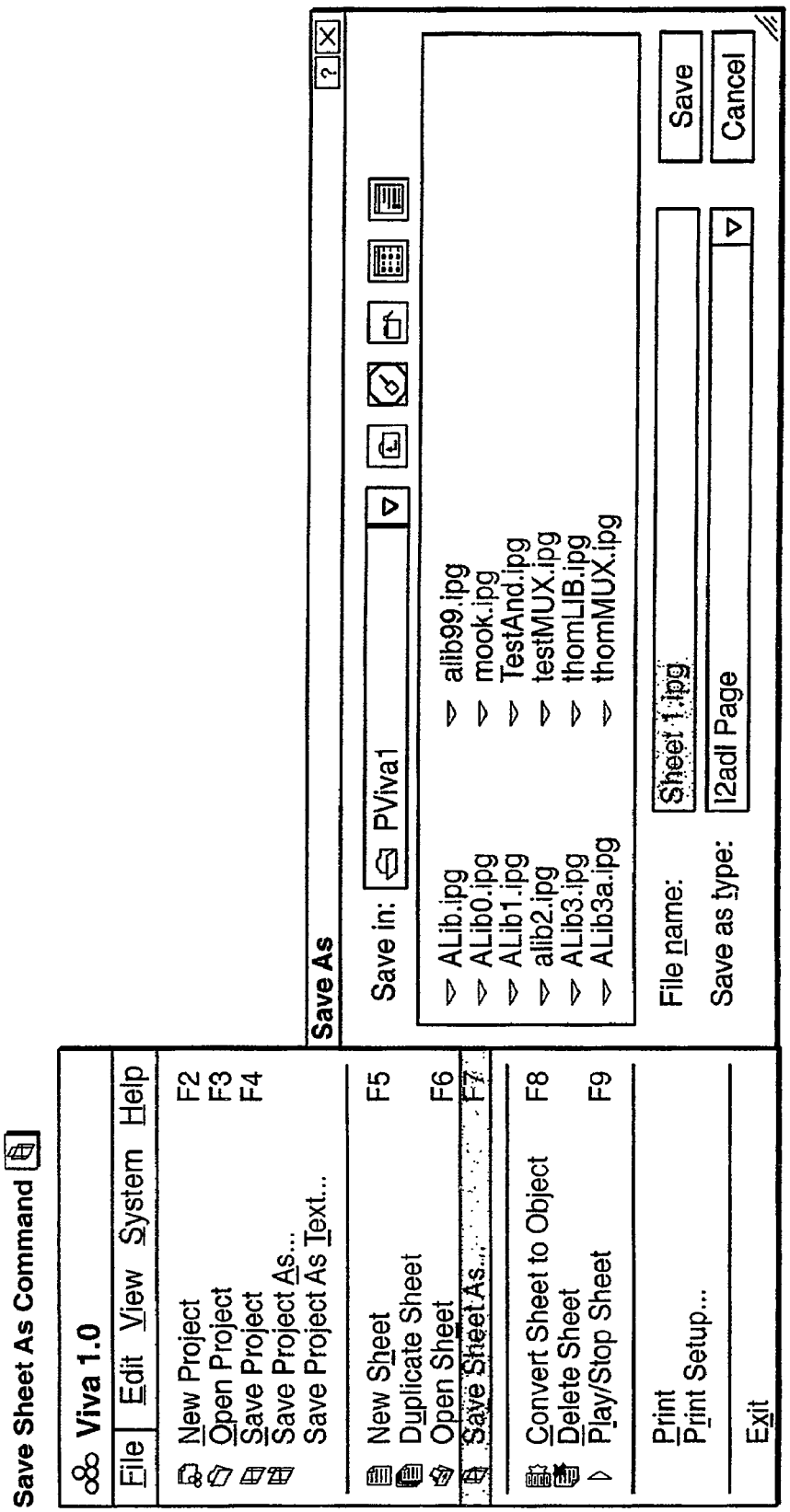
FIG._J-11

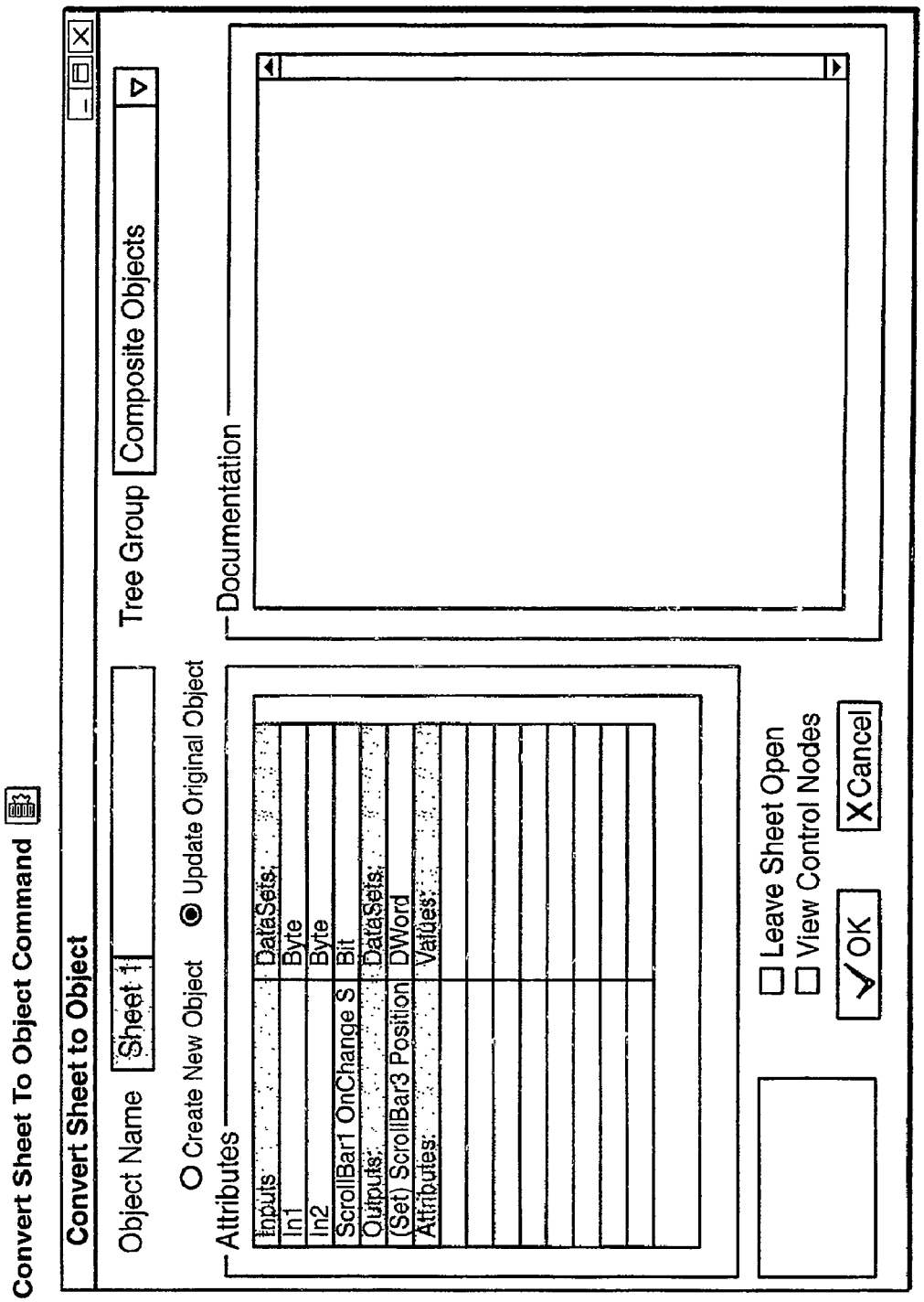
FIG._J-12

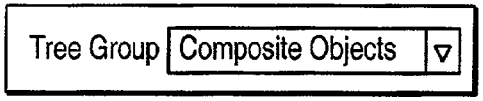
FIG._J-13
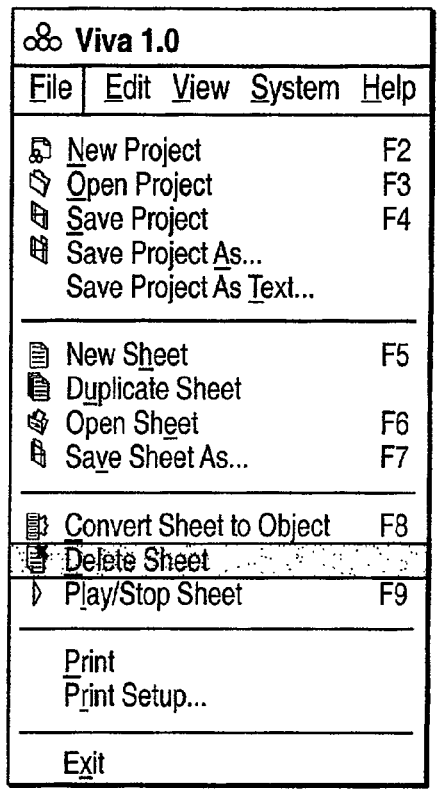
FIG._J-14
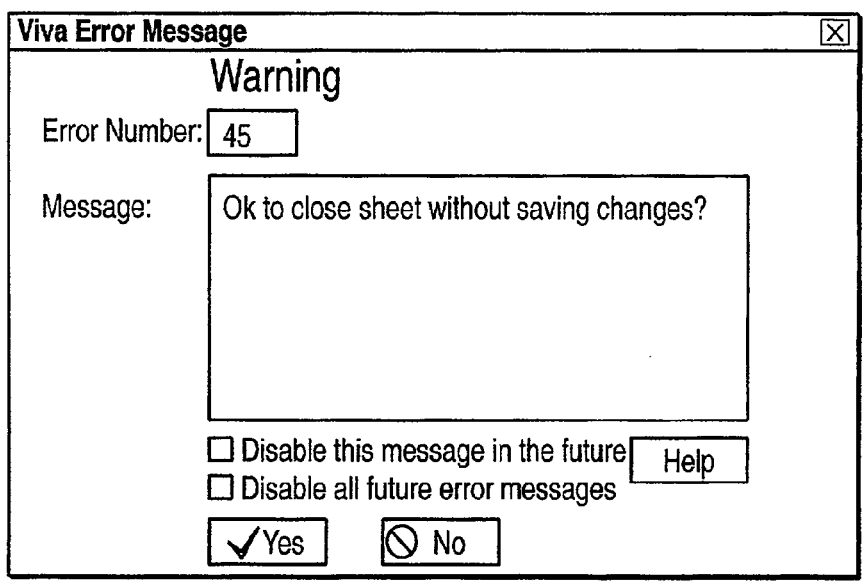
FIG._J-15

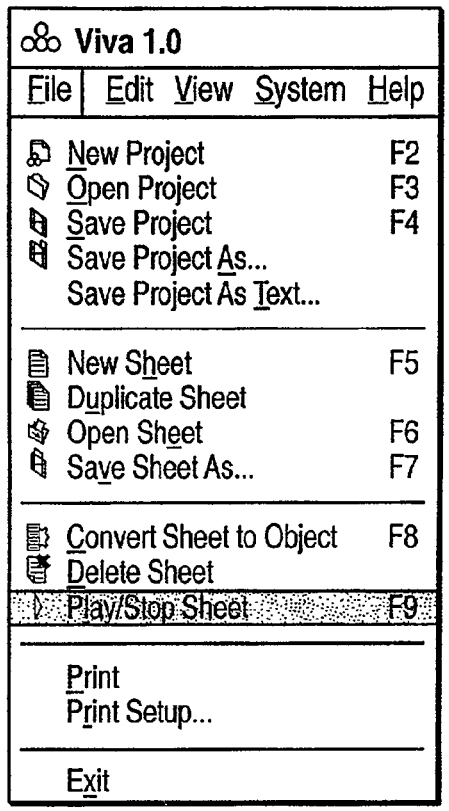
FIG._J-16
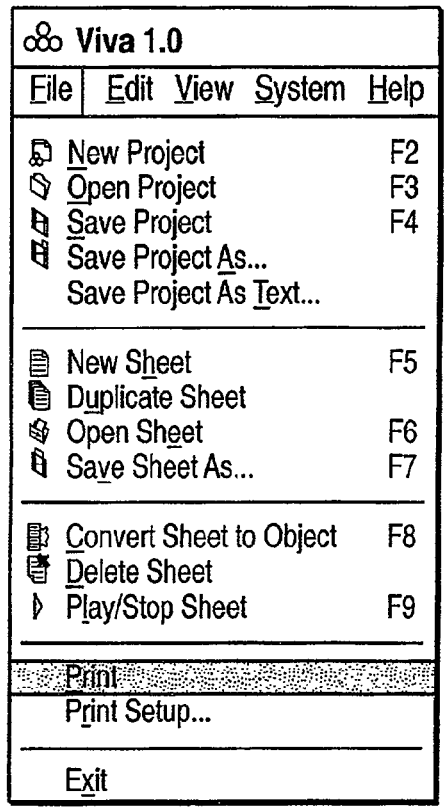
FIG._J-17
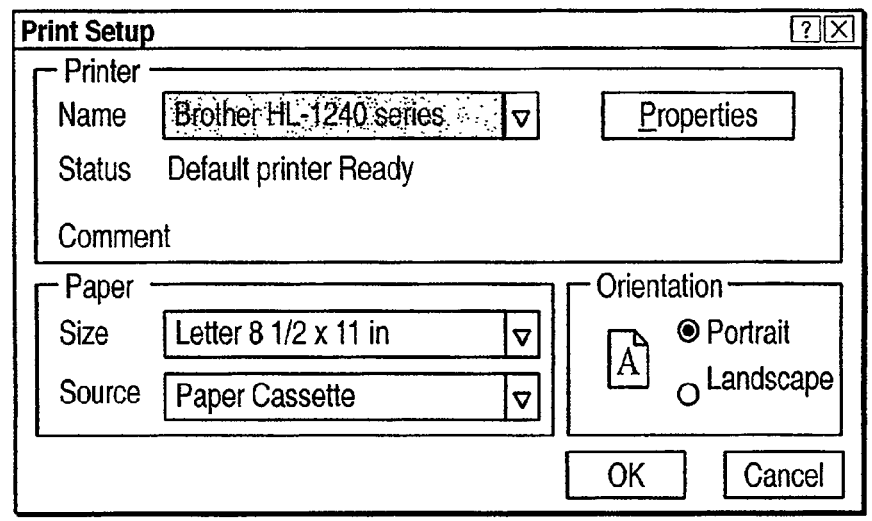
FIG._J-18

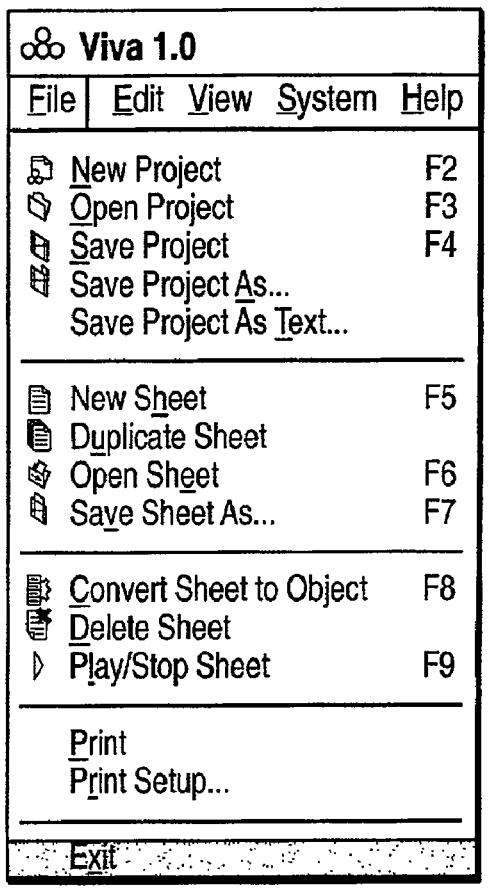
FIG._J-19
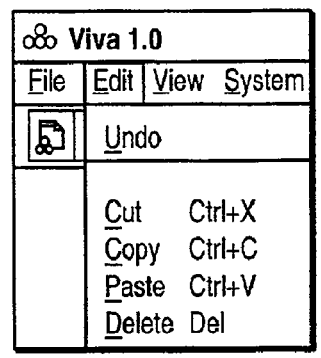
FIG._J-20

View Menu

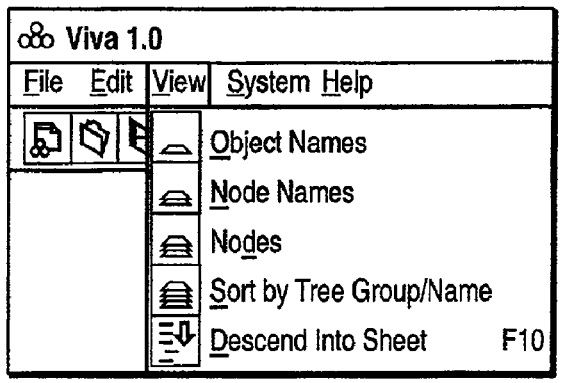

| View Object Names |  | Displays the object name above each object. |
|---|---|---|
| View Node Names |  | Displays each node name instead of each node's icon. |
| View Nodes |  | Displays node colors on Transports. (Node colors correspond to data types). |
| Sort by Tree Group/Name |  | Sorts the Object Tree in alphabetical order. |
| Descend into Sheet |  | This displays the Behavior Page of the selected object. (This feature is also available by double-clicking on the object.) |

*FIG._J-21*

View Object Names
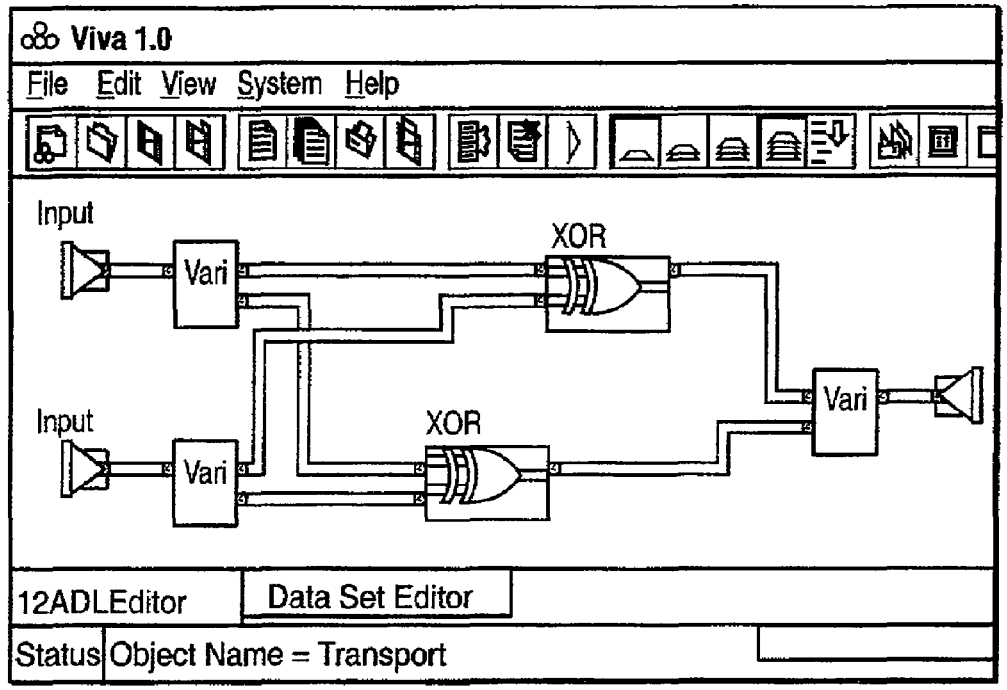
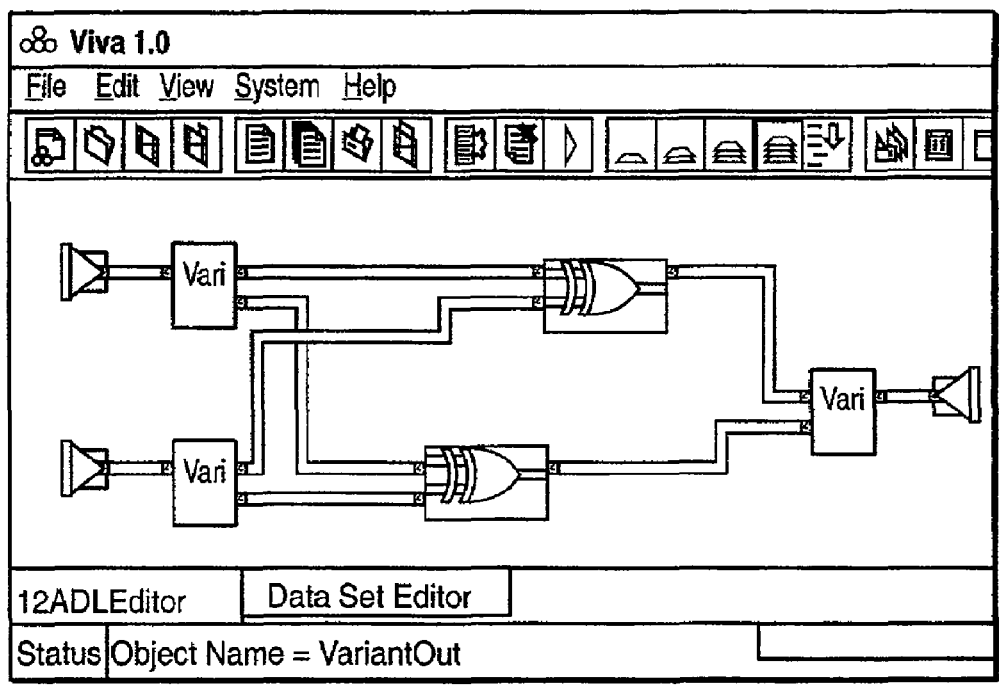
FIG._J-22

View Node Names 
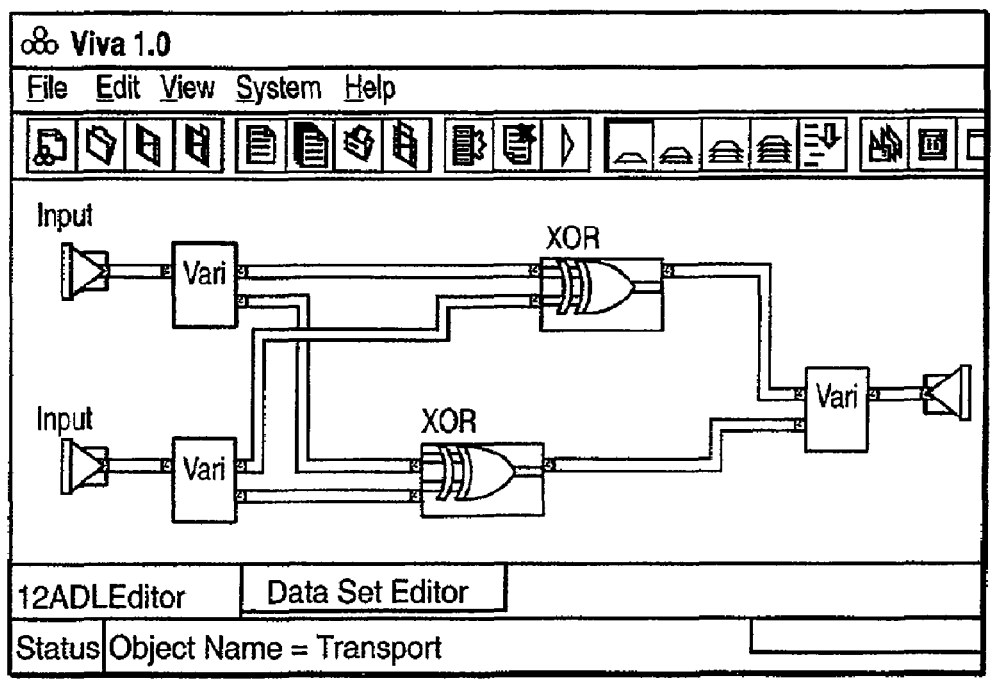
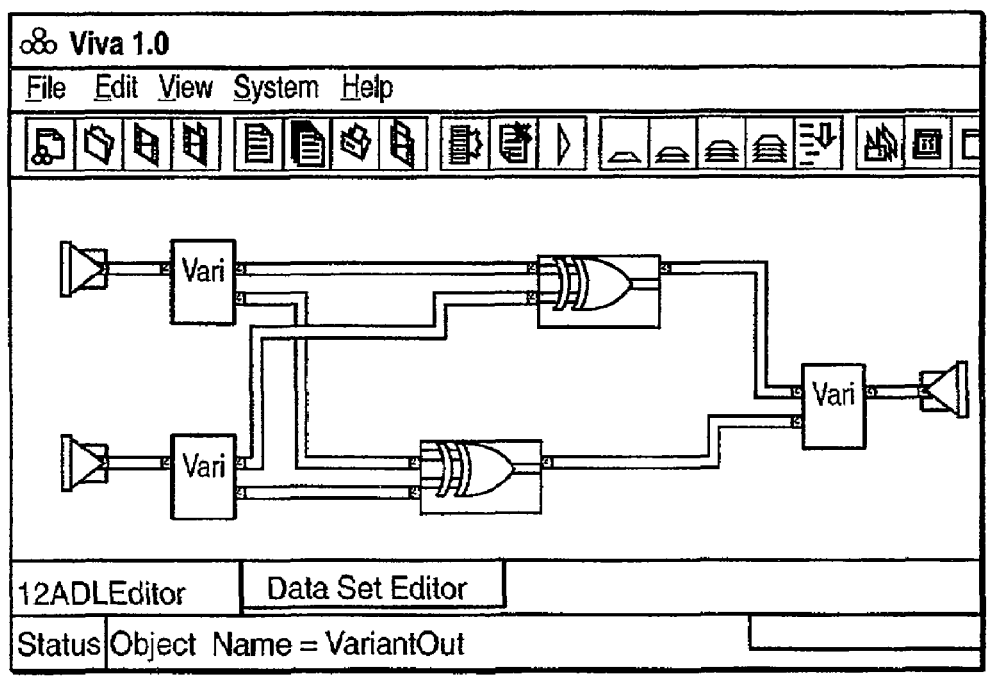
FIG._J-23

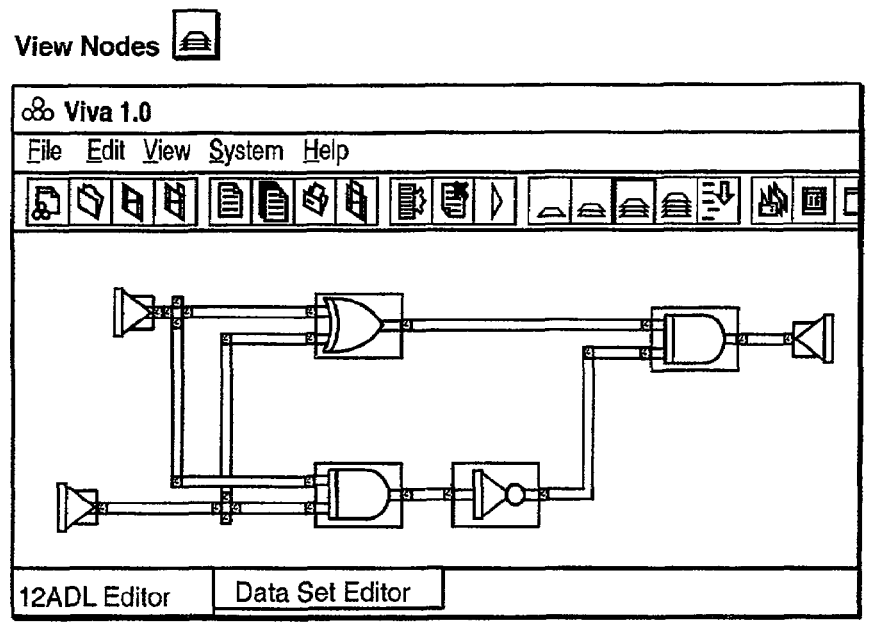
FIG._J-24
FIG._J-25
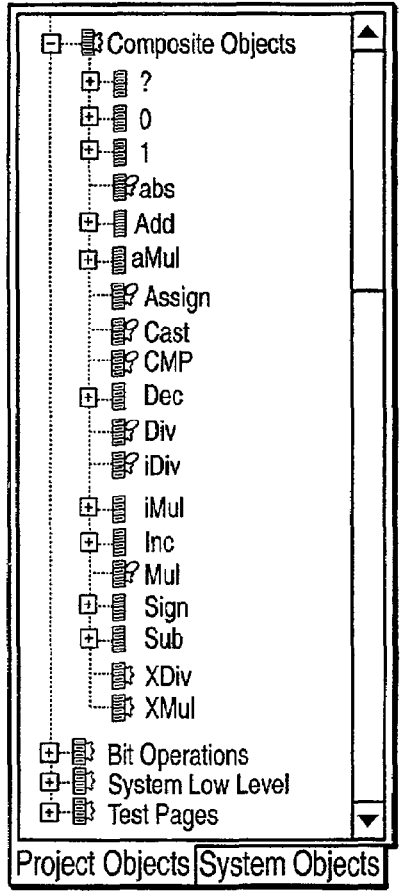

Descend Into Sheet
The Behavior Page of a VIVA Module can usually be diplayed by either double clicking on the object, or by clicking on the descend icon  after the Module has been selected using a left mouse click. The following is the Behavior Page for an Exclusive OR Module.
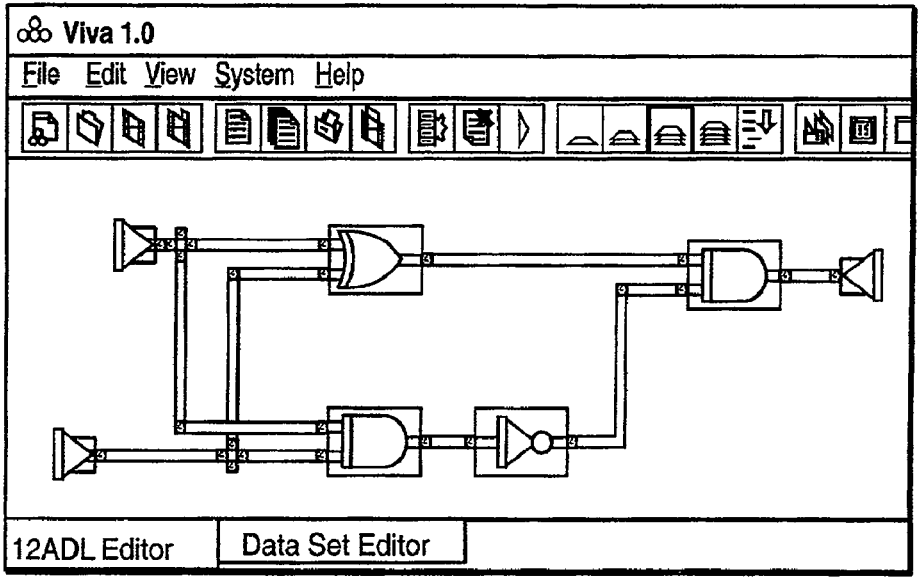
FIG._J-26
System Menu
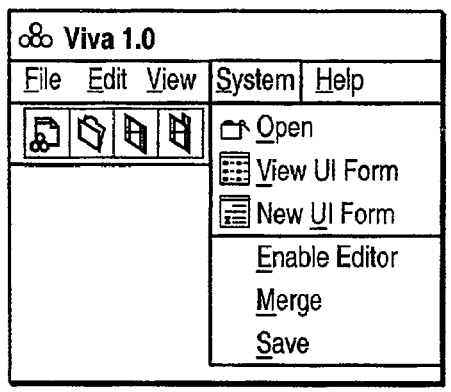
Open System  Select the target system (X86 or Floating Point Gate Array).
FIG._J-27

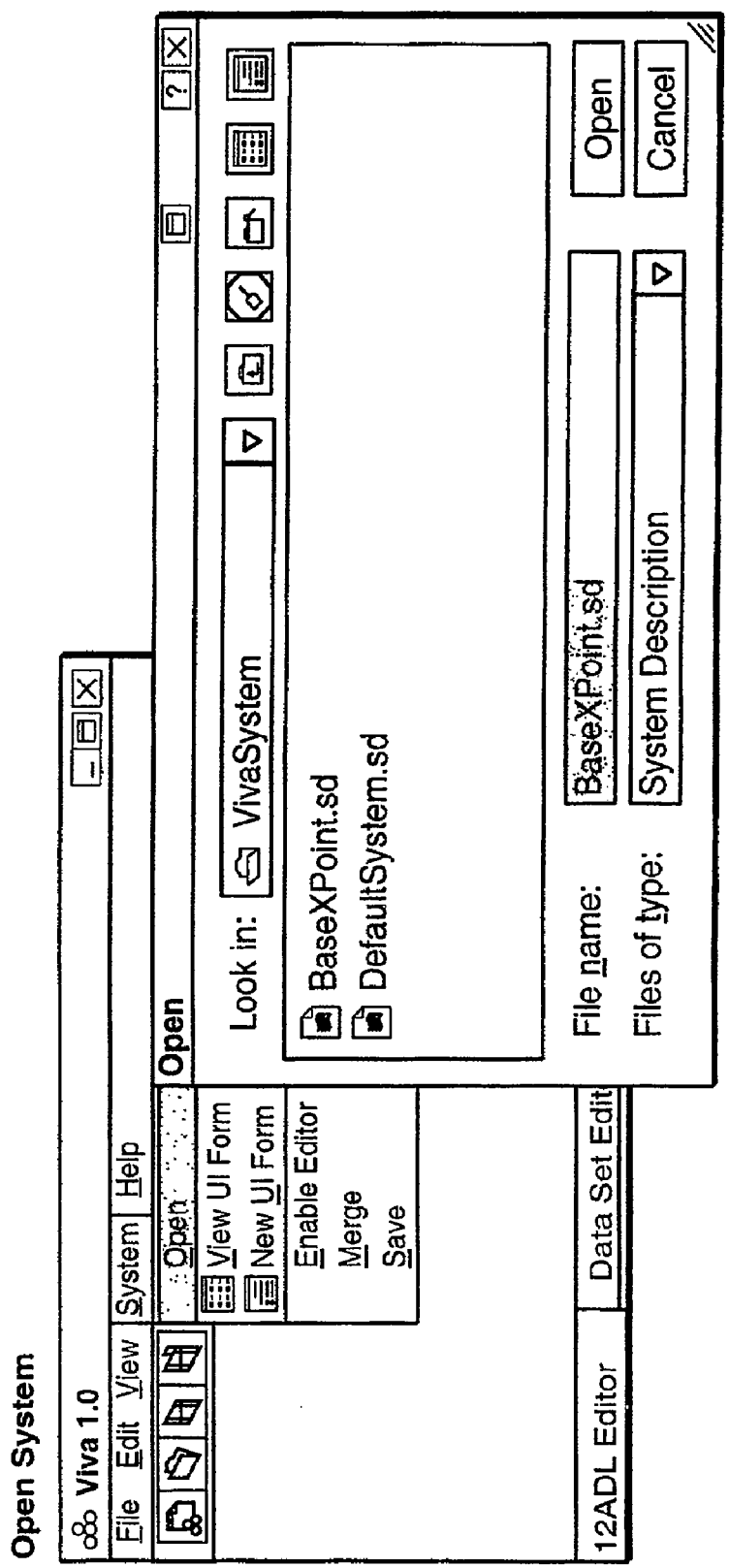
FIG._J-28

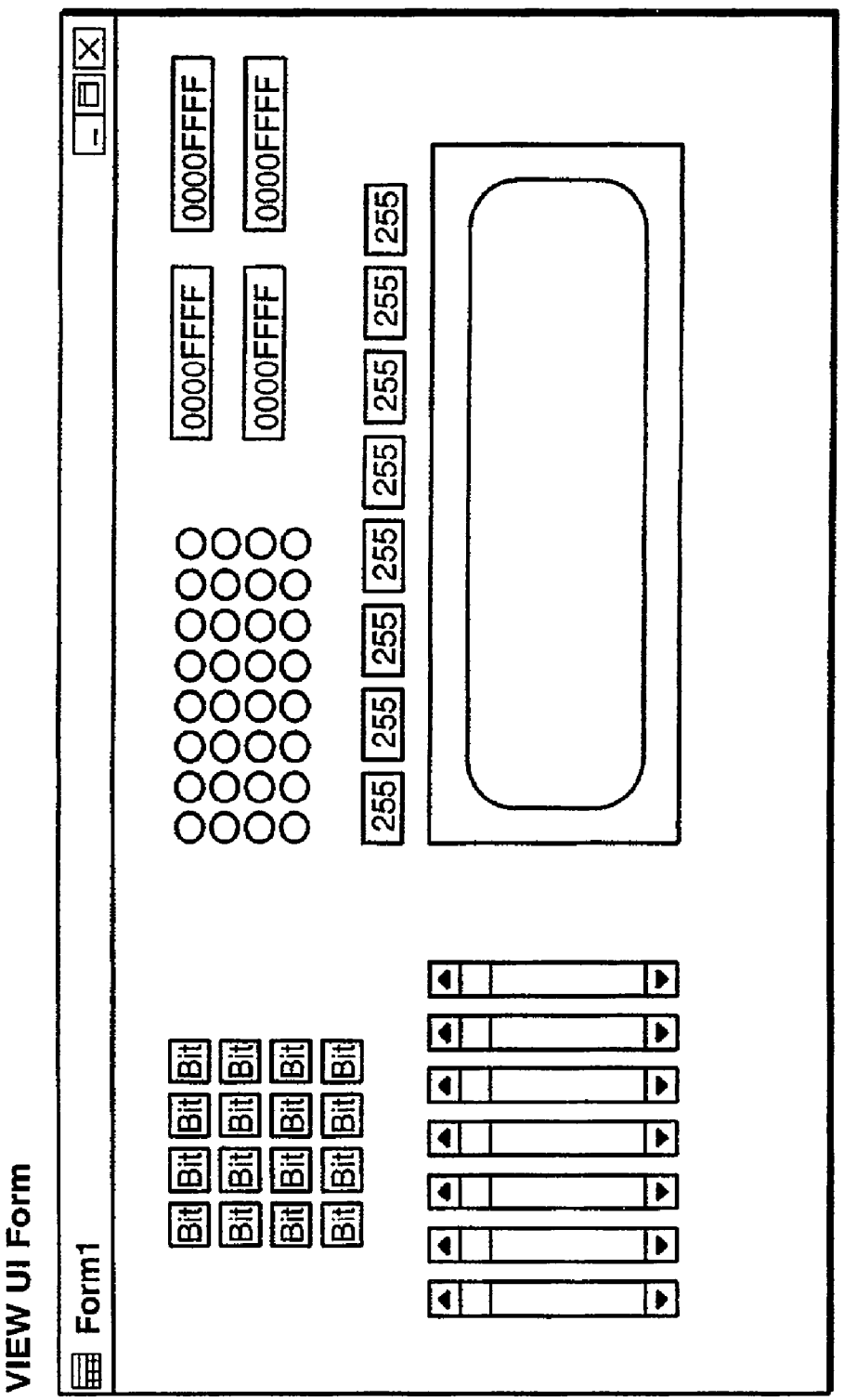
FIG._J-29

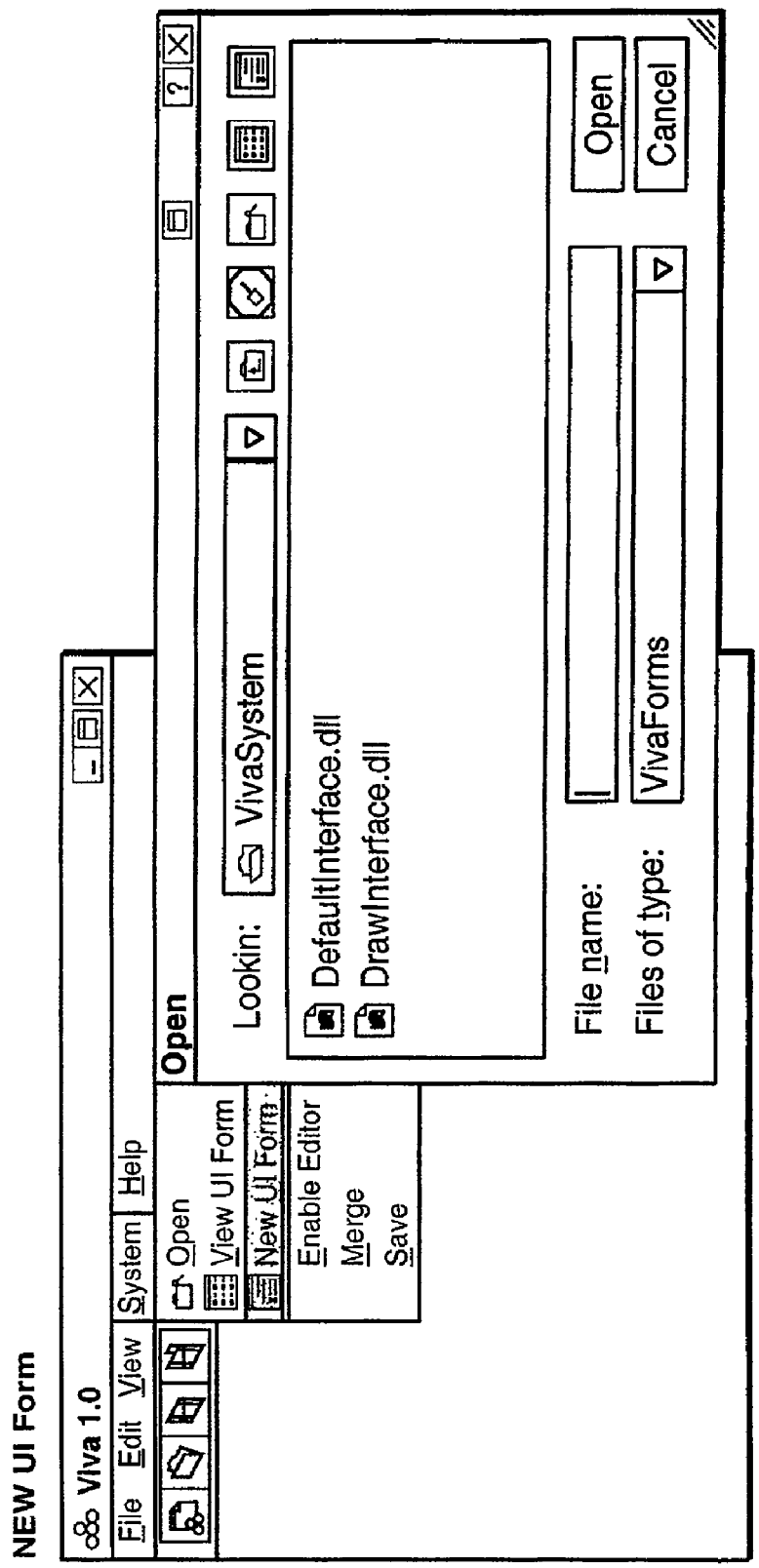
FIG._J-30

Help Menu
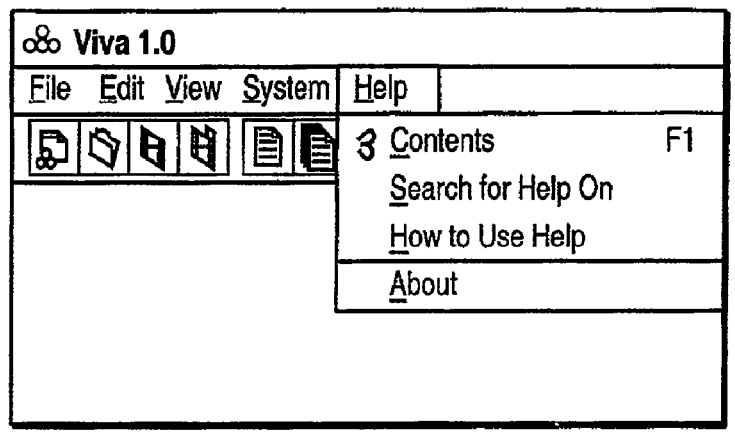
FIG._J-31
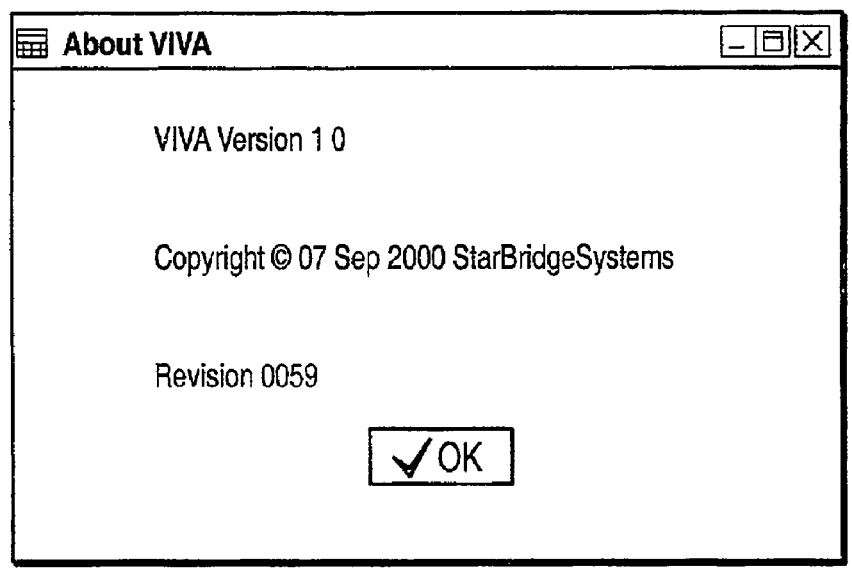
FIG._J-32

ToolBar Controls

The Graphical User Interface of VIVA was designed to allow you to specify the desired behavior of the target computer environment.

File Commands

 New Project — Clears all objects, pages, and Modules.

 Open Project — Load and display a VIVA project.

 Save Project — Saves the current project.

 Save Project As — Saves and renames the current project projects.

 New Sheet — Creates a new blank sheet.

 Duplicate Sheet — Duplicates the current sheet.

 Open Sheet — Loads a sheet from a file.

 Save Sheet As — Saves current sheet as a file.

 Convert Sheet — Captures sheet behavior as a VIVA Module.

 Delete Sheet — Erases and deletes current Behavior Page.

 Run/Stop — Executes the behavior on the displayed Behavior Page.

View Details

 View Object Names — The names of the objects are displayed above the objects.

 ViewNode Names — The names of the nodes of the objects are displayed instead of the object's icon.

 View Nodes — The node colors are displayed on Transports. (Node colors correspond to data types.)

 Sort by Tree Group/Name — Sorts the Object Tree in alphabetical order.

 Descend into Sheet — Display the Behavior Page of the selected object (Also available by double-clicking on the object.)

 Open System — Selects the target system.

 View UI Form — Displays the User Interface Form.

 New UI Form — Allows you to Select a new User Interface Form.

*FIG._J-33*

DataSet Editor
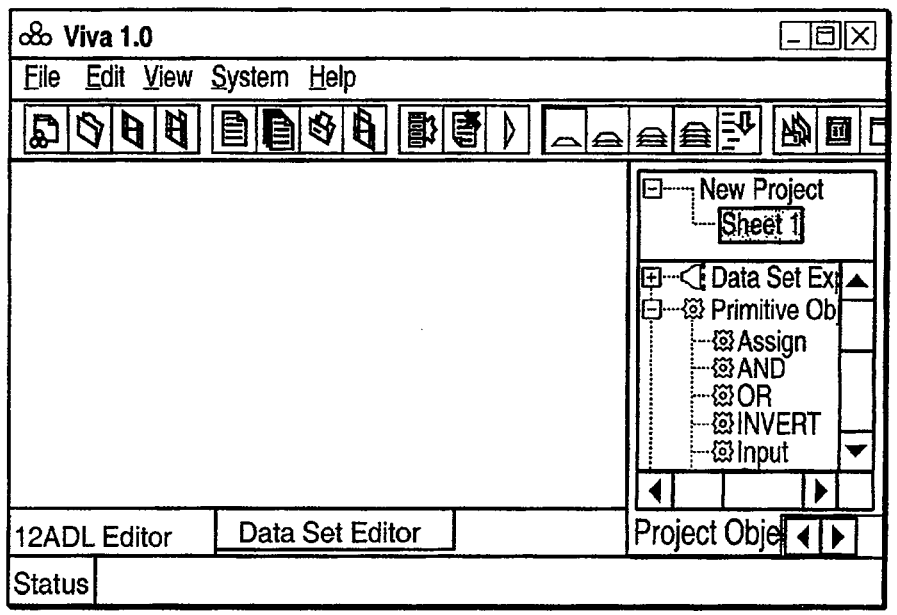
FIG._J-34
DataSet Editor
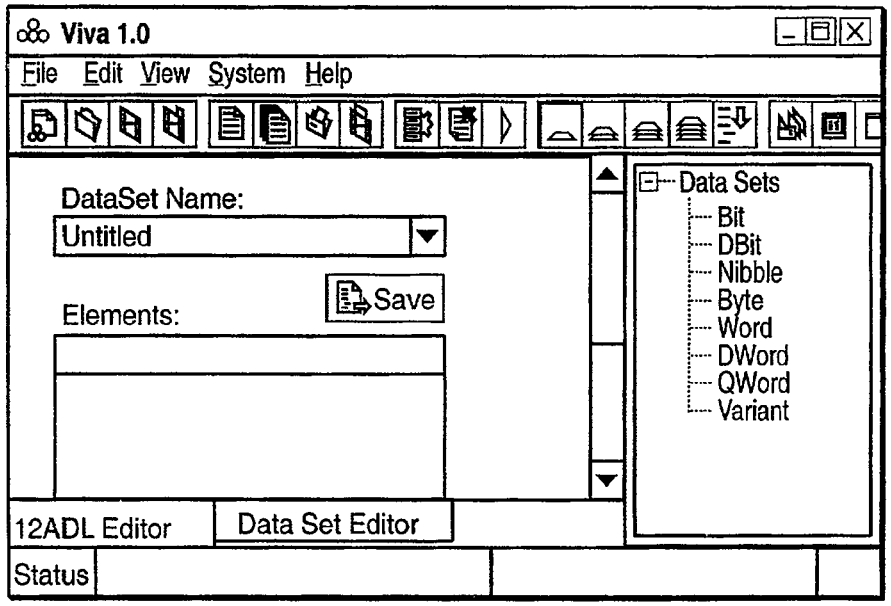
When done with defining the new data set, you press the Save Button 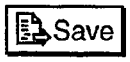
FIG._J-35

Edit Attributes Dialog
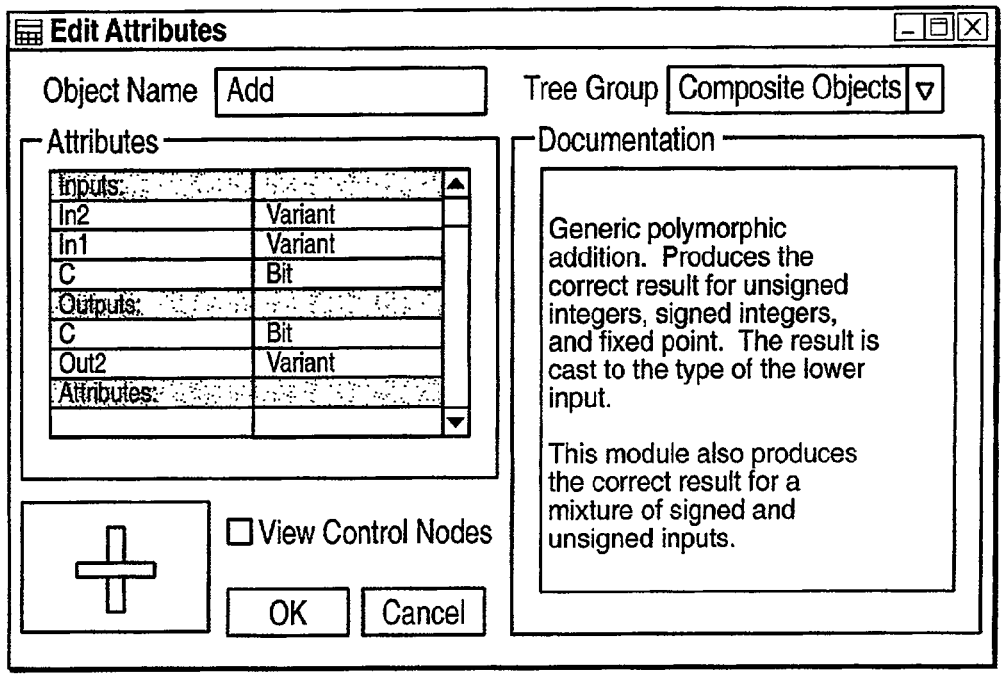
FIG._J-36
Constructing VIVA Modules
FIG._J-37
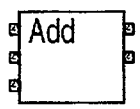
FIG._J-37-1
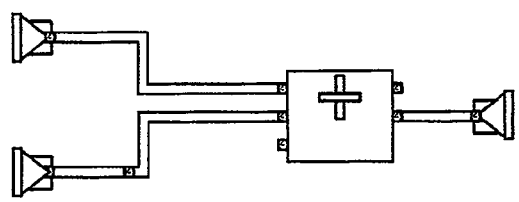
FIG._J-37-2

Behavior Pages
*FIG._J-38*
*FIG._J-38-1*
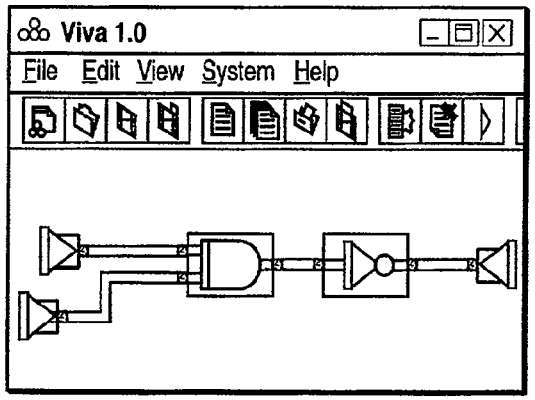
*FIG._J-38-2*
Convert Sheet to Object command from the File Menu, or select the ToolBar icon, [icon].
*FIG._J-38-3*

This Module may now be used to contruct other behavior pages for Modules with more complex behavior.
Node labels for the inputs and outputs of the NAND Module are the same labels on the inputs and outputs of the Behavior Page.
FIG._J-38-4
Connecting Transports
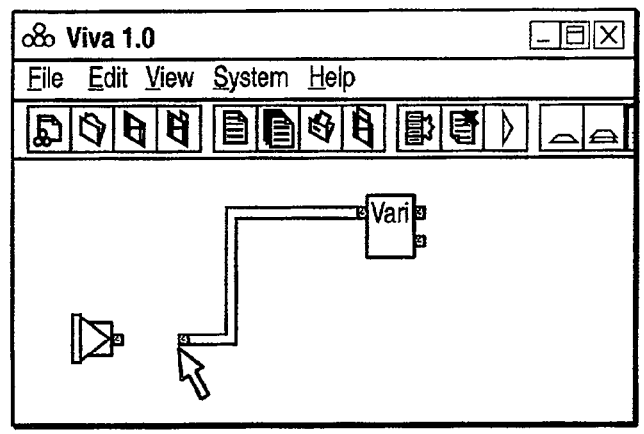
FIG._J-39
Connecting Junctions
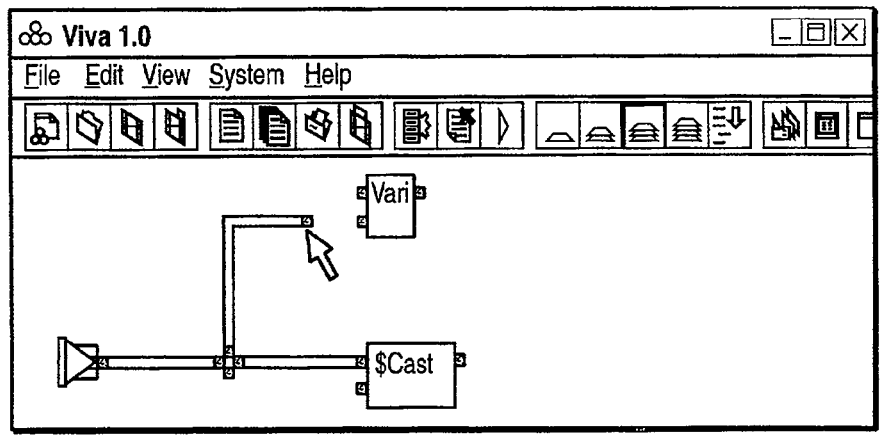
FIG._J-40

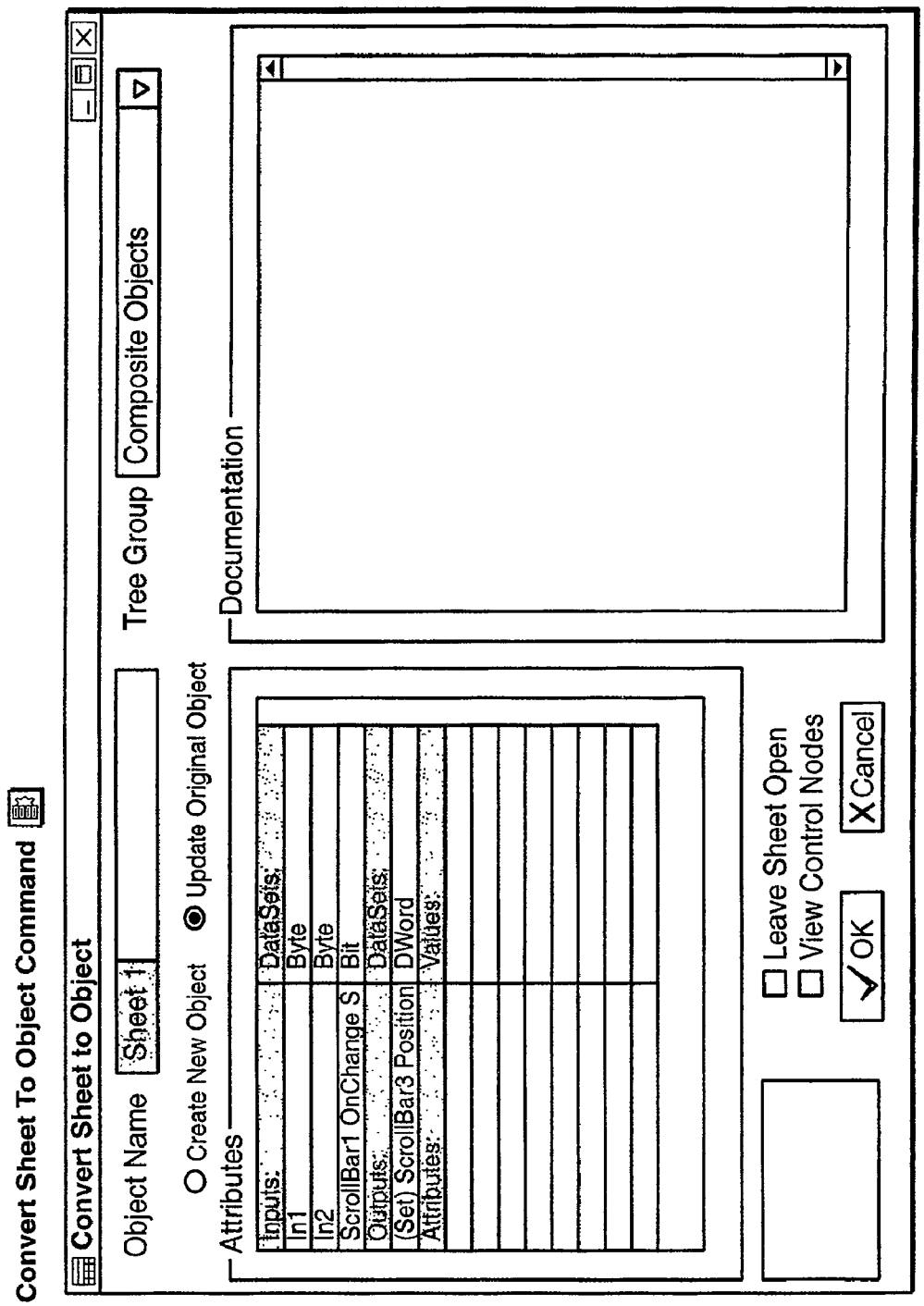
FIG._J-41

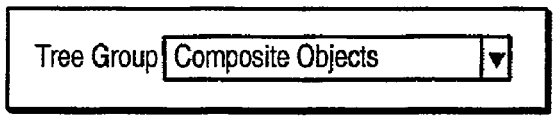
FIG._J-42
Object Trees
FIG._J-43
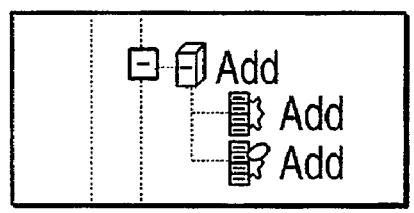
FIG._J-44-2
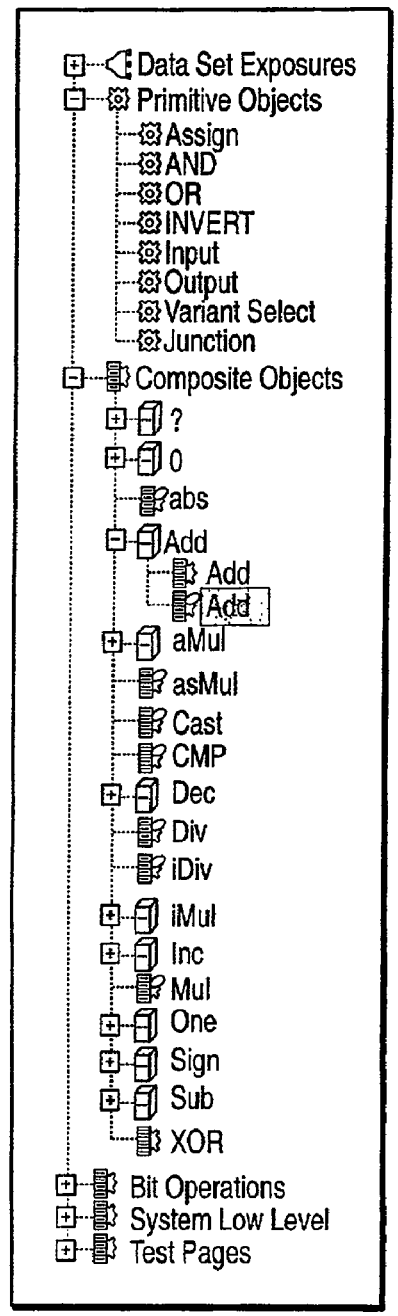
FIG._J-44-1

Modifying an Input
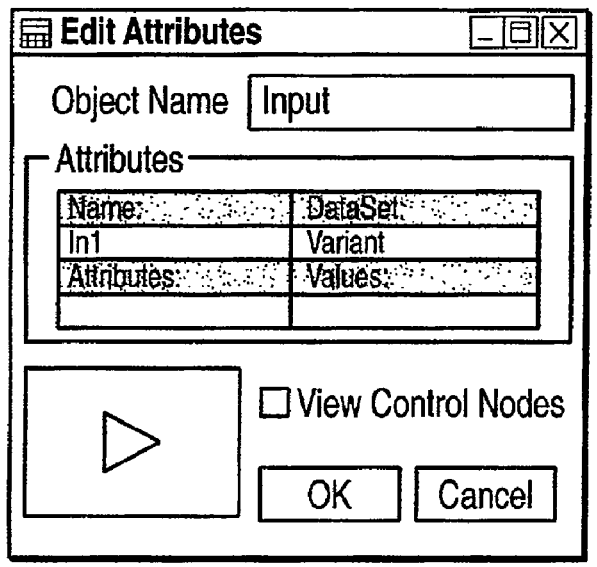
FIG._J-45
Modifying an Output
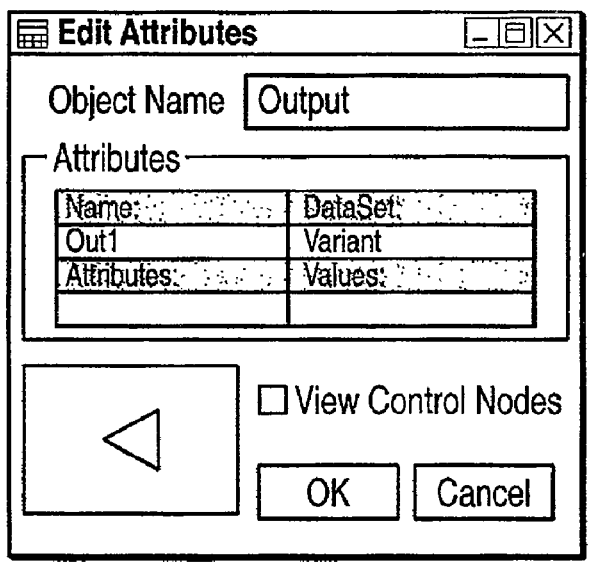
FIG._J-46

VIVA Constants
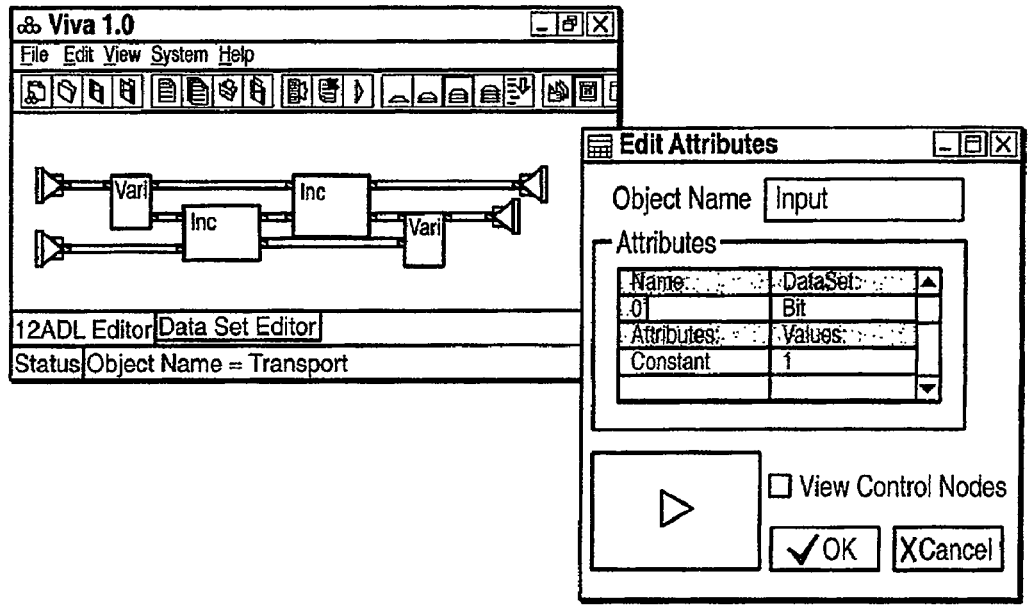
FIG._J-47
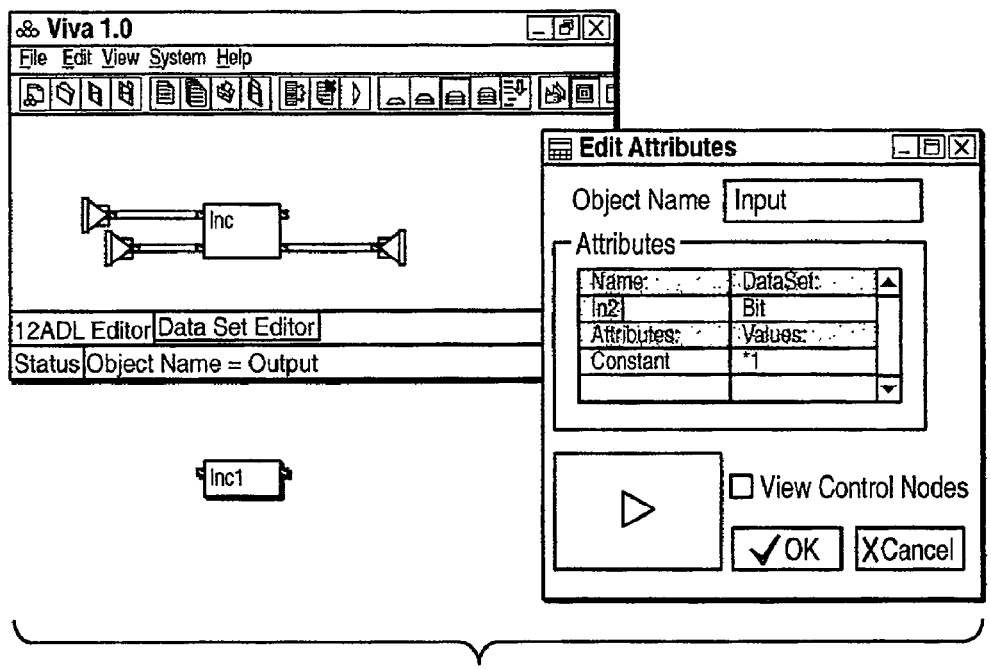
FIG._J-48

Forcing GateWare Allocation
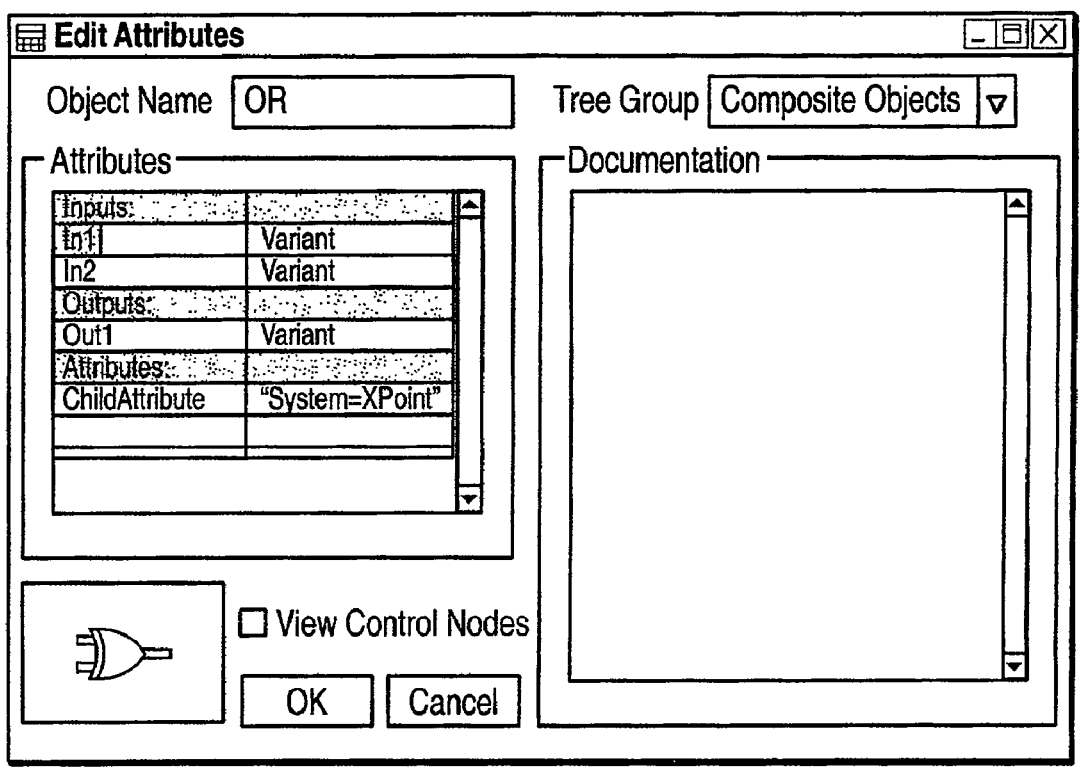
FIG._J-49

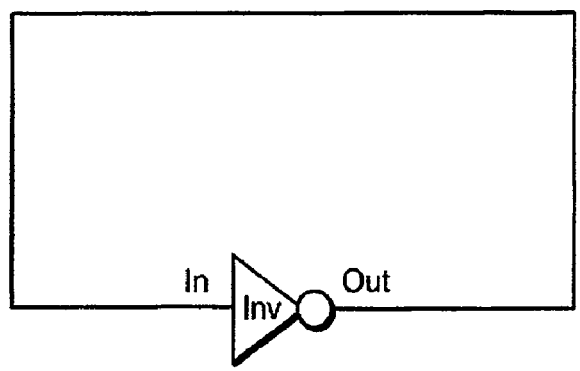
FIG._K1
*(PRIOR ART)*
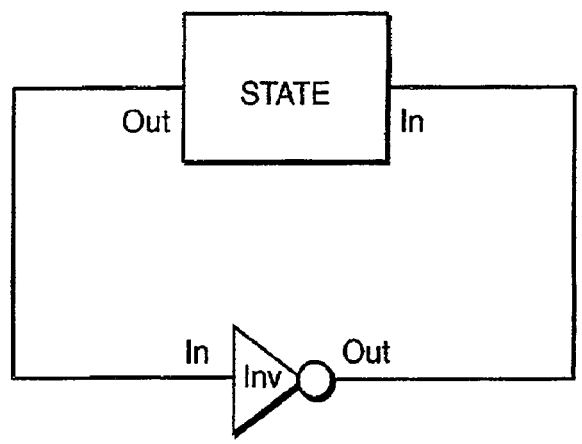
FIG._K2
*(PRIOR ART)*
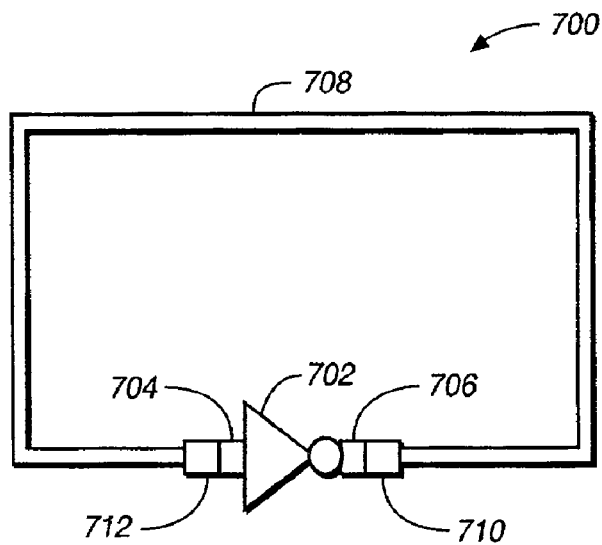
FIG._K3

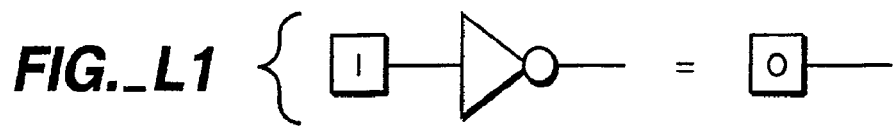
FIG._L1
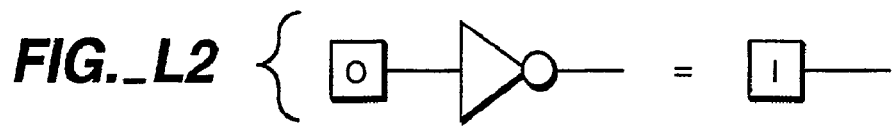
FIG._L2
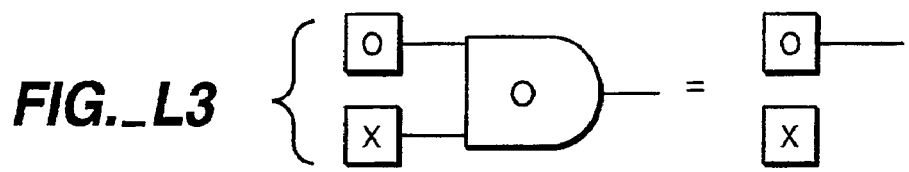
FIG._L3
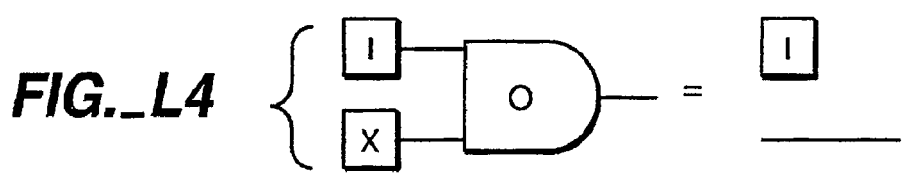
FIG._L4
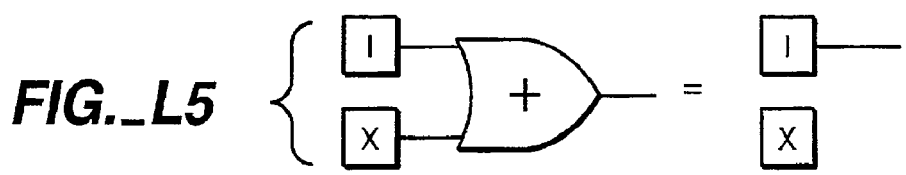
FIG._L5
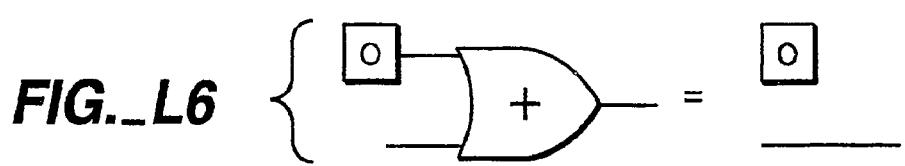
FIG._L6

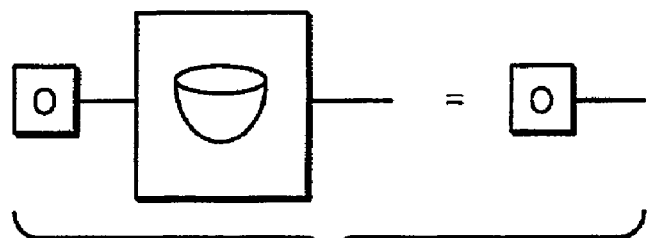
FIG._L7
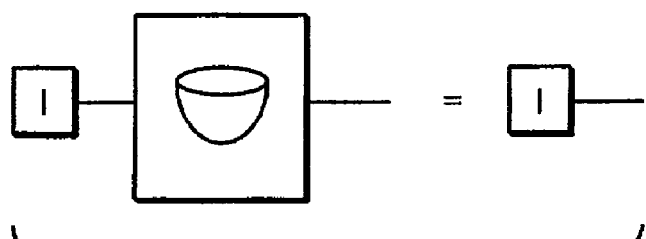
FIG._L8
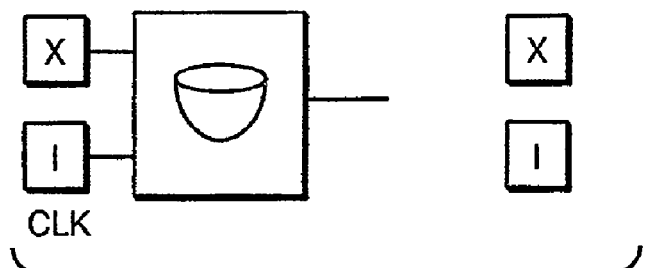
FIG._L9
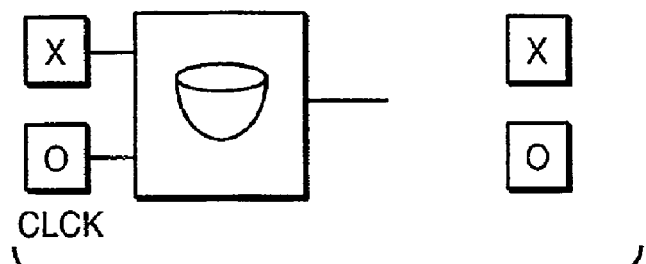
FIG._L10

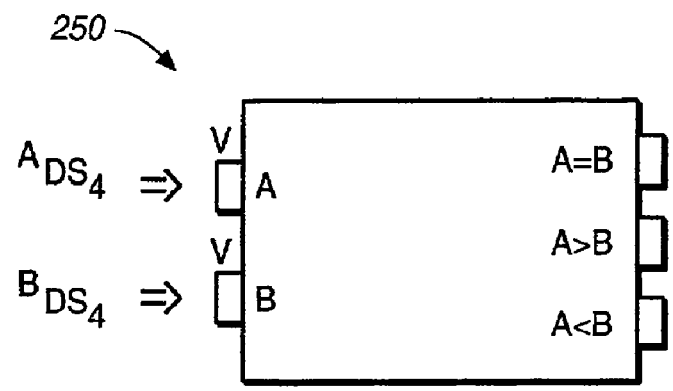
FIG._L11
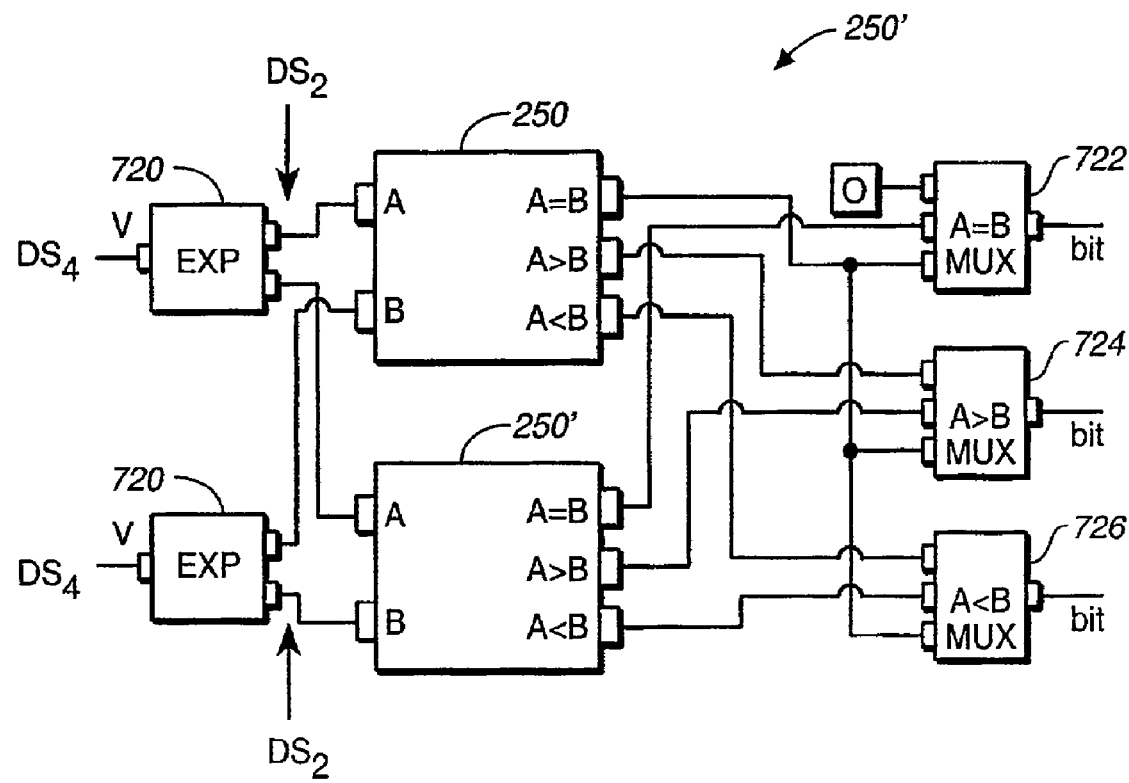
FIG._L12

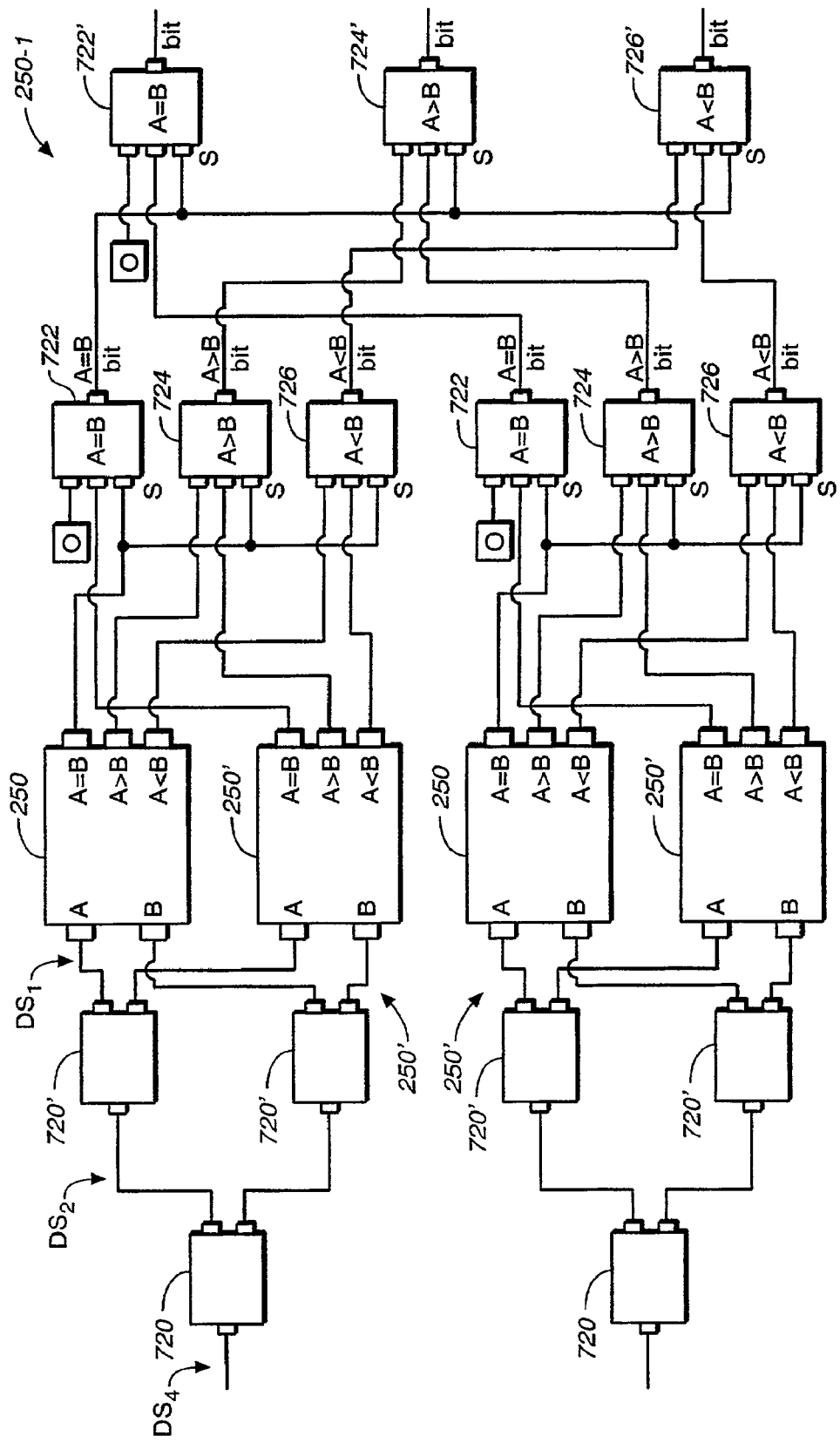
FIG._L13

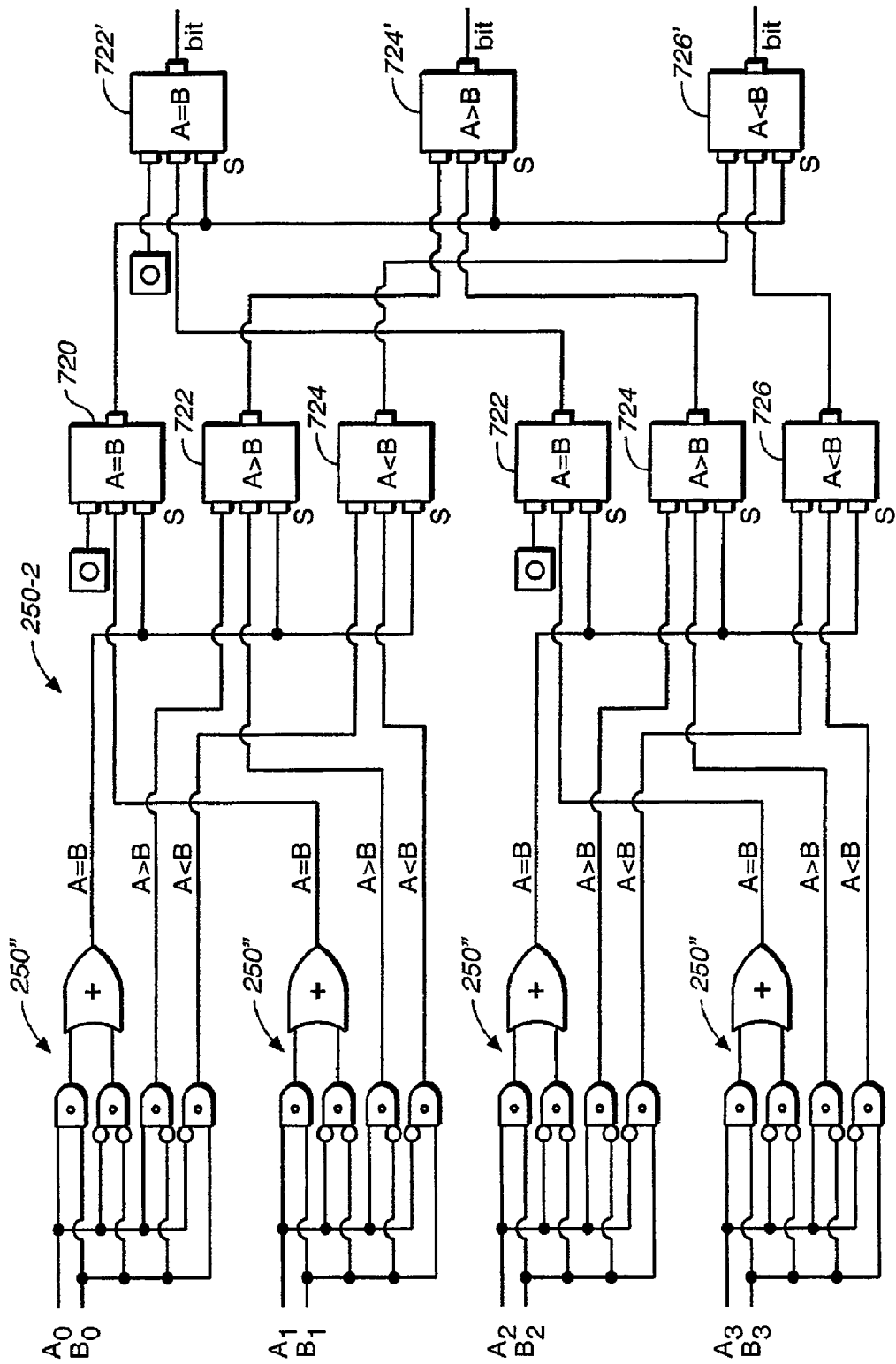
FIG._L14

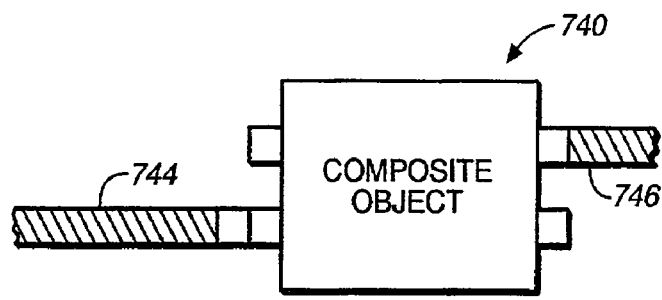
FIG._M1
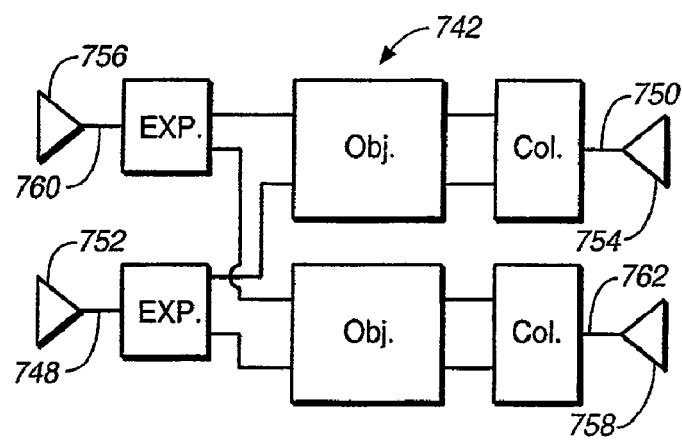
FIG._M2
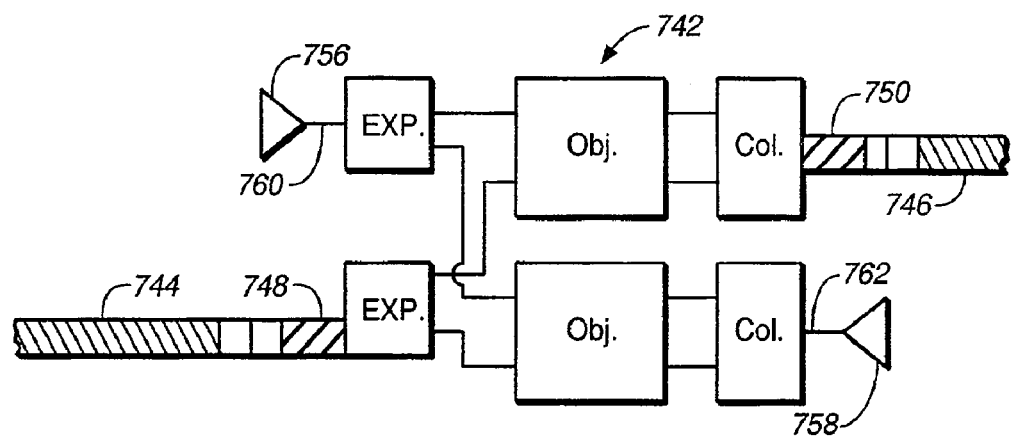
FIG._M3

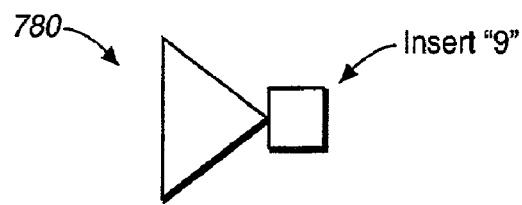
FIG._N1
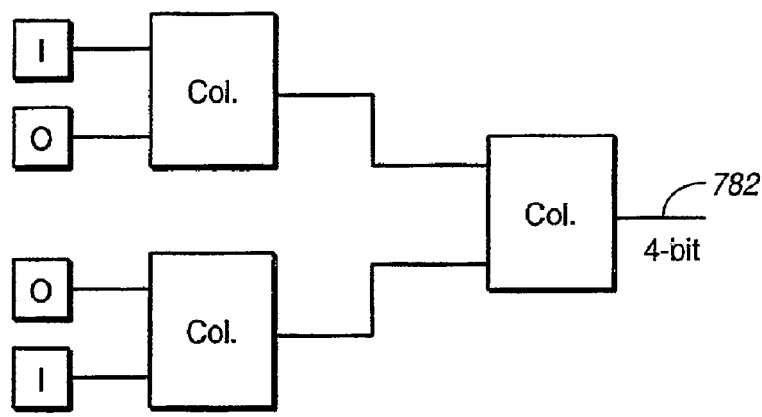
FIG._N2
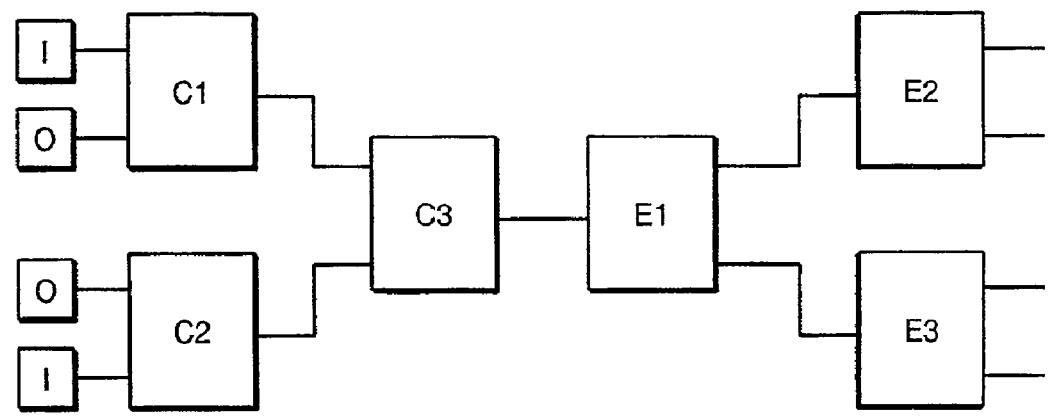
FIG._O1

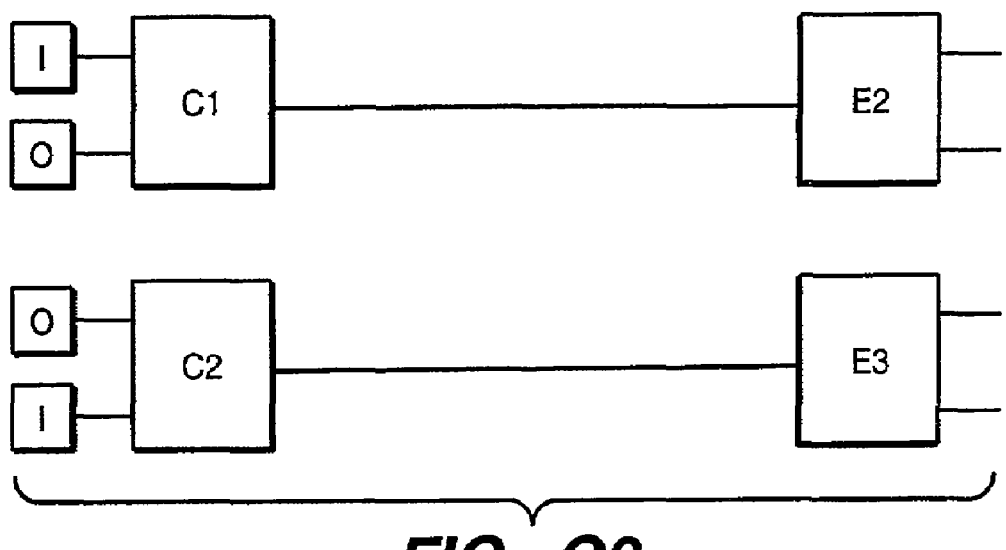
FIG._O2
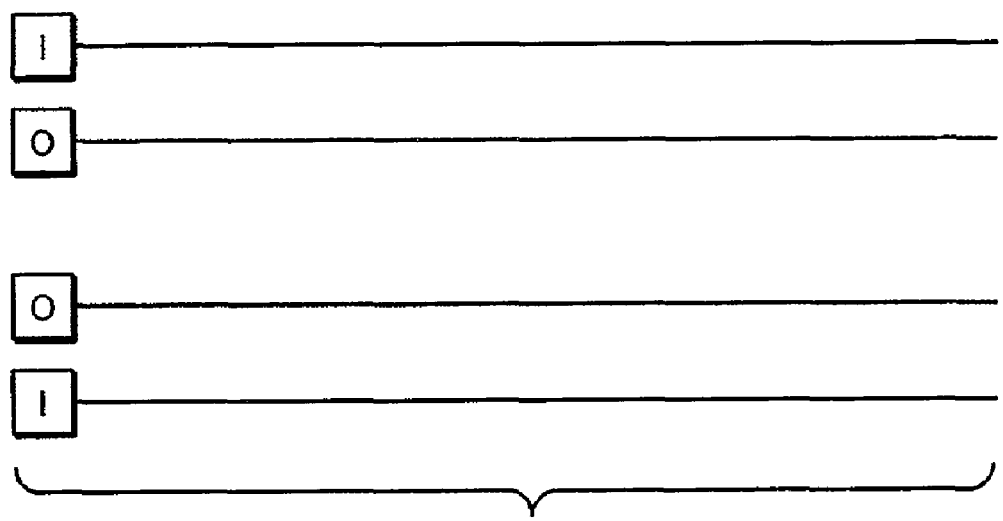
FIG._O3

| Carry | 1 | | 0 | | 1 | |
|---|---|---|---|---|---|---|
| A | | 1 | 1 | 0 | 1 | 1 | 0 |
| B | | 1 | 0 | 0 | 0 | 1 | 0 |
| Sum | 1 | 0 | 1 | 1 | 0 | 0 | 0 |

*FIG._P1*

| Carry | 1 | 0 | 0 | 1 | 1 | 0 | |
|---|---|---|---|---|---|---|---|
| A | | 1 | 1 | 0 | 1 | 1 | 0 |
| B | | 1 | 0 | 0 | 0 | 1 | 0 |
| Sum | 1 | 0 | 1 | 1 | 0 | 0 | 0 |

*FIG._P2*

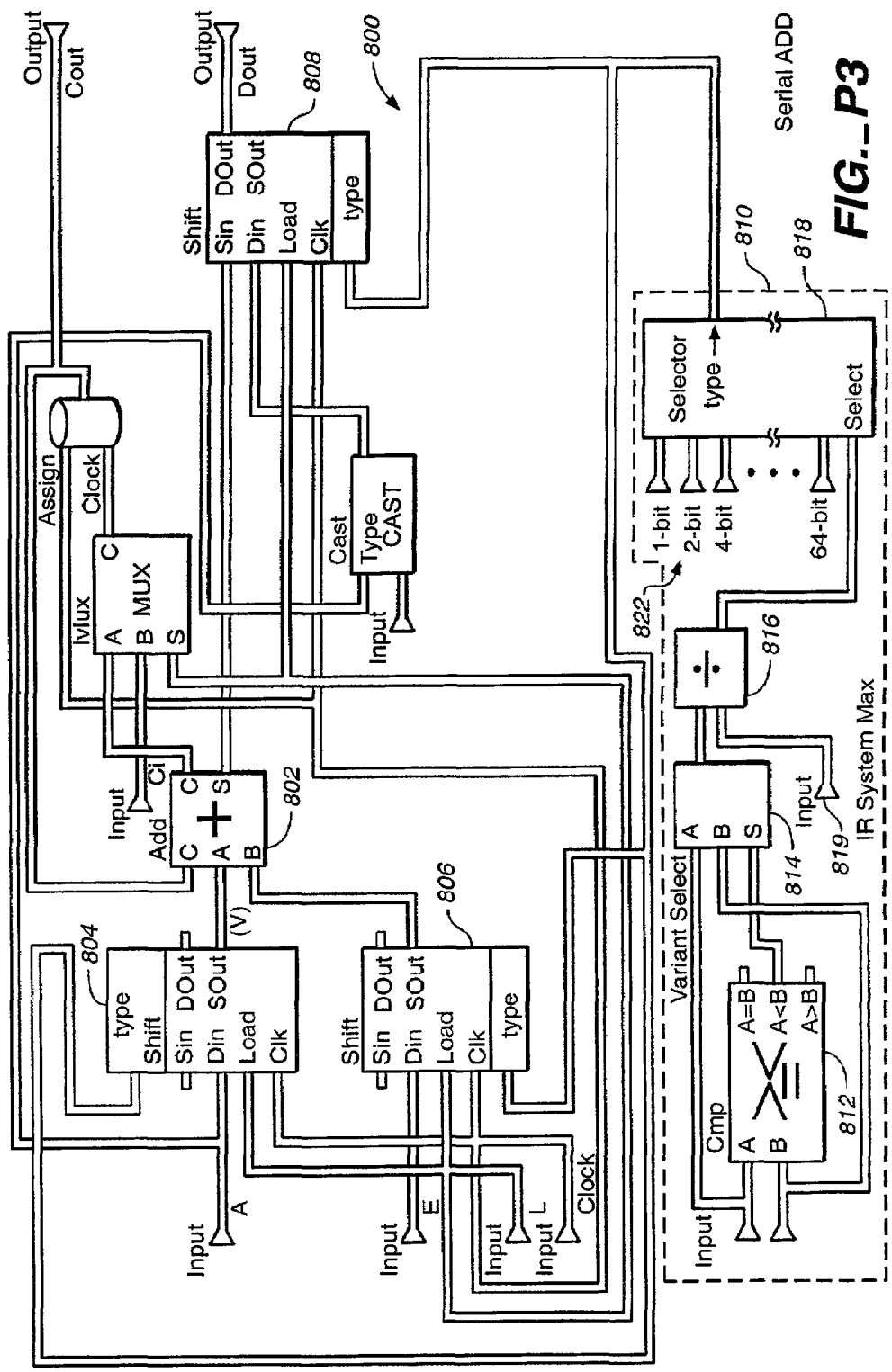
FIG._P3

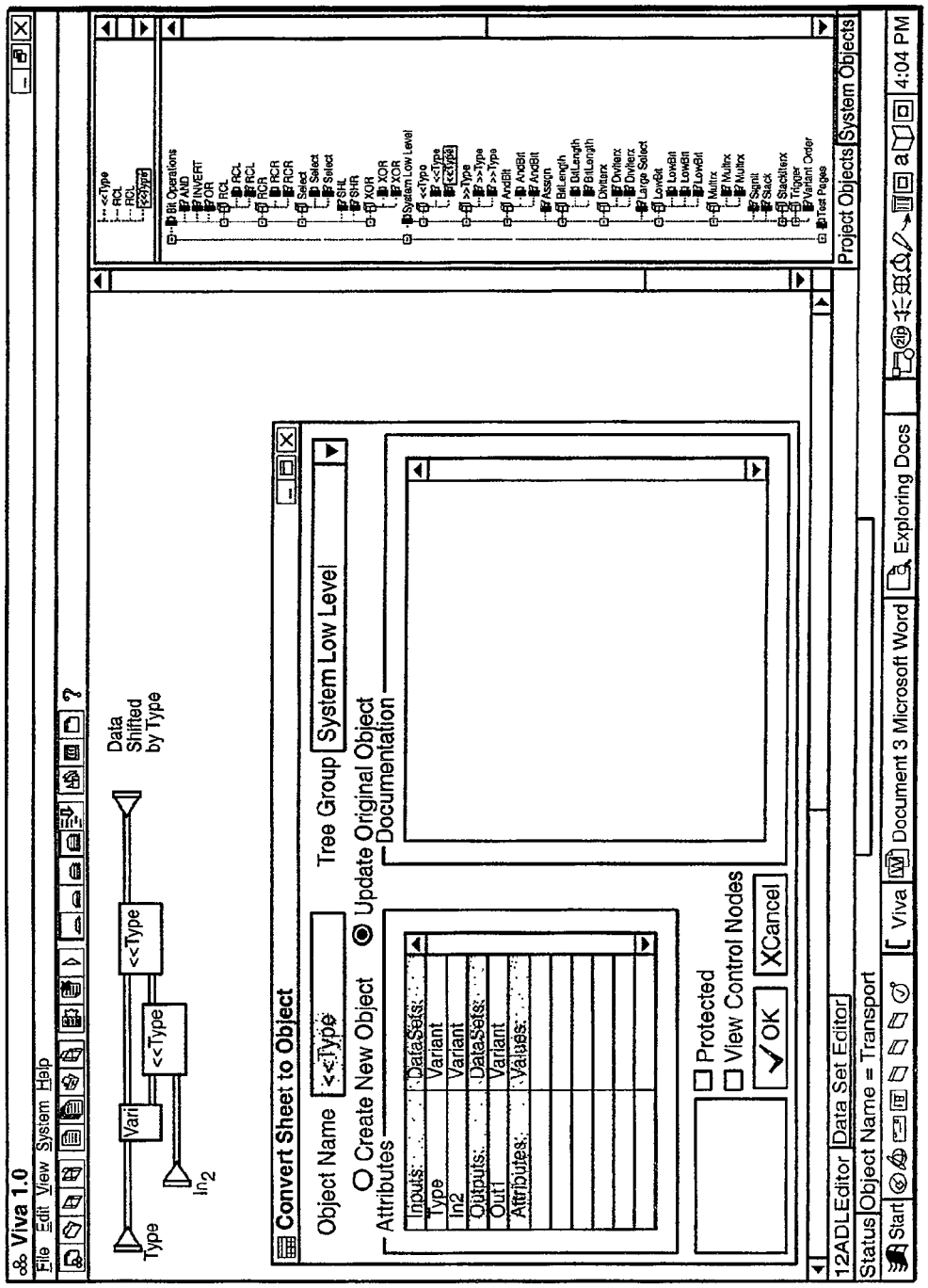
FIG. P4

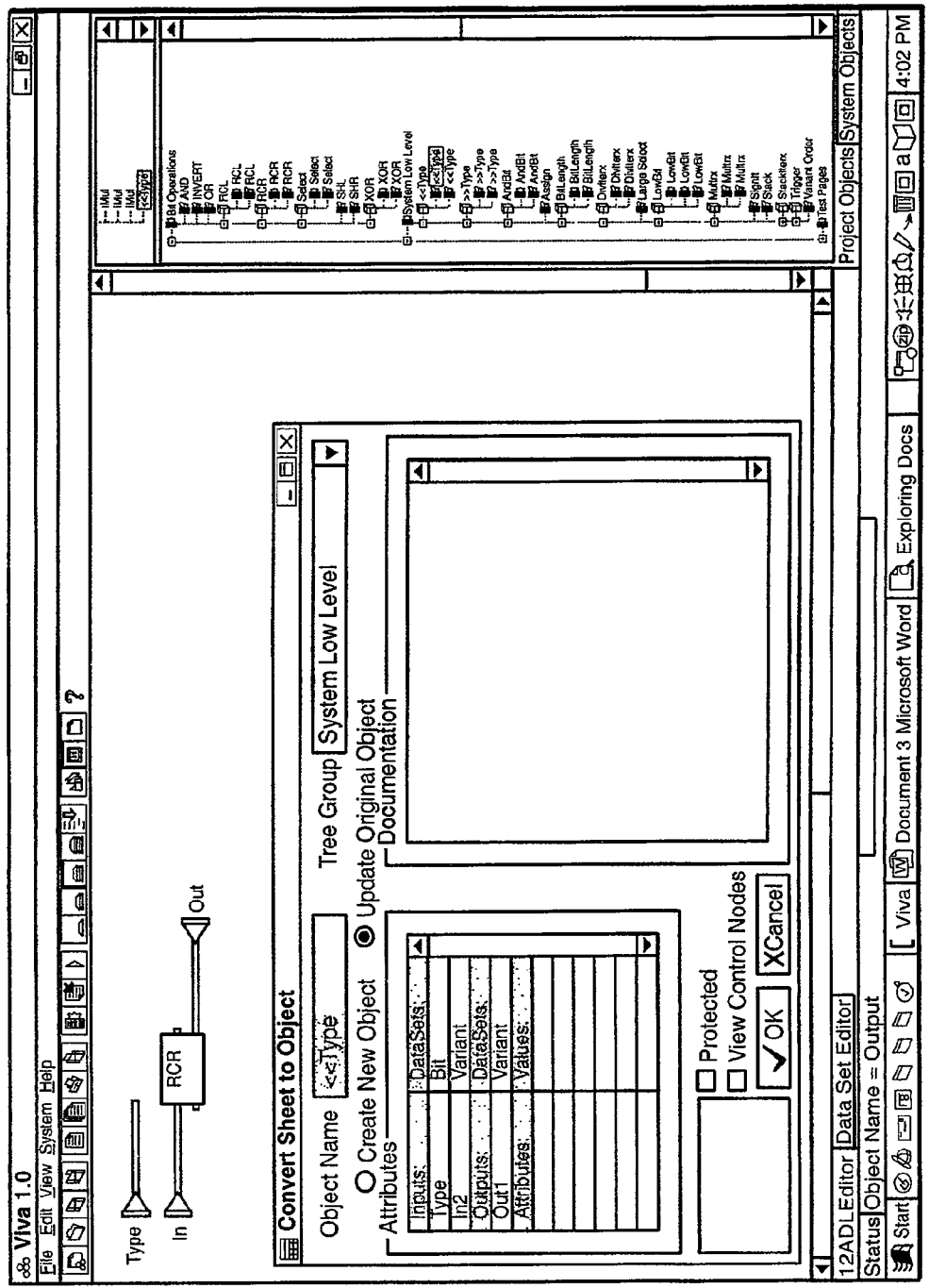
FIG._P5

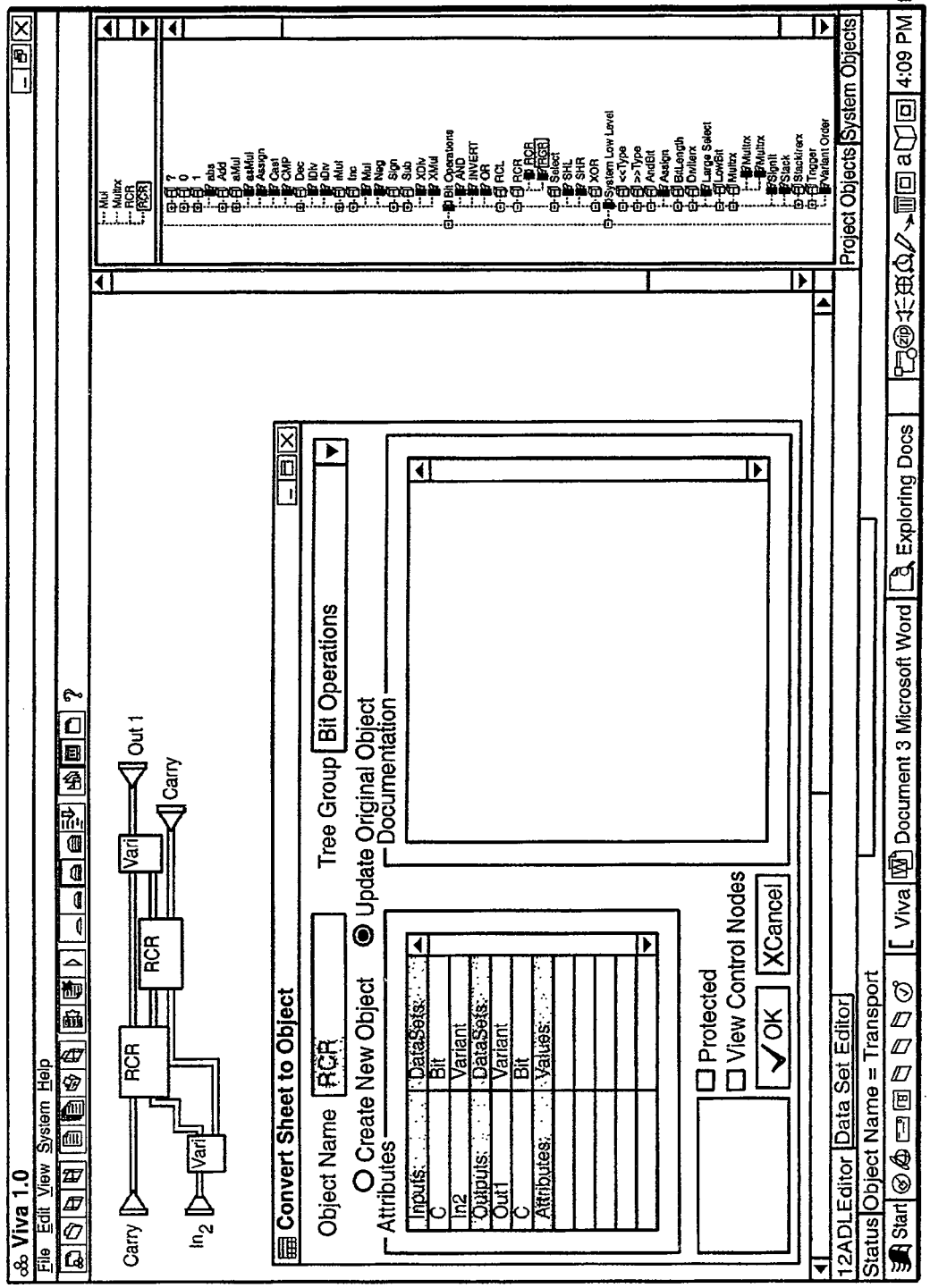
FIG._P6

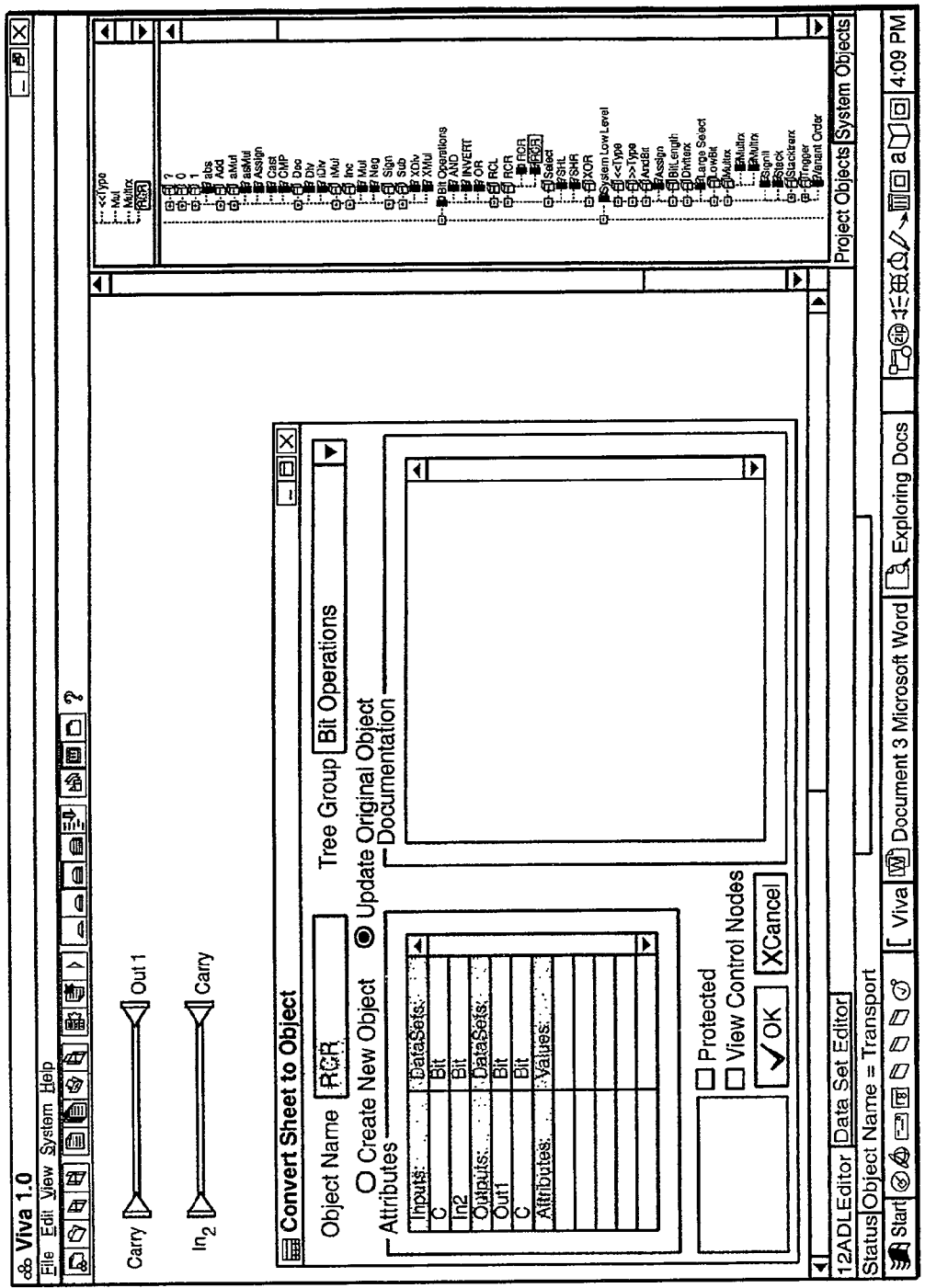
FIG._P7

US 7,525,457 B2

TRANSFORMING DESIGN OBJECTS IN A COMPUTER BY CONVERTING DATA SETS BETWEEN DATA SET TYPES

CROSS-REFERENCE TO RELATED APPLICATIONS

This is a Divisional of application Ser. No. 09/747,602 filed Dec. 22, 2000, now U.S. Pat. No. 7,197,505 which in turn is a Continuation, which claims the benefit of U.S. Provisional Application No. 60/258,112 filed Dec. 22, 2000. The entire disclosure of the prior applications is hereby incorporated by reference in its entirety.

FIELD OF THE ART

The present disclosure generally relates to behavioral synthesis methods and, more particularly, to conversion of data sets between data set types.

BRIEF DESCRIPTION OF THE DRAWINGS

In order to describe the manner in which the various features can be obtained, a more particular description of the subject matter of the invention will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which:

FIGS. A1-A3 are diagrams representing examples of select objects in a branching algorithm;

FIGS. B1-B3 are diagrams representing other implementations of select objects in a branching algorithm;

FIG. C1 is an illustrative drawing of an example of another implementation of a select object in a branching algorithm;

FIG. C2 is a diagram illustrating a library object referenced by FIG. C1;

FIG. C3 is an illustrative drawing showing connections in a branching algorithm associated with select object of FIG. C1;

FIG. D1 is an illustrative drawing showing a top-level polymorphic ADD object that can be included within a design diagram;

FIG. D2 is an illustrative drawing showing the polymorphic ADD object of FIG. D1 connected with transports;

FIGS. D3-D8 are illustrative drawings that show the polymorphic ADD behavior object at various stages of a synthesis process;

FIG. D9 is a diagram illustrating a next level parallel add object inserted into the design in place of the top level parallel add object;

FIG. D10 provides an illustration of a next level serial add object;

FIG. E1A is an illustrative drawing showing a representation of a top-level cast behavior object;

FIG. E1B is an illustrative drawing showing a portion of an object library that pertains to cast behavior;

FIG. E1 is an illustrative drawing showing details of a variant cast object;

FIG. E2 is an illustrative drawing showing a variant castup object referenced using the castup object of FIG. E1;

FIG. E3 is an illustrative drawing showing a terminal leaf castup object;

FIG. E4 is an illustrative drawing showing a variant castdown object referenced using the top-level castdown object of FIG. E1;

FIG. E5 is an illustrative diagram that pictorially represents in general terms the evolution of the castup behavior object during a synthesis process;

FIG. E6 is an illustrative drawing showing an explicit castdown object;

FIG. E7 is an illustrative drawing showing a representation of the portion of an object library relating to castdown behavior;

FIG. E8 is an illustrative drawing showing a collection of objects;

FIG. E9 is an illustrative drawing showing a portion of the object library that pertains to the logical function;

FIG. F1 is an illustrative drawing of a portion of an object library pertaining to an invert equivalent function;

FIG. F2 is an illustrative diagram showing a representation of a top-level invert function;

FIG. F3 is an illustrative diagram representing the variant invert object;

FIG. F4 is an illustrative diagram showing an atomic invert object;

FIGS. F5-F8 are illustrative diagrams showing an evolution of an invert object in a design in response to propagation of a nibble data set to its input node;

FIG. G1 is an illustrative drawing that represents several types of data set exposers and corresponding data set collectors;

FIG. G2 is an illustrative drawing showing a portion of an object library related to a variant type data set exposer object;

FIG. G3 is an illustrative drawing showing a portion of an object library related to a variant type data set collector object;

FIGS. H1-H8 provide pictorial representations of the operators of the Axiom system;

FIGS. I1-I5 provide pictorial representations of some special basic operators of the language;

FIGS. J1-J49 are illustrative diagrams showing topology of a program constructed in accordance with various embodiments of the invention;

FIG. K1 is a schematic diagram of an inverter;

FIG. K2 is a schematic diagram showing an inverter connected to a state element;

FIG. K3 is a drawing showing a behavioral object that includes an inverter object;

FIGS. L1-L2 are diagrams illustrating atomic object resolution rules for an atomic INVERTER operator;

FIGS. L3-L4 are diagrams illustrating atomic object resolution rules for an atomic AND operator;

FIGS. L5-L6 are diagrams illustrating atomic object resolution rules for an atomic OR operator;

FIGS. L7-L10 are diagrams illustrating atomic object resolution rules for an Assignment operator;

FIGS. L10-L14 are illustrative drawings showing combined operation of the propagate data sets process and the flatten process in reducing a variant polymorphic behavior object into its atomic elements;

FIGS. M1-M3 are illustrative drawings showing a flatten process that substitutes a lower-level object into a design in place of a given composite object;

FIG. N1 is a diagram of a source node;

FIG. N2 is a drawing of a process that constructs the hierarchy of collector objects;

FIGS. O1-O3 are drawings that illustrate the operation of the remove collector and exposer objects process;

FIGS. P1-P7 shall be used to provide a hypothetical example of such a computational polymorphic object;

FIGS. P1-P2 are illustrative drawings showing examples of a one bit serial add and a two bit serial add;

FIG. P3 is an illustrative drawing showing a hypothetical computational polymorphic add object;

FIG. P4 is a drawing that illustrates the topology of a variant type data set shift-by-type object;

FIG. P5 is a drawing that shows a topology of a terminal leaf of the variant shift by type object;

FIG. P6 is a drawing that illustrates the topology of a variant type data set RCR object; and FIG. P7 is a drawing that illustrates the topology of a terminal leaf RCR object.

DETAILED DESCRIPTION OF THE VARIOUS EMBODIMENTS

Overview of Synthesis Process and High-Level Diagram Behavior Description Language The present invention provides a novel high-level diagram behavior description language to implement novel computer software based synthesis process. A behavioral synthesis process in accordance with a presently preferred embodiment of the invention transforms a generalized behavioral design in a design database into a detailed interconnection of design objects to implement the behavior. More specifically, the new synthesis process synthesizes a detailed design to implement a behavior from a high level diagrammatic description of the behavior. In one aspect of the invention, a behavioral synthesis process of transforms a high level block or schematic design topology into a detailed design comprising an interconnection of design objects that implements the same design topology. In a present embodiment, the detailed design comprises a netlist that can be targeted to hardware. The targeting to hardware can be achieved through placement and routing software tools that form no part of the present invention.

In operation, a user creates a diagrammatic representation of the desired behavior of a design on a computer user interface. The diagrammatic representation of the design behavior is created using graphic objects taken from a library of graphic objects. The graphic objects in the design are connected so as to create a block or schematic diagram representing the desired behavior. Graphic objects are connected to one another with a special graphic object herein referred to as a transport object. The graphic object library includes atomic or primitive graphic objects, and it includes composite graphic objects. Atomic or primitive objects are graphic objects that cannot be decomposed into other graphic objects. Composite graphic objects are objects that are composed of other graphic objects. Thus, a representation of a design may include composite graphic objects, which in and of themselves comprise other graphic objects connected to one another by transport objects. Moreover, graphic objects in the library may be hierarchically related in object class-like relationships. For example, there is an add behavior class in which a top-level graphic object references lower level graphic objects in the add behavior class. When a top-level add graphic object is inserted into a design, it brings with it a reference to the lower level graphic objects in the add object class.

In another aspect of the invention, a design database comprised of design objects is created automatically as the user creates a diagrammatic representation of the desired behavior on the computer user interface. That is, as a user creates a diagrammatic representation of a desired behavior on a computer user interface, a corresponding design database is created in a computer readable storage medium. The design database includes at least one design object for each graphic object in the diagrammatic representation of desired design behavior. Conceptually, the relationship between design objects and graphics objects is not a simple one-to-one relationship since many design and graphics objects are hierarchical, and one high level object may itself reference one or more other objects in its hierarchy. Thus, the topology of a diagrammatic representation of design behavior created on a computer user interface matches a topology of the design in the design database. For each primitive graphic object there is a corresponding primitive design object. For each composite graphic object there is a corresponding composite design object. A network of graphic transport object interconnecting other graphic objects in the diagrammatic representation matches a network of design transport objects interconnecting other design objects in the design database.

The synthesis process transforms a topology of a diagrammatic representation of desired design behavior into an interconnection of atomic objects to achieve the desired behavior. In a present embodiment, the synthesis process produces an actual netlist. The synthesis process both transforms the diagrammatic representation of behavior displayed on the user interface and the corresponding design topology in the design database. Therefore, the diagrammatic representation of design behavior on the user interface can be used to assess the results and efficacy of the synthesis process upon the design topology in the design database.

A new computer language is provided in which a high level block or schematic design topology can be created to represent desired behavior of a system. A new synthesis process is provided in a detailed design database comprising design objects interconnected to implement a desired design can be synthesized from a high level diagrammatic description of the desired system behavior. Thus, the detailed behavioral design of a system can be synthesized directly from a diagrammatic description of the desired behavior of the system.

Multi-Threaded Behavioral Synthesis Process

A synthesis process in accordance with a presently preferred embodiment of the invention comprises multiple concurrent threads of execution. These threads or processes are summarized as follows.

Propagate Data Sets
Propagate Information Rate
Generate Constants
Propagate Constants
Flatten Hierarchical Objects
Select Equivalent Function (operates in conjunction with Flatten)
Exposer and Collector Objects
Remove Sourceless and Sinkless Objects
Compress Transports The threads of execution run concurrently. For each Thread, the basic execution process is described in general in pseudo code as follows.

```
1 while (cando)
  {for each object in the database,
  DO (Thread)
  }
  if anything was done by any Thread to any
  object in the database, then can do is
  true;
```

Basically, each of the threads of execution operates upon design objects. The threads operate in parallel. That is they operate concurrently, but they do not necessarily operate on the same design objects at the same time. For instance, each of the threads may concurrently operate on different design objects. Each of the threads can transform the object that it operates upon in some manner. For instance, the flatten thread may substitute a lower level object in an object class hierarchy in place of a higher level object in the object class hierarchy. Such transformations in effect incrementally transform the design. For example, just to mention a few of many possible incremental design changes, a new object may be added to a design, an object may be removed from the design or connections between objects in the design may be changed. These incremental changes gradually transform the design as multiple threads of execution simultaneously process different objects of the overall design.

Each of the threads effects a different aspect of the overall synthesis process. For instance, the propagate data sets thread propagates data set types through the design. The flatten hierarchical objects process replaces high level objects with equivalent lower level objects. The remove sourceless and sinkless process removes from a design source nodes and sink nodes and certain objects connected to such nodes. The threads operate independently from each other. However, as the various threads execute, the design database is transformed so that objects that previously were not ready to be processed by a given thread subsequently become ready for processing by that given thread. That thread then can process such newly ready objects. Moreover, the processing by that given thread will further transform the design database so that other objects become ready for processing by other yet other threads. For instance, the flatten process cannot be carried out on a variant data set type object until explicit type data sets have been propagated to the data input nodes of that object. Moreover, the operation of the flatten process on that object may leave one or more source or sink nodes unconnected, creating an opportunity for the remove sourceless and sinkless nodes thread to operate on such unconnected nodes. Thus, the design database is continually modified throughout the synthesis process by the interaction of the various threads of execution.

Multi-Dimensional Recursive "Wavefront"
Behavioral Synthesis Process

Graphic transport objects are used to show connections between design objects in a diagrammatic description of desired behavior. Each graphic transport object in a design diagram corresponds to at least one design transport object in a corresponding design database. Graphic transport objects in a design diagram represent the flow of information from one graphic object to the next in a design diagram. Similarly, design transport objects represent the flow of information in a corresponding design comprising the interconnected design objects in the design database. Thus, transport objects provide an intuitive mechanism whereby a user can comprehend the flow of information through graphic design diagram and through a corresponding design in the design database.

Transport objects also serve another important role during the synthesis process. Specifically, transport objects define the next token (object) to be processed by one or more threads of execution. For instance, assume that in a design, a given transport object connects a first upstream object to a second variant data set type object. In that case, the data set propagation process propagates (or copies) data set type from an output node of the first object to an input node of the given transport object. Then it propagates the data set type from the input node of the given object to the output node of the given object. Next, it propagates the data set type from the output node of the transport object to the input node of the second object. The data set propagation process follows the path through the design demarcated by the transport object. Similarly, other threads of execution follow paths demarcated by the transport object in the design. In essence, a transport object serves as lexical element in during the synthesis (compiler) process that identifies the next token to be processed. Multiple threads of execution described herein use the transport object as a next token identifier.

A diagrammatic behavioral design in accordance with a present embodiment of the invention will comprise a two dimensional network of graphic transport objects that interconnect graphic objects. Consider that a diagrammatic description of behavior in accordance with a current embodiment involves the interconnection of graphic objects with multiple input nodes and multiple output nodes. Furthermore, consider that a diagrammatic representation of a complex design may have numerous branches creating different paths among graphic objects. Branches are created with graphic transport objects.

Remember that for each graphic object in such a diagram, there exists at least one corresponding design object in a corresponding design database. Thus, there exists in the design database a two dimensional network of design transport objects interconnecting other design objects.

During the synthesis process, a parallelism in the execution of multiple threads naturally develops from a combination of the two dimensional nature of the network of transports and the transport objects in the network serving as next token identifiers. Moreover, it will be appreciated that processing by any given thread of execution does not follow just one path of execution at a time from object to object in a design. Rather, the many transport objects in the network of transport objects in a design can demarcate multiple paths of execution at any given time. Thus, for instance, a first thread may first process an object identified by a transport object on one branch or path through the design. Next, the same first thread may process another object identified by a different transport on a different path through the design. After that, that same first thread may process yet another object identified by yet another transport object on either one of these same two paths or on a different path through the design. Consider that each of multiple processes is proceeding contemporaneously in a similar manner, processing one object after the next, as identified by the transport objects in the design. The overall affect is a synthesis process flow that is like a wavefront moving through the design. Multiple threads execute concurrently and individually alternate among different paths demarcated by different transport objects in the two dimensional network of transport objects in the design.

The locus of the synthesis process changes over and over again during the synthesis process. As it does so, the multiple threads of execution collectively move through the design database as if they were a wavefront. Each thread executes when an object in the design is ready for processing by that thread. It will be appreciated of course that a thread may have to wait for available processing resources (e.g., computer cycle time) before it actually can begin to execute. When a given thread completes processing of one object it proceeds to process another object if another object is ready to be processed by it. For instance, for the flatten thread, a variant object is ready for processing when all data input nodes have data sets propagated to them. If no other object is ready for processing by the given thread, then the thread remains idle until the processing by one or more other threads makes another object ready for processing by that given thread. For instance, the propagate data sets thread may propagate data set types to the input nodes of variant object. The flatten process will note this change in the design, will emerge from the idle state and flatten the variant object.

There is an inherent advantage to this form of synthesis. Specifically the synthesis of one object in a design more naturally can be made dependent upon the synthesis of another object in the design. An advantage of this dependency is manifested in the creation of polymorphic objects described in other sections of this disclosure.

Contrast conventional compiler processing flow in which tokens are processed in a one-dimensional fashion. Basically, in languages such as C, Verilog and VHDL the next token to be processed is defined as the next token in a function descriptor. These languages have special constructs, such as "Concurrent" in Verilog and "Parallel" in VHDL, to achieve parallel processing. By comparison, parallel dependencies among objects during a synthesis process are more naturally realized through a parallel synthesis process in accordance with a present embodiment of the invention.

The Axiom System and Basic Operators of High-Level Diagram Behavior Description Language The synthesis process and the high-level diagram behavior description language of a present embodiment of the invention are founded upon a novel set of fundamental principles that we refer to herein as The Axiom System. An axiom is a self-evident or universally recognized truth. The Axiom System described in this disclosure is new, and therefore, not universally recognized. However, it is believed to be self-evident. Significantly, The Axiom System serves as a foundation for an important new Postulate concerning the equivalency of the behaviors of different design objects.

This section introduces the operators that comprise The Axiom System and several special operators developed for use with the high-level diagram behavior description language.

This section also introduces the new Postulate regarding equivalency. Finally, this section places The Axiom System and the Postulate into perspective by contrasting prior processes for creating a behavioral design for a system.

Axiom System

FIGS. H1-H8 provide pictorial representations of the operators of The Axiom system. The Axiom System includes a basic information unit that can be operated on by two categories of operators. The basic information unit is called an information atom (hereinafter an "atom"). The two categories of Axiom System operators are location operators and state operators. The location operator category includes source object, sink object, transport object, and assignment object. The state operators include the AND, OR and INVERT logical functions.

According to the Axiom System, there exists an information atom 600 illustrated in FIG. H1 that is defined by the following properties: location and state. Possible locations include nodes in a design behavior created pursuant to The Axiom System. Possible states include logical 0 and logical 1.

A source object 602 illustrated in FIG. H2 includes an output node 604. According to The Axiom System, a source object 602 can serve as a source of information atoms 600. An information atom 600 can have as its location the source node 604 of a source object 602.

A sink object 606 illustrated in FIG. H3 includes an input node 608. According to The Axiom System, a sink object 606 can serve as a sink for information atoms 600. An information atom 600 can have as its location the sink node 608 of a sink object 606.

A transport object 610 illustrated in FIG. H4 includes an input node 612 and an output node 614. According to The Axiom System, the transport object 610 can change the location property of an information atom. 600. An atom can have its location as the input node 612 or the output node 614 of the transport object 610. The operation of the transport object 610 is to transport information atoms 600 from the input node 612 to the output node 614. While the transport object 610 in FIG. H4 is shown with only one output node 614, a transport object can have multiple output nodes consistent with The Axiom System. The operation of a multi-output node transport object is to change the location property of an information atom from the input node to each and every output node. Thus, a multi-node transport object provides a branching operation.

An assignment object 616 is illustrated in FIG. H5. According to The Axiom System, the assignment object 616 can assign a location to an information atom 600. (The assignment operator 616 is analogous to memory storage medium in a computer system.)

A logical AND operator illustrated in FIG. H6 performs a logical AND operation on constant values. Specifically, it operates on the state property of information atoms. For instance, providing two atoms with logical states 1 and 0 respectively to the two inputs of the AND operator will result in an atom with logical 0 state on its output.

A logical OR operator illustrated in FIG. H7 performs a logical OR operation on constant values. Specifically, it operates on the state property of information atoms. For instance, providing two atoms with logical states 1 and 0 respectively to the two inputs of the OR operator will result in an atom with logical 1 state on its output.

A logical INVERT operator illustrated in FIG. H8 performs a logical INVERT operation on constant values. Specifically, it operates on the state property of information atom. For instance, providing an atom with logical 1 state to the input of the INVERT operator will result in a atom with logical 0 state on its output.

Thus, FIGS. H6-H8 illustrate the basic state operations selected for The Axiom System. It will be appreciated that different state operators such as combinations of the NOR or NAND logical functions, for example, could have been selected consistent with the invention.

Language Operators

FIGS. I1-15 provide pictorial representations of some special basic operators of the language. These include data set type operators, a compiler directive operator, composite objects and a junction operator. More specifically, the data set type exposer illustrated in FIG. I1 and the data set type collector illustrated in FIG. I2 are data set type operators. The variant selector illustrated in FIG. I3 is a compiler directive operator. The composite object illustrated in FIG. I4 operates to represent a hierarchy of logically equivalent behaviors. The transport junction object of FIG. I5 is a graphic object that operates to display multiple output nodes from a transport object. Each of the objects in FIGS. I1-I5 is explained explicitly or through examples in other sections of this disclosure.

The Axiom System supports the following Postulate concerning the equivalency of behaviors in a system.

Postulate

Behavior A is equivalent to Behavior B so that Behavior B can be substituted into the system to replace of Behavior A if, Behavior A is logically equivalent to Behavior B; and Data Set of Behavior A is equal to the Data Set of Behavior B; and Information Rate of Behavior A is less than or equal to the Information Rate of Behavior B; and Action Latency of Behavior A is greater than or equal to Action Latency of Behavior B.

Logical equivalence means that for any given set or pattern of input information atoms, two behaviors will produce the same set or pattern of output information atoms. In a presently preferred embodiment of the invention, logical equivalence of behavior objects is signified through naming. Thus, in a current embodiment, objects that include the same name are considered as logically equivalent. For instance, an object with the name "Add" is considered to be logically equivalent to another object that includes the name "Add". There may be multiple types of logically equivalent "Add" objects in an object library available to a system. For example, an object library might include instances of the following logically equivalent Add objects, Parallel Add object, Serial Add object, Saturating Add object, Floating Point Add object, Complex Numbers Add object and Vector Data Set Add object.

A Data Set signifies a format of information atoms. In a current implementation of the invention, a Data Set signifies a collection of information atoms organized as a recursive hierarchy of other data sets with the default data set being a single atom (1-bit). The Data Set can be associated with a node of an object. A Data Set associated with an input node of an object signifies the type of data set that can flow into the node.

Information Rate is measured in atoms per unit of time (e.g., atoms per second). The Information Rate associated with an input node of an object signifies the rate at which atoms can flow through (for a transport object) or be processed by (for a transformative object that alters an atom's state e.g., an Add object, Subtract object or Multiply object). The Information Rate associated with an output node of an object signifies the rate at which atoms can be supplied by the node to another object (i.e., a transport object) connected to the output node.

Action Latency is the time between the arrival of an atom at an input node of an object and the time of arrival of a resulting atom at an output node of the object. It is the transit time through a transport object and the transformation time in a transformative object. In a current embodiment of the invention the Action Latency of an object is derived from the following relationship.

$$AL = CL + RL$$

AL represents Action Latency. CL represents Compute Latency. RL represents Reaction Latency. Compute Latency is the time required to perform a transit (transport object) or a transformation (transformative object). Action Latency is the setup time for an object. For instance, AL or setup time may be significant in time division multiplexing applications.

New Perspectives on Behavioral Synthesis Through the Axiom System

The Axiom System permits the description of system behavior independent of time. That is, time need not be a factor or element of a description of system behavior. As explained below, a consequence of the ability to describe system behavior independently of time is that symbol substitution can be used to synthesize a design (e.g., netlist) from a behavioral description (e.g., diagrammatic representation of desired system behavior). That is, a symbol may inserted in a design to represent behavior. During synthesis, one or more other equivalent objects may be substituted into the design in place of the symbol. Thus, symbolic substitution can be used as a mechanism for synthesis.

The Postulate permits parameterization of synthesis by symbolic substitution. For instance, Information Rate and Action Latency can be used as parameters used to decide which equivalent object to substitute in place of a symbol in a design. That is, synthesis by symbolic substitution can be made to select among multiple possible alternative substitutions for a symbolically represented behavior in a design based upon one or more parameters such as Information Rate and Action Latency. Since Information Rate and Action Latency are defined in terms of time, selective symbolic synthesis can be parameterized to depend on time. Thus, parameterized selective symbolic substitution can be used as a mechanism for synthesis.

An implication of the ability to conduct synthesis through selective symbolic substitution is the ability to define behaviors in terms of polymorphic objects. A polymorphic object is one that can be resolved into any of multiple objects during the synthesis process. An implication of the ability conduct synthesis through parameterized selective symbolic substitution is the ability to condition the resolution of a polymorphic object upon parameter(s) external to the behavior of the object. A polymorphic object that is associated with a condition imposed on its resolution during synthesis is referred to herein as a parameterized polymorphic object. An implication of the ability to create designs with parameterized polymorphic objects is the ability to create a synthesizable description of desired design behavior that can be resolved differently during synthesis depending upon the particular values assigned or derived during synthesis for the parameters associated with polymorphic objects in the behavioral description (e.g., external to the diagrammatic description of design behavior).

A Fundamental Change in System Design

It is believed that The Axiom System presents an opportunity for a fundamental change in system design techniques. An earlier fundamental shift in system design techniques was initiated by Alan Turing when he solved the inverter problem through the introduction of state at discrete times. The inverter problem is best understood through reference to the schematic diagram of FIG. K1 which shows an inverter with its input and output connected together by electrical conductors (not transport objects). The logical state of the inverter is undefined since its input is connected to its output. Specifically, according to the rules of boolean logic, an inverter cannot be both in a logical 0 state and a logical 1 state simultaneously. Thus, the inverter problem presented a case in which the rules of the boolean logic axiom system failed to describe circuit behavior.

Turing's solution to the inverter problem is best illustrated in the schematic diagram of FIG. K2 which shows an inverter with its output connected by an electrical conductor to an input to a state element and with its input connected to an output of a state element by an electrical conductor. Turing introduced the notion of state at discrete times. At one instant of time, the state of the logical state element is logical 1, and it outputs a logical 1 to the input of the inverter which outputs a logical 0 value. In a next instant of time, the logical 0 output by the inverter, in the prior time instant, has changed the state of the state element to logical 0. In this next instant in time, the state element outputs a logical 0 to the input of the inverter which outputs a logical 1. Turing's solution is to represent a system using state in discrete time.

From a behavioral design perspective, a drawback of a behavioral description of a design in terms of state in discrete time is that selective symbolic substitution is not a feasible synthesis mechanism. Basically, the presence in a behavioral description of state in discrete time makes it infeasible to use symbol substitution to synthesize a design from such a description.

The Axiom System enables a new process for describing system behavior. This new process overcomes the problems described in the preceding paragraphs by using location instead of state in discrete time in the representation of system behavior. The drawing of FIG. K3 shows a behavioral object 700 which includes an inverter object 702 with an input node 704 and an output node 706. The object 700 includes a transport object 708 with an input node 710 and an output node 712. The drawing of FIG. K3 diagrammatically represents the behavior of object 700. The following table also represents the behavior of object 700 which involves changing the state of an atom as it is propagates through the object 700. In studying the table, assume that a trigger event causes incremental flow of the atom from one node to the next inside object 700. The table shows a sequence of location and state of the atom within the object 700 for a sequence of trigger events from T1 to T7.

TABLE

Inverter Problem Solution With State and Location

| Trigger Event | Location | State |
|---|---|---|
| T1 | Node 712 | S1 |
| T2 | Node 704 | S1 |
| T3 | Node 706 | S2 |
| T4 | Node 710 | S2 |
| T5 | Node 712 | S2 |
| T6 | Node 704 | S2 |
| T7 | Node 706 | S1 |

At no point in the behavior described diagrammatically in FIG. K3 and described in table format above is the state or location of the atom undefined. Thus, The Axiom System provides a new process for describing the behavior of a systemic a manner that is independent of state in discrete time.

However, from the Postulate it will be appreciated that The Axiom System enables the creation of parameterized behavioral descriptions of a design. The parameters themselves can be time dependent. For instance, a present embodiment of the invention employs parameterized polymorphic objects using as parameters Information Rate and Information Rate Pattern. Thus, a synthesis process in accordance with the invention can employ selective symbol substitution that is driven by time-dependent parameters. Therefore, the present invention provides a fundamentally new mechanism for the synthesis of a system design from a behavioral description of the system.

"Variant"

The term "variant" is used in this disclosure in reference to data set type. An object with variant data set type on a node is a data set polymorphic object. A variant data set is abstract. An object that is data set polymorphic can be resolved into more than one form of the object depending on the type(s) of data set(s) propagated to it input nodes. A variant data set type object need not be continuously resolvable. There may be multiple possible discrete resolutions of the object. The particular resolution in any given case depends upon the nature of the explicit data set(s) propagated to the input node(s) of the object during the synthesis process. The term variant as used herein is not intended to be synonymous with the variant class in the Pascal language.

Node Structure and the Object Hierarchy

This section describes the object class structure used to construct behavior objects in a current implementation of the invention. The reader should realize that although we speak in object oriented programming terms in this section of the disclosure, the use of the term object in this section should not infer that the use of the term object in other sections, e.g., parameterized polymorphic behavior objects, is intended to limit behavior objects to an object oriented programming implementation. Having made this disclaimer as to interpretation of the term object, this section apprises the reader that an object oriented programming approach in fact has been used to implement behavior objects in a presently preferred embodiment of the invention.

Class $I^2$ ADL Object ($I^2$ ADL Stands for Implementation Independent Algorithm Description Language)

```
{
Name
Inputs (list of input nodes)
Outputs (list of output nodes)
Attributes (list of strings)
Behavior (list of I² ADL Objects)
}
Class Node Object
{
Information Rate* (pointer to class Information Rate object)
Data Set* (pointer to class Data Set object)
Connected to (pointers to other nodes)
Owner (pointer to I² ADLobject)
Attributes
}
Class Data Set Object
{
Elements (list of data sets in the data set in order of precedence)
}
Class Information Rate
{
Float IR
Float RL
Float CL
INT IRP (Information Rate Pattern)
String IRP function (for complex patterns such as FFT or DCT)
}
```

Note that each $I^2$ADL object comprises nodes with "connected to" information. This object class structure forms permits the resolution of a diagrammatic representation of desired behavior into a netlist comprising a network of low-level objects. In a preferred embodiment, the low-level objects are atomic objects. The composite objects of the diagrammatic representation are synthesized into atomic objects interconnected through the "connected to" node structures. As a consequence of this object class structure, changes in higher level composite objects leave the basic underlying object class structure intact, ensuring resolution during the synthesis process from a top-level behavioral description to a network of low-level objects.

Select Object

The select object is used to select among alternative implementations of a behavior in the course of the selective synthesis process. The Select Object is not a behavior per se in that it is used to direct the selective synthesis process, but it is not resolved into an atomic behavior that can be implemented in a design. Basically, it is a branching mechanism. A select object ordinarily operates in conjunction with a control process that also is operative during the selective synthesis process. The control process may be implemented through a control object that is a composite object that is responsive to one or more parameter values. The composite object causes the select object to select from among multiple possible implementations of a behavior. In essence, the control object uses the one or more parameters to resolve a condition upon which the select object selects among multiple possible implementations of a behavior. Of course, the nature and construction and implementation of the control object varies depending upon the nature of the condition controlling the selection by the select object. Thus, in a sense, the select object plus an associated control object can implement a conditional branching during the synthesis process.

Essentially, the select object operates as a compiler instruction. It serves to select from among multiple possible implementations of a behavior. However, in a present embodiment of the invention, it does not itself reference behavior that is actually included within a synthesized result. Moreover, in a current embodiment of the invention, a control object that controls the selection or branching by a select object essentially operates as one or more instructions for resolving a condition on which a conditional branch is to occur. As such, the control object ordinarily is not included as part of a synthesized result. Rather, such control object typically is removed from a design database after it has served its function of controlling a selection by the select object during the synthesis process.

The select object is associated with a conditional process (or an algorithm). During the selective synthesis process, a conditional process associated with a given select object is invoked, and a control object associated with that given select object resolves the condition of the conditional process. The associated process effects a selection of behaviors based upon the resolution of the condition. As a result of the selection of behavior, a design database that includes the select object is modified so as to effect a connection between an input node of the select object and an output node of the select object. As explained below, by effecting such a connection, the select object can select between multiple implementations of a behavior.

Referring to the illustrative drawings of FIG. A1, there is shown a diagram representing an example of a select object. A block 100 that includes a data input node 102, a select input node 104 and an output node 106, represents the select object. The block 100 can be inserted into a design diagram to implement a branch during a synthesis process. During the synthesis process, the block 100 causes the synthesis process (compiler) to invoke a conditional process associated with the block that causes the synthesis process to process a branch operation.

There are two possible results of a branch implemented by a conditional process associated with the select object 100 of FIG. A1. The first is that the data input node 102 will become interconnected with the output node 106. The second is that the data input node 102 will become unconnected to the output node 106. The one result or the other depends upon the value of a signal provided on the select input node 104. For instance, referring to FIG. A2, if a first value, or perhaps a first range of values, is provided on input node 104, then the data input node 102 will become connected with the data output node 106. In a present embodiment of the invention, the data input node and the data output node become connected with a transport object 108. Referring to FIG. A3, if a second value, or perhaps a second range of values, is provided on the select input node 104 then the data input node 102 will become unconnected with the data output node 106.

In a present embodiment of the invention, a given select object is an atomic object. Thus, it does not reference other lower level objects. However, as explained above, it does have a process (or algorithm) associated with it. In the example of FIGS. A1-A3, a branching algorithm can be represented in is straightforward terms as follows.

If value on input select node=1, then connect the data input node to the data output node;

If value on input select node=0, then do not connect the data input node to the data output node.

A control process implemented by a composite object (not shown) in the design database, for example, can be run during the synthesis process in order to derive the value on the select input node 104. It will be appreciated that the composite object that effects the control process is not a part of the select object itself.

Referring to the illustrative drawing of FIG. B1, there is shown an example of another implementation of a select object. A block 120 that includes a data input node 122, data input node 124, select input node 126 and an output node 128, represents the select object. The block 120 can be inserted into a design diagram and a corresponding design database to implement a branch during a synthesis process. During the synthesis process, the block 100 causes the synthesis process (compiler) to invoke a conditional process associated with the block that causes the synthesis process to process a branch operation.

There are two possible results of a branch implemented by a conditional process associated with the select object 120 of FIG. B1. The first is that the data input node 122 will become connected with the output node 128, and data input node 124 will not be connected. The second is that the data input node 124 will become connected to the output node 128, and data input node 122 will not be connected. The one result or the other depends upon the value of a signal provided on the select input node 126. For instance, referring to FIG. B2, if a first value, or perhaps a first range of values, is provided on select input node 126, then the data input node 122 will become connected with the data output node 128, and the data input node 124 will not be connected. In a present embodiment of the invention, the data input node 122 and the data output node 128 become connected with a transport object 130. Referring to FIG. B3, if a second value, or perhaps a second range of values, is provided on the select input node 126 then the data input node 124 will become connected with the data output node 128, and data input node 122 will not be connected. In a present embodiment of the invention, the data input node 124 and the data output node 128 become connected with a transport object 132.

In the example of FIGS. B1-B3, a branching algorithm associated with select object 120 can be represented in is straightforward terms as follows.

If value on input select node=1, then connect data input node 122 to the data output node 128 and do not connect data input node 124;

If value on input select node=0, then connect data input node 124 to the data output node 128 and do not connect data input node 122.

A control process can be implemented by another object in the design database to derive the value on input select node 126.

Referring to the illustrative drawing of FIG. C1, there is shown an example of another implementation of a select object. The select object of FIG. C1 includes four data input nodes 142, 144, 146 and 148, a data select node 150 and a data output node 152. The select object 140 of FIG. C1 references the library object illustrated in FIG. C2 which is a composite object comprising three atomic select objects 154, 156 and 158 of the general type shown in FIGS. B1-B3.

Referring to FIG. C2, the data inputs of a first constituent select object 154 are respectively connected by transports 160 and 162 to data input node 142. The data inputs of the second constituent select object 156 are respectively connected by transports 164 and 166 to data input nodes 146 and 148. The data inputs of the third constituent select object are respectively connected by transports 168 and 170 to the respective data output nodes of the respective first and second constituent select objects 154 and 156. The data output node of the third constituent select object is connected by transport 172 to data output node 152.

A data set exposer 174 includes a data input node 176 and two data output nodes 178 and 180. (The structure and operation of a data set exposer in a present embodiment of the invention are described below.) The data set exposer input node is connected by a transport 182 to select input node 150. One output node of the data set exposer 174 is connected by transport 184 with the select input nodes of both the first and the second constituent select objects 154 and 156. The other output node of the data set exposer 174 is connected by transport 186 to the select node of the third constituent select object 158.

The select object 140 can be inserted into a design diagram and a corresponding design database to implement a branch during a synthesis process. During the synthesis process, the block 140 causes the synthesis process (compiler) to invoke a conditional process associated with the block 140 that causes the synthesis process to process a branch operation. More specifically, a conditional process associated with select object 140 invokes for each of the three constituent select objects 154, 156 and 158, a conditional process of the general type described with reference to FIGS. B1-B3. The result will be a modification of the design database in which the select object 140 is connected to include the connection of only one of the data four input nodes 142, 144, 146 and 148 to the data output node 152. The other three data input nodes will not be connected. For example, referring to the illustrative drawing of FIG. C3, there is shown the connection of data input node 146 to data output node 152 through the addition of transports 188 and 190 to the design database. More specifically, in this example, data input node 146 is connected by the concatenation of transports 164, 188, 170, 190 and 172 to node 152. Moreover, it will be understood from the other sections of this disclosure that the ultimate result of the overall synthesis process will be the replacement of the multiple transport objects and nodes in the transport path between the data input node 146 and the data output node 152 by a single transport object (not shown). The processes that cooperate to reach this ultimate result are not a part of the select object per se and are explained in other portions of this disclosure. Furthermore, it will be appreciated that FIG. C3 shows just one of four possible outcomes of a conditional process associated with select object 140. One skilled in the art will appreciate that, depending on the value applied to select input node 150, any one of data input nodes 142, 144, 146 and 148 could be connected to data output node 152 in a similar manner by appropriate addition of transports to the design database.

A select input value applied to select input node 150 determines how the condition process will be resolved for each of the three constituent select objects 154, 156 and 158. A control process implemented as part of the synthesis process using another composite object (not shown) in the design database can be used to derive the value applied to select input node 150. In the example of FIGS. C1-C3, a branching algorithm associated with select object 140 can be represented in is straightforward terms as follows.

If value on input select node=00, then connect data input node 142 to the data output node 152 and do not connect data input nodes 144, 146 or 148;

If value on input select node=01, then connect data input node 144 to the data output node 152 and do not connect data input nodes 142, 146 or 148;

If value on input select node=10, then connect data input node 146 to the data output node 152 and do not connect data input nodes 142, 144, or 148;

If value on input select node=11, then connect data input node 148 to the data output node 152 and do not connect data input nodes 142, 144 or 146. In the above branching algorithm, the least significant bit on select input 150 controls the first and second constituent select objects 154 and 156. The most significant bit on select input node 150 controls the third constituent select object 158. A control process can be implemented by another object in the design database to derive the value on input select node 150.

As explained in other sections of this disclosure, the select value applied to select node 104 of FIGS. A1-A3 or to select node 126 of FIGS. B1-B3 or to select node 150 of FIGS. C1-C3 can be provided or derived based upon any number of parameters. These parameters might include one or more of the following in combination or individually: data set type, information rate, data set pattern, action latency, compute latency, etc. The object in the design diagram and in the design database that drives the control process uses the appropriate parameter(s) to arrive at a select input value.

In a present embodiment of the invention, the data input nodes and the output node of a select object are of a variant type. That is, the data input and data output nodes could be connected with other nodes of any type. This variant typing of the data input and output nodes makes the select object extremely versatile. A select object with more than one data input node can have transports with different data set types connected to different ones of its multiple data input nodes. A select object can be connected into a design diagram and a corresponding design database and can be used to effect conditional branching among different behaviors that process different types of data sets. However, ordinarily, the select input node will have a constant type value. Although the exact value of the constant provided on the select input node may be derived by another control object as explained above.

The basic select objects described above can serve as building blocks to create synthesis control structures for selective synthesis of behaviors in a design. In that regard, it will be appreciated that select objects like those of FIGS. A1-A3, B1-B3 and C1-C3 are merely representative. Select objects can be concatenated in many different combinations in order to implement more complex conditional branching. One implication of the ability to achieve conditional branching as part of a design synthesis process is the ability to implement selective synthesis in which behavior included in a design depends upon the outcome of conditional branching during the synthesis process.

Data Set Exposer and Data Set Collector Objects

In a present embodiment of the invention, variant objects decouple data sets from design topology. That is, a design topology can be constructed with variant objects without specifying how the topology will be implemented for any given data set. Thus, a design constructed with variant objects is type independent. Specifically, such design is data set type independent.

A data set exposer object is an object that symbolically references algorithms or processes for breaking down a data set into its constituents. A data set collector object symbolically references algorithms or processes for building up a data set from its constituent parts. The illustrative drawings of FIG. G1 represent several types of data set exposers and corresponding data set collectors according to a presently preferred embodiment of the invention. A current implementation of the invention can implement a design with any one or more of several different types of default data sets. The data sets include bit (1-bit), Dbit (2-bits), Nibble (4-bits), Byte (8-bits), Word (16-bits), Dword (32-bits) and Qword (64-bits). A respective explicit data set exposer object and a corresponding respective explicit data set collector object is provided for respective corresponding types of data sets. FIG. G1, illustrates data sets and corresponding explicit data set exposers and explicit data set collectors.

It will be appreciated that, although only a few different types of data sets are described herein, any type of data set can be defined (e.g., floating point type or integer type). A data set exposure and a data set collector can be constructed for any such defined data set. That is, respective algorithms for the respective exposer and collector objects can be respectively created for any such defined data sets.

The data set exposers and data set collectors of FIG. G1 are referred to herein as having explicit data set types because the data sets they operate on are explicitly defined. A Dbit type exposer object breaks down a Dbit type data set into two Bit type data sets. A corresponding Dbit type collector object builds a Dbit type data set from two Bit type data sets. A Nibble type exposer object breaks down a Nibble type data set into two Dbit type data sets. A corresponding Nibble type collector object builds a Nibble type data set from two Dbit type data sets. A Byte type exposer object breaks down a Byte type data set into two Nibble type data sets. A corresponding Byte type collector object builds a Byte type data set from two Nibble type data sets. A Word type exposer object breaks down a Word type data set into two Byte type data sets. A corresponding Word type collector object builds a Word type data set from two Byte type data sets. A Dword type exposer object breaks down a Dword type data set into two Word type data sets. A corresponding Dword type collector object builds a Dword type data set from two Word type data sets. A Qword type exposer object breaks down a Qword type data set into two Dword type data sets. A corresponding Qword type collector object builds a Qword type data set from two Dword type data sets.

A presently preferred embodiment of the invention also includes variant type data set exposer objects and variant type data set collector objects. They are referred to as variant type because they do not operate on any particular data set. Rather, in a current embodiment, a variant type data set exposer object references the above explicit data set type exposer objects. Similarly, a variant type data set collector object references the above explicit data set type collector objects. The illustrative drawing of FIG. G2 shows a portion of an object library in which a variant type data set exposer object references each of the explicit data set type exposer objects. Similarly, The illustrative drawing of FIG. G3 shows a portion of an object library in which a variant type data set collector object references each of the explicit data set type collector objects.

A variant data set exposer built into a design is resolved during a synthesis process in accordance when a data set is propagated to the input node of such a variant data set type exposer. Basically, when the input node of a variant type data set exposer object has a data set propagated to it, the flatten algorithm references the portion of the object library illustrated in FIG. G2. The flatten algorithm searches for an explicit data set type exposer object with an explicit data set type on its input node that matches the data set type that has been propagated to the variant type data set exposer during the propagate data sets process. If it finds a match, it inserts the matching explicit data set type exposer object into the design in place of the variant data set type exposer object.

Conversely, a variant data set collector built into a design is resolved during a synthesis process in accordance when data sets are propagated to the two input nodes of such a variant data set type collector. Basically, when the input nodes of a variant type data set collector object has a data set propagated to it, the flatten algorithm references the portion of the object library illustrated in FIG. G3. The flatten algorithm searches for an explicit data set type collector object with an explicit data set type on its two input nodes that matches the data set types that have been propagated to the variant type data set collector during the propagate data sets process. If it finds a match, it inserts the matching explicit data set type collector object into the design in place of the variant data set type collector object.

The role of an explicit data set exposer object inserted into a design is to reference a process or algorithm used during the synthesis process to break down a data set into its constituent data sets. For instance, when a Dbit type data set exposer object is inserted into a design it causes the synthesis process to reference an algorithm which breaks down the Dbit data set into two separate bit type data sets. One of the two bit type data sets is provided as an output on one of the Dbit type data set exposer's two output nodes. The other of the two bit type data sets is provided as an output on the other of the Dbit type data set exposer's two output nodes. Continuing with this example, with Bit type data sets defined on the output nodes of the Dbit data set exposer object, the propagate data sets process then can propagate the two Bit type data sets provided on the two output nodes to transport objects connected to those nodes.

The role of an explicit type data set collector object inserted into a design is analogous to that of an explicit type data set exposer object. An explicit type data set collector object references a process or algorithm used during the synthesis process to build up a data set into from its constituent data sets. For instance, when a Dbit type data set collector object is inserted into a design it causes the synthesis process to reference an algorithm which builds up the Dbit data set from two separate bit type data sets that have been propagated to its two input nodes. The Dbit type data set is provided as an output on the Dbit type data set collector's output node. Continuing with this example, with a Dbit type data set defined on the output node of the Dbit data set collector object, the propagate data sets process then can propagate the Dbit type data set provided on the output node to transport objects connected to that node.

It will be appreciated that the invention may be practiced without actually inserting an explicit exposer object or an explicit collector object into a design to replace a variant object. Rather, a resolution of a variant data set exposer object may involve a selection of a data set break-down process or algorithm that can be used to direct the data set propagation process. Similarly, resolution of a variant data set collector object may involve selection of a data set build-up process or algorithm that can be used to direct the data set propagation process. In essence, through respective break-down and build-up algorithms, a respective variant type data set exposer object and a respective variant type data set collector object direct the synthesis process in carrying out a data set type dependent propagation of data sets.

Type Dependent Instructions—Variant Data Set Type Exposer Object and Variant Data Set Type Collector Object From one perspective, a variant data set exposer object and the variant data set collector object are inserted into a design so as to cause a synthesis process in accordance with a present embodiment of the invention to reference one or more algorithms that direct the break-down and build-up of data sets. Ordinarily, they are inserted into a design as component objects of a compositor object. For instance, see the variant data set exposer object 510 and the variant data set collector 512 object of the variant invert object 502 of FIG. F3.

From another perspective, the variant data set exposer object and the variant data set collector object can serve to direct a synthesis process in the resolution of abstract type. A variant data set type behavior object has an abstract data set type. Such an object can be characterized as a data set type polymorphic behavior object. Its behavior exact varies according to data set type. For instance, each of the top-level invert object 500 and the variant invert object 502 of FIGS. F1-F3 has abstract data set type and is data set type polymorphic. Recall that during a synthesis process in accordance with a presently preferred embodiment of the invention, a variant data set type behavior object in a design is resolved into one or more explicit data set type behavior objects. See for example the discussion with reference to FIGS. F1-F8. In essence, a variant data set type exposer object directs the synthesis process during the resolution of a variant data set type behavior object into one or more explicit data set type behavior objects. In effect, a variant data set type exposer object serves as a synthesis (compiler) instruction that guides a synthesis process in the resolution of an abstract data set type into explicit data set type object.

Considering both of these perspectives, a variant data set type exposer object can be viewed as a synthesis (compiler) instruction that is built into (or at least associated with) a variant type data set behavior object (e.g., the invert behavior object 502 of FIG. F3) to direct the flatten and propagate data sets processes in the resolution of a variant data set type behavior object into one or more explicit data set type behavior objects. Moreover a variant data set type exposer object can be viewed as a data set type dependent synthesis (compiler) instruction. In that regard, it is an adaptive instruction. Specifically, the nature of the instruction depends upon the nature of the data set propagated to it. Thus, the variant data set type exposer object in essence is type dependent (compiler) instruction for resolving variant data set type behavior objects based upon data set type. Briefly stated, such variant exposer object is an instruction used to resolve data set type of a variant behavior object in accordance with data set type propagated to the variant exposer object.

To appreciate this perspective, consider that the flatten and propagate data sets processes iteratively resolve a variant data set type behavior object by incrementally breaking down a data set propagated to such object into its constituent data sets. One or more new instances of such variant data set type behavior object is inserted into the design in place of the instance of such behavior object that is being resolved. One or more constituent data set(s) is (are) propagated to each newly inserted instance of the behavior object that is being resolved. This iterative process continues until the inserted instances of the behavior object that are being resolved together with the constituent data sets propagated to their input nodes each match a behavior object in an object library. During this iterative resolution process it is the variant data set type exposer object built into the variant data set type behavior object that is being resolved in effect drives the incremental and iterative break-down of a data set into constituents. See for example FIGS. F5-F8. Thus, the variant data set type exposer object serves as an instruction that is built in to a variant data set type behavior object.

Moreover, during each successive iteration, the variant type data set exposer object causes the propagate data sets process to propagate a different constituent data set to each newly instantiated instance of the variant behavior object that is being resolved. For instance, during one iteration, a nibble data set (4-bit) might be broken down into two Dbit type data sets (2-bits each). During a next iteration, the two Dbit type data sets might be broken down into four bit type data sets (1-bit each). See for example FIGS. F5-F8. Thus, the variant data set type exposer object serves as a data set type dependent instruction.

One important role of a variant data set type collector object is to ensure that the process of resolving one variant data set type behavioral object in a design does not change the pattern of transport objects that propagate data sets from the perspective of other objects connected downstream in a design. More specifically, the process of resolving data set polymorphic behavior objects (such as the variant invert object 502 of FIG. F3) using a variant data set type data set exposer object may create a network of newly instantiated transport objects not originally present in the original design. In order to ensure that these new transports do not alter the connections to downstream objects in a design, one or more variant data set type collector objects are inserted into a design so that the number of output nodes after resolution of a variant data set type behavior object is the same as the number of nodes before resolution, regardless of how many instances of that (or another) behavior object are inserted into the design during the resolution process.

Consider that the variant data set type exposer object and the variant data set type collector object can be thought of as templates. They are akin to type dependent objects. Moreover, they serve as synthesis (compiler) instructions. That is, they are type dependent instructions. Since type that becomes associated with a given variant exposer object or with a given variant collector object depends upon the data set type propagated to it at synthesis time, they are both adaptive instructions.

Thus, in essences, the variant data set type collector object also serves as a data set type dependent instruction. Specifically, it is an instruction built in to a variant data set type object to direct the synthesis process to instantiate a network of transport objects that are associated with each other so that the number of output node connections from a variant data set type behavior object does not change due to the resolution of the object based upon propagated data set type. The instruction implemented through the variant data set type collector object is complementary to the instruction implemented through the variant data set type exposer object. The result of the operation of these complementary instructions is the insertion into a design of an ascending hierarchy of exposer objects and a complementary descending hierarchy of collector objects. See FIG. F8 for example. The result of the complementary action of these two instructions is that a network of transports inserted data set type resolution of one variant data set type behavior object does not affect the connections to other objects in the design that are upstream or downstream from the resolved object.

Transport Object

A transport object serves as an operator in The Axiom System that changes the location property of information atoms from the location of an input node of the transport object to locations of each output node of the transport object. In practice, in a synthesis process in accordance with the invention, a transport object operates to change the location property of a data set from the location of an input node of the transport object to the locations of each output node of the transport object. In a synthesis process of the present invention, a transport object initially has abstract or variant data set type when it is inserted into diagrammatic design. That is, it is not associated with any particular data set. However, the propagate data sets process will propagate an explicit type data set to the input node of such an abstract data set type transport object the during the synthesis process. In response to of such propagation, the input node of the transport object will copy the data set, and thereby be transformed to the data set type, that has been propagated to it. The transport object then will copy the data set, and therefore the data set type, to the output node of the transport object.

In order to effect the above change in location property, the transport object is associated with a process that copies a data set type on the input node of an instance of the transport object to the output node of that instance of the transport object. When a synthesis thread reaches the input node of an instance of a transport object, it references such process and thereby causes the copying or propagation of data set type from the input node of the transport object instance to each of its output nodes. An instance of a transport object may have multiple output nodes.

By changing the location property of a data set and its corresponding data set type, the transport object serves to define the flow of the synthesis process. As explained above, there are several threads of execution that run concurrently during the synthesis process. The results of the operation of one thread on a given node or object can subject that node or object to processing by yet another thread. For instance, a transport object, by propagating a data set from its input node to each of its output nodes, in effect, prompts or triggers the propagate data sets process to propagate the data set to an input node of an object connected to the transport object. The propagation of the data set to that node might, in turn, prompt or trigger the operation of the flatten process, which in turn, might prompt other threads of execution on other nodes.

Thus, a diagrammatic behavioral design can be assembled in which variant behavior objects are connected by abstract transport objects. The use of abstract transport objects permits the creation of a diagrammatic behavioral description of a design that is data set independent. The formats or data sets types of that flow through the diagram need not be defined in the behavioral description because abstract transport objects can propagate any data set type. However, in the course of the synthesis process, each abstract transport object will adopt or copy the data set type of the data set propagated to it. Thus, at the outset of the synthesis process, an abstract transport object serves to help direct the flow of the threads of execution of the synthesis process. However, as each abstract transport object changes the location property of the data set propagated to it, it is transformed into a transport object having explicit data set type. A transport having explicit data set type, in essence, describes the connections that will be required in the final synthesized design. In other words, the explicit transport objects serve to define the actual network of connections that will be required in the final synthesized design.

Cast Behavior Object

In a presently preferred embodiment of the invention, a cast behavior object is used to cast a given data set of one type to a data set of another type. By way of background, it is conventional to use a type operator to cast a type to a variable in other computer programming languages. Thus, strongly typed languages, such as the C programming language typically employ manner of type casts. By way of further background, prior logic or behavioral synthesis tools ordinarily represent the notion of transport of data or control information from one object in a design to another object in a design in terms of vectors and buses. Prior logic or behavioral synthesis tools typically do not represent the notion of transport of data and control in terms of abstract transport objects as in a present embodiment of the invention. Thus, although casting a type to a variable is well known, casting type to an abstract transport object is not known in prior logic or behavioral synthesis tools.

The role of the cast behavior object can be better appreciated with a better understanding of behavioral synthesis in accordance with a present embodiment of the invention. A current embodiment of the synthesis process employs abstract transport objects. That is, using the present synthesis process, a design may be constructed from library objects that include transport objects that are not associated with any particular data set. In other words, such transport objects have abstract type. Thus, a design may be created in which the notion of transport of data and control from one object to the next is represented in terms of abstract transport objects rather than in terms of vectors and buses.

An advantage of abstract transport objects is that a design can be constructed independent of data set type. Nevertheless, at some point, in order to actually use the design to create or specify a useful system, abstract transport objects (and other abstract behavior objects) in the design must have data set types cast to them. Thus, the use of abstract transport objects in a synthesis process in accordance with the present invention creates a need for a mechanism to cast a data set type to abstract transport objects. One mechanism for casting data set types to abstract transport objects (and to other abstract behavior objects) is the data set propagation process described elsewhere in this disclosure. Another mechanism for casting data set types to abstract transport objects is the cast behavior object described in the following paragraphs of this section.

A potential problem that could arise with abstract transport objects in a design that relies upon data set propagation to cast data set types to abstract transport objects is that the resulting casting of abstract transports could result in an inoperative design. For instance, consider a hypothetical add behavior object in a design that has two data input nodes connected to two different abstract transport objects. Suppose, for example, that during data set propagation, a byte type data set (eight bits wide) was cast to the transport object connected to one of the input nodes, and a word type data set (sixteen bits wide) was cast to the transport object connected to the other input node. How is the add object to perform an add behavior so as to arise at a sum value by adding a value represented by a byte data set to another value represented by a word data set? A problem would arise because these are not matching data sets.

In order to avoid this specific problem, a cast behavior object can be inserted into a design so as to cast the type of one abstract transport object to a type that matches that of another transport object. In a sense, a cast behavior object would function as a "symmetricalizer". It would ensure that two (or more) transport objects were cast to the same data set type. More generally, as explained below, a cast behavior object can be inserted into a design to cast an abstract transport behavior object to any desired type. In the above hypothetical example, the byte data set could be cast to a word data set, and a transport object that otherwise would have been cast to byte data set type, could be cast to word data set type. Thus, the transports on both input nodes of the add object would be word type and would match. The input nodes would have symmetrical inputs. The cast behavior object would have been used to "symmetricalize" the data set types on the input nodes. Thus, a cast behavior object can be used to ensure that casting of type, to behavior objects, during synthesis, through data set propagation, does not result in an inoperative design.

Example of Resolution of a Cast Behavior Object

Referring to the illustrative drawing of FIG. E1A, there is shown a representation of a top-level cast behavior object 490. The cast object includes a data set type input node 492, a data set input node 494 and a data set type output node 496. The overall behavior of a cast behavior object 490 is to cast a data set propagated to node 494 to the type of data set indicated on node 492. The overall behavior also includes providing on node 496, as an output, the data set on node 494 cast to the type on node 492. The type on node 492 may be obtained from a fixed value or it may determined based upon a data set type propagated within the design during synthesis process. That is, it may vary depending upon the nature of the data set type provided to it.

Referring to the illustrative drawing of FIG. E1B, there is shown a portion of an object library that pertains to cast behavior. The top-level cast object 490 references a next-level cast object 400. Both the cast objects 490, 400 are variant type. The top-level cast object 490 can be regarded as a parent object, and the next level object 400 can be regarded as a child object.

The operation of the cast object 490, 400 will be explained using an illustrative hypothetical example. Assume that the cast object 490 is inserted in a design. A user may insert the top-level cast object 490 into a design for any of the reasons stated in the previous section. Further, assume that a 16-bit data set type is indicated on node 492 and that a 4-bit data set is propagated to node 494. During the synthesis process, when all of the inputs nodes of the top-level cast object 490 have data set information propagated to them, the flatten algorithm will call the next level variant cast object 400 referenced by the top-level cast object 490.

The flatten algorithm will insert object 400 in the design in place of the top-level cast object 490. Node 408 of object 400 is connected to receive data set type information propagated to node 492 of object 490.

Node 412 of object 400 is connected to receive the data set propagated to node 494 of object 490. Node 416 of object 400 is connected to provide data set information other objects (not shown) in the design connected to node 496 of object 490. Thus, the data set type on node 408 is to be cast to the data set on node 412.

FIG. E1 shows details of the variant cast object. Briefly stated the variant cast behavior object 400 of a presently preferred embodiment of the invention first casts up to a known data set and then casts back down to a desired data set type. Referring to the illustrative drawing of FIG. E1, there are shown the constituent behavior objects of a cast behavior object 400. An output node of a castup behavior object 402 is connected to a data set-input node of a castdown behavior object 404 by transport object 406. Node 408 is connected to a type-input node of the castdown object 404 by transport object 410. Node 412 is connected to a data set input node of the castup object 402 by transport object 414. An output node of the castdown object 404 is connected to node 416 by transport object 418.

A variant form of the cast behavior object 400 is a top-level object that is recursively resolved during the synthesis process. The data set input node and the data set output node of the castup behavior object 402 is variant type. The type-input node, the data set input node and the data set output node of the castdown behavior object 404 are variant type. The behavior of the cast behavior object in any given design, therefore, is determined through the data set propagation process. That is, the exact nature of the casting depends upon the type value on node 408 and the data set on node 414.

More specifically, the variant form of the cast behavior object 400 comprises two other variant objects, namely a castup behavior object 402 and a castdown behavior object 404 each of which includes variant input nodes. The castup and castdown objects 402 and 404 serve as tokens, during the synthesis (compiler) process, causing the synthesis process (compiler) to reference corresponding detailed drill downs of these behaviors in the object library. The illustrative drawing of FIG. E2 shows a variant castup object 418 referenced using the castup object 402 of FIG. E1. The illustrative drawing of FIG. E3 shows a terminal leaf castup object 420 referenced using the castup object 402. The illustrative drawing of FIG. E4 shows a variant castdown object 422 referenced using the top-level castdown object 404 of FIG. E1. The illustrative drawing of FIG. E6 shows an explicit castdown object referenced by the castdown object 404.

FIG. E2 shows details of a variant castup drill down 418. Node 408-1 receives as input a data set type. An input node of data set type double and fill behavior object 424 is connected with node 408-1 by a branch of composite transport object 426. One input node of variant collector object 428 is connected to an output node of the data set type double and fill behavior object 424 by transport object 430. Another input node of variant collector object 428 is connected to node 408-1 by transport object 430. A variant input node of the castup behavior object 402 (the castup object 402 is self-referential) is connected to an output node of the variant collector object 428 by transport object 432. Node 434 is connected to an output node of castup object 402 by transport object 436.

The operation of the castup behavior object 402 during a synthesis process shall be explained through a hypothetical example in which the data set type on node 408 in a design is a nibble (4 bits wide). By way of overview, a present embodiment, the castup 402 behavior objects results in a casting of a data set type to a prescribed higher level data set type. In this example, assume that the higher-level data set type is a Quadword (Q-word) (64 bits wide).

The illustrative diagram of FIG. E5 pictorially represents in general terms the evolution of the castup behavior object during a synthesis process where the data set type on node 412, 412-1 in a design is nibble type (4 bits wide). In the course of the synthesis process, the variant castup behavior object 402 will be instantiated four times before it reaches its terminal leaf 420 illustrated in FIG. E3. The data set propagation process, discussed in detail elsewhere in this disclosure, will drive this instantiation process. In a present embodiment of the invention, a data set cannot be propagated beyond an object that has not been resolved to its terminal leaf (atomic form). Hence, it will be appreciated from FIG. E1, that the castup object 402 must be resolved to its terminal leaf in FIG. E3 before the castdown object 404 can be driven to resolution by the data set propagation process.

Referring to FIG. E5, the castup behavior object in its first instantiation 402-1 converts the 4-bit nibble data set to an 8 bit byte data set. A first instantiation of the variant collector object 428-1 is shown with two 4-bit data set type inputs and an 8-bit data set type output. Its second instantiation 402-2 converts the 8-bit byte data set type to a 16-bit word data set type. A second instantiation of the variant collector object 428-2 is shown with two 8-bit data set type inputs and a 16-bit data set type output. Its third instantiation 402-3 converts the 16-bit word data set type to a 32 bit Dword (Double word) data set type. A third instantiation of the variant collector object 428-3 is shown with two 16-bit data set type inputs and a 32-bit data set type output. Its fourth instantiation 402-4 converts the 32-bit Dword data set type to a 64 bit Qword (Quad word) data set type. A fourth instantiation of the variant collector object 428-4 is shown with two 32-bit data set type inputs and a 64-bit data set type output. Thus, the castup object 402, 418 evolves from an instantiation that receives a 4 bit data set input on node 412, 412-1 to an instantiation that receives a 32 bit input on input node 412, 412-1. In a final instantiation, a terminal leaf 420 receives a 64 bit data set type on node 412-2.

A fifth instantiation of the castup object 402 is the terminal leaf 420 shown in FIG. E3. The terminal leaf object 420 includes an input node 438 connected to an output node 440 by a transport object 442. Each of the input and output nodes and transport object is Qword data set type. The terminal leaf castup object 420 is the atomic version of the castup behavior in this example.

The following is a more detailed description of the behavior of the castup object drill down 418 of FIG. E2. It will be appreciated that each of the instantiations diagrammatically represented in FIG. E5 involve the castup drill down object 418. There is a different data set type on the input node 408-1 for each instantiation in the evolution of the castup object (i.e. 4 bit, followed by 8 bit, followed by 16 bit followed by 32 bit). Conversely, there is a different data set type on the output node of variant collector object 428 during each instantiation in the evolution of the castup object (i.e., 8 bit, followed by 16 bit, followed by 32 bit, followed by 64 bit). The collector object 428 evolves from 428-1 to 428-2 to 428-3 to 428-4 during successive instantiations of the castup object 418.

Continuing with the above example, assume that a 4 bit (nibble) data set type is propagated to (or is provided as a constant value data set type) to node 412 in FIG. E1. Transport object 414 transports (propagates) the 4 bit data set type to the input node of the castup object 402. Since the only input node of the castup object 402 is variant type and has a defined data set propagated to it (or otherwise defined), the synthesis process calls the flatten process to resolve the castup object 402.

It will be appreciated that the synthesis process regards the castup object 402 in FIG. E1 as a token that references an equivalent function in an object library. Referring to FIG. E9, there is shown a portion of the object library that pertains to the logical function. The top-level castup behavior object 402 references two lower level behavior objects 418 and 420. Object 418 is variant. Object 420 is explicit; it has a 64-bit data set type input node. In the present example, at this juncture of the synthesis process, the data set type on the input node of the castup object is 4-bit type. There is no match to the explicit object 420. Thus, the flatten algorithm calls the variant castup object 418 and inserts it into the design in place of the top-level castup object 402.

Once the castup object 418 has been inserted into the design, the 4-bit data set type on node 412 in FIG. E1 is propagated to node 412-1 in FIG. E2. The 4-bit data set type is propagated to composite transport object 426. The 4-bit data set type is propagated to the input node of data set type double and fill behavior object 424. The 4-bit data set type also is propagated to the least significant bit input node of the data set collector object 428.

Since the only input node of the of data set type double and fill behavior object 424 is variant type and has a defined data set propagated to it, the synthesis process calls the flatten process to resolve the data set type double and fill behavior object 424. The behavior of object 424 is to create a new data set of the same type (4-bit at this juncture of the data set propagation process). The object 424 assigns a constant value (a logical zero (0) value in a present embodiment) to each bit in the newly created data set. Object 424 outputs the newly created data set to the most significant bit input node of the collector object 428.

At this juncture of the propagation and flatten process, a 4-bit data set type with bit values XXXX is provided on the least significant bits node of the collector object 428. Also, at this juncture of the propagation and flatten process, a 4-bit data set type with constant bit values 0000 is provided on the most significant bits node of the collector object 428. Propagate data sets process causes the collector object 428 (actually 428-1 in FIG. E5) to output an 8-bit data set type on its output node. More specifically, the data set type is of the form 0000XXXX. The four most significant bits are constant values, zero in the preferred embodiment. The four least significant bits are variable, either logical 1 or logical 0.

Next, transport object 432 propagates the 8-bit data set to the input node of the castup object 402. Since the only input node of the castup object 402 is variant type and has a defined data set propagated to it (8-bit at this juncture of the process), the synthesis process again calls the flatten process to resolve the castup object 402. The same processing pattern repeats, this time with an 8-bit data set of the form 0000XXXX provided on input node 412-1. The result of this next iteration of the processing pattern is a 16-bit pattern of the form 00000000000XXXX propagated from the output node of collector object 428 (428-2 in FIG. E5). The 16-bit data set type is propagated by transport object 432 to the input node of the castup object 402. The synthesis process again calls the flatten process to resolve the castup object 402. The same processing pattern repeats, this time with the 16-bit data set.

As best illustrated in FIG. E5, this recursive-processing pattern repeats until there is an explicit match between the top-level castup object 402 and the terminal leaf object 420 of FIG. E3. The terminal leaf 420 is reached following four iterations of the recursive castup-processing pattern. The result at that juncture of the cast processing is the insertion of the terminal leaf object 420 of FIG. E3 into the design in place of the variant castup object 402 of FIG. E1. Moreover, the data set type on node 416-2 of terminal leaf object 420 has constant values (logical 0 in the preferred embodiment) in the leading (most significant) sixty (60) bit positions and has four (4) variable value XXXX bits in the four least significant bit positions. Thus, the result is a casting up of the 4-bit type data set to a 64-bit data set. Moreover, a 64-bit data set is created in which constant values (0's in the preferred embodiment) are packed into the 60 most significant bit locations, and the four least significant bit locations remain variable.

Referring again to FIG. E1, at this juncture in the synthesis process assume that transport object 406 has propagated the above-described 64-bit data set to the data set input node of the castdown behavior object 404. Furthermore, assume that in the example the data set type on node 408 is 16-bit (word) type and that the 16-bit type has been propagated by transport object 410 to the type input node of the castdown object 404. Thus, the cast of type is a cast of a 4-bit type data set (node 412) to input to a 16-bit type data set (node 408).

Thus, at this juncture in the synthesis process, the flatten algorithm is called. Remember that synthesis process regards the castdown object 404 as a token that references a lower level (drill down) behavior. In general, the flatten algorithm searches the object library for appropriate lower level objects to insert into a design for higher level objects for which a data set has been propagated to all input nodes. Assume that in this example, at this juncture of the data set propagation process, the flatten algorithm observes the data set types have propagated to each of the input nodes of the castdown object 404 in FIG. E1. The flatten process then searches the object library for an explicit match to a lower-level castdown object. Referring to the illustrative drawing of FIG. E7, there is shown a representation of the portion of an object library relating to the castdown behavior. The object library is hierarchical. A top-level castdown object 404 references both a variant castdown object 422 and an explicit cast down object 458. The variant type castdown object has variant type data sets on each of its nodes. Details of the variant type castdown object 422 are shown in FIG. E4. Details of the explicit castdown object 458 are shown in FIG. E6. The explicit castdown object 458 has a 64-bit data set type on each of its nodes.

The search is for a lower-level castdown logical behavior object that has the same explicit data set types on its input nodes that have been propagated to the input nodes of the castdown object 404 at the current juncture of the synthesis process. At his juncture in the synthesis process, the type-input node of castdown object 404 has a 16-bit data set type propagated to it. Also at his juncture in the synthesis process, the data set input node of the castdown object 404 has a 64-bit data set type propagated to it. Referring to the object library portion of FIG. E7, there is no castdown library object with an explicit match. That is, there is no castdown library object with an explicit 16-bit type input node and an explicit 64-bit data set input node. Thus, the synthesis engine selects the variant type castdown object 422 shown in FIG. E4 for insertion into the design in palace of the top-level castdown object in FIG. E1.

By way of overview, the resolution of the castdown object 404 in this example will result in the replacement in the example design of the object 404 in FIG. E1 with the collection of objects 478 shown in FIG. E8. During the resolution process, first data set exposer 480 is added to the design. Next, dataset exposer 482 is added to the design. Finally, transport object 484 is added to the design.

In this example, the overall purpose of the cast operation is to cast a 4-bit type data set back down to a 16-bit type data set. Remember, in this example, the castup object 402 in FIG. E1 causes the 4-bit data set propagated to node 412 of FIG. E1 to be cast up to 64-bit type. Also, remember that the input on node 408 in FIG. E1 is 16-bit data set type. Thus, the role of the castdown object in the design in this example is to cast down a 64-bit data to the 16-bit type data set.

By further way of overview, the portion of the data set propagation process that occurs with respect to the collection of objects 478 in FIG. E8 shall be explained. It will be appreciated that such data set propagation cannot occur until after the castdown object 404 of FIG. E1 has been resolved. However, the following explanation will give insight into the resolution process. During data set propagation, the 64-bit data set propagated by the castup object, which has been resolved to the terminal leaf object 420 of FIG. E3, is propagated to transport object 484. Recall that the leading 60 bits on the propagated In a final design, these lower four bits can carry the information of a data set provided on node 412 in FIG. E1. An input node of data set exposer 482 is connected to transport 484. A least significant bits output node of the data set exposer 482 is connected to an input node of data set exposer 480 by transport object 486. A most significant bits output of data set exposer 482 is unconnected. A least significant bits output node of the data set exposer 480 is connected to an transport object 488. A most significant bits output of data set exposer 480 is unconnected.

Thus, as the 64-bit data set is propagated through the collection of objects 478 of FIG. E8, it is cast down to a 16-bit data set type while retaining the 4 bits from input node 412 of FIG. E1 in the lower four bit positions. Specifically, data set exposer 482 propagates the lower 32 bits to transport object 486. Data set exposer propagates the lower 16 bits to transport object 488. The collection of objects 478 in FIG. E8 do not propagate the upper 48 bits (on transport 484).

Referring to FIG. E4, there are shown the constituent objects of the variant castdown object 422. It includes a type input node 408-1 that is to be connected in a design to receive information identifying a data set type to which another data set (that on node 454-1) type is to be cast to. Node 408-1 is connected to an input node of data set type double and fill behavior object 462 and to one input node of data set exposer object 464 by composite transport object 466. An output node of the of data set type double and fill behavior object 462 is connected to another input node of data set exposer object 464 by transport object 468. Input node 454-2 is connected by transport object 468 to a data set input of a castdown object 404. Input node 454-1 is to be connected in a design to receive a data set that has been castup by castup object 402 and now is to be cast back down to a desired data set type indicated on node 408-1. An output node of the data set exposer 464 to a data set type input node of the castdown object 404 by transport object 470. An output node of the castdown object in FIG. E4 is connected to an input node of data set exposer 472 by transport object 474. A least significant bit output node of data set exposer 472 is connected to node 456-1 by transport object 476. Most significant bit output node of data set exposer 472 is unconnected.

Referring to the illustrative drawing of FIG. E6, there are shown the constituent objects of the explicit castdown object 458. It includes three nodes 408-2, 454-2 and 456-2. Node 408-2 is an input node that is to be connected to receive the data set type that a data set is to be cast to. Node 454-2 is an input node that is to be connected to receives a data set that is to be cast to the type specified on node 408-2. Node 456-2 is an output node that is to be connected to propagate the resulting data set. Each node in FIG. E6 is defined as having a 64-bit data set type. A 64-bit data set type transport object 460 connects nodes 408-2 and 456-2. The type-input node 452 is left dangling. It will be appreciated that this dangling node 408-2 will result in the removal of all objects connected to it by the sourceless and sinkless (trimming) algorithm.

We now return to the resolution of the castdown object 404 to explain how the castdown object 404 of FIG. E1 is evolved into the collection of objects 478 in FIG. E8. Assume that at his juncture of the synthesis process, 16-bit data set type has been propagated to the type-input node of castdown object 404. Further assume that the 64-bit data set, that has been cast up by castup object 402, has been propagated to the data set input node of castdown object 404.

The flatten algorithm references the object library to find a castdown object that matches the data set types on the input nodes of the castdown object at this juncture of the synthesis process. The closest match is the variant castdown object 422, which is inserted into the design in place of the top-level castdown object 404. Specifically, node 408-1 of object 422 is connected to receive data set type propagated to the type node of object 404. Node 454-2 of object 422 is connected to receive a data set propagated to the data set node of object 404. Node 456-1 of object 422 is connected to provide an output data set to transport object 418.

It will be appreciated that at this juncture in the synthesis process, a first variant select object 480 is inserted in the design as part of the insertion of object 422 into the design.

Next, the data set information is propagated to the castdown object 422. The 16-bit data set types on node 408-1 is propagated by transport object 466 to an input node of data set type double and fill behavior object 462. The behavior of object 462 is to create a new data set of the same type (16-bit at this juncture of the data set propagation process). The object 462 assigns a constant value (a logical zero (0) value in a present embodiment) to each bit in the newly created data set. Object 462 outputs the newly created data set to the most significant bit input node of the collector object 464. Meanwhile the 16-bit data set type on node 408-1 also is propagated via transport object 466 to a least significant bits input node of data set collector object 428. The data set collector object 464 propagates a 32-bit data set to transport object 470.

At this juncture of the synthesis process, a 32-bit type data set has been propagated to the type-input node of the castdown object 404. Also, a 64-bit data set has been propagated to the data set input node of the castdown object 404. Thus, the flatten algorithm again searches the object library for the closest match. Referring to FIG. E7, there is no object in the object library for the castdown behavior that has an explicit 32-bit type input and an explicit 64-bit data set input. Thus, flatten algorithm again selects the variant castdown object 422 and inserts it in place of the top-level castdown object 404 in FIG. E4.

It will be appreciated that at this juncture in the synthesis process, a first variant select object 482 is inserted in the design as part of the insertion of castdown object 422 into the design.

Again, the data set information is propagated through the castdown object 422. This time, there is a 32-bit data set type on node 408-1 that is propagated by transport object 466 to an input node of data set type double and fill behavior object 462. The behavior of object 462 is to create a new data set of the same type (32-bit at this juncture of the data set propagation process). The object 462 assigns a constant value (a logical zero (0) value in a present embodiment) to each bit in the newly created data set. Meanwhile the 32-bit data set type on node 408-1 also is propagated via transport object 466 to a least significant bits input node of data set collector object 464. Object 462 outputs the newly created data set to the most significant bit input node of the collector object 464. The data set collector object 464 propagates a 64-bit data set to transport object 470.

At this juncture of the synthesis process, a 64-bit type data set has been propagated to the type-input node of the castdown object 404. Also, a 64-bit data set has been propagated to the data set input node of the castdown object 404. Thus, the flatten algorithm again searches the object library for the closest match. This time there is an explicit match to castdown object 458 in the object library portion of FIG. E7. In particular, castdown object 458 in the object library has an explicit match to a 64-bit type input and an explicit 64-bit data set input. Thus, this time the flatten algorithm selects the explicit castdown object 458 and inserts it in place of the top-level castdown object 404 in FIG. E4.

It will be appreciated that at this juncture in the synthesis process, the transport object 484 is inserted in the design as part of the insertion of castdown object 422 into the design.

Thus, in this example, in the course of the synthesis process the castup object 402 of FIG. E1 is resolved to the terminal leaf object of FIG. E3. The data set on node 494 in FIG. E1A first is cast up to a prescribed data set type. In this case, the prescribed data set type is 64-bit type. The 4-bits of the data set propagated to node 494 are in the lower four bit positions of the 64-bit data set. Moreover, the castdown object 404 of FIG. E1 is resolved into the collection of objects 478 in FIG. E8. The 64-bit data set propagated to the castup is propagated from transport object to the exposer object 482. The lower 32 bits are propagated from the exposer object 482 to exposer object 480. The lower 16 bits are propagated by exposer object 480 to transport object 488. Therefore, the 4-bit data set on node 494 of top-level object 490 of FIG. E1A has been cast to the 16-bit data set type on node 492 of object 492. The resulting data set is propagated on transport object 488 of FIG. E8 created as part of the resolution of top-level cast object 490.

The resolution of variant objects 424 and 462, variant data set exposers 480 and 482, variant collector 428 and variant exposers 464 and 472 into explicit type objects of the types discussed in this section will be appreciated from discussions herein and from the discussions elsewhere in this disclosure. Specifically, the flatten and the data propagation algorithm collaborate to resolve these variant objects in the course of the resolution of the cast object 490. The same general processes used to resolve the cast object 490 in general are used to resolve these objects in particular.

It will be appreciated that in a cast process in accordance with a presently preferred embodiment of the invention, a data set to be cast up to a desired data set type initially is cast up to a known data set type large enough data set to encompass the desired data set type. The data set then is cast down from the known data set type to the desired data set type.

Propagate Constants Process

The propagate constants process resolves atomic objects to which constants are connected. In a present embodiment, constant values are represented in binary format, i.e. logical 1 or logical 0. The propagate constants process operates by applying atomic object resolution rules to atomic objects that have constant value inputs during the constant propagation process. Basically, the object resolution rules perform the actual atomic operations specified by the atomic object according to the constant values applied to them. The schematic diagrams of FIGS. L5-L10 illustrate the atomic object resolution rules implemented by the propagate constants process of a current embodiment of the invention.

FIGS. L1-L2 show the atomic object resolution rules for an atomic INVERTER operator. In FIG. L1, if a logic 0 constant is provided to its input node then a transport object replaces the INVERTER with a logic 1 constant connected to its input node. In FIG. L2, if a logic 1 constant is provided to its input node then a transport object replaces the INVERT operator with a logic 0 constant connected to its input node.

FIGS. L3-L4 show the atomic object resolution rules for an atomic AND operator. In FIG. L3, if a logic 0 constant is provided to one of its input nodes then a transport object with a logic 0 constant connected to its input node replaces the AND operator. An output node of a transport object or the constant value, whichever is the case, connected to the other input node of the AND operator is left dangling. In FIG. L4, if a logic 1 constant is provided to one of the AND operator's input nodes then the AND operator is replaced with the transport object or constant value, whichever is the case, connected to its other input node. The logic 1 constant is left dangling.

FIGS. L5-L6 show the atomic object resolution rules for an atomic OR operator. In FIG. L5, if a logic 1 constant is provided to one of its input nodes then a transport object with a logic 1 constant connected to its input node replaces the OR operator. The transport object or constant value, whichever is the case, on the other input node is left dangling. In FIG. L6, if a logic 0 constant is provided to one of the OR object's input nodes then the OR operator is replaced with the output node of a transport object or constant value, whichever the case may be, connected to its other input node. The logic 0 constant value is left dangling.

FIGS. L7-L10 show the atomic object resolution rules for the Assignment operator. In FIG. L7, if a logic 0 constant is provided to the input node of an assignment operator, then the assignment operator is replaced with a transport object with a logic 0 constant connected to its input node. In FIG. L8, if a logic 1 constant is provided to the input node of an assignment operator, then the assignment operator is replaced with a transport object with a logic 1 constant connected to its input node. In FIGS. L9-10, if the clock input of a clocked assignment operator has either a logic 1 or a logic 0 constant value applied to it then that clocked assignment operator is replaced with two dangling nodes.

The illustrative block diagram drawings of FIGS. L11-L14 together with a reference to FIG. D3 shall be used to explain how the propagate transport process can be used to drive parameterized selective symbol substitution in accordance with a presently preferred embodiment of the invention. In other words, an explanation is provided for of the contribution by the propagate constants process to the resolution of a parameterized polymorphic object into an explicit object. FIGS. L11-L14, illustrate the combined operation of the propagate data sets process and the flatten process in reducing a variant polymorphic behavior object into its atomic elements. Once an object has been reduced to its atomic elements, then according to the propagate constants atomic object resolution rules, the atomic objects will be resolved in accordance with their atomic operations as explained in FIGS. L1-L13.

The propagate constants process contributes to the resolution of a parameterized variant behavior object by further transforming the atomic objects associated with a control portion of such parameterized object in accordance with the atomic object resolution rules. The application of these rules by the propagate constants process gives effect to an equivalent function associated with a control portion of such behavioral object in the context of the synthesis process itself. Instead of including the atomic objects derived from the resolution of a variant behavior object in the control portion in a netlist, the atomic objects in the control portion are used to produce values in the context of the synthesis process itself. These values are used to control the resolution of other portions of the parameterized polymorphic behavior object.

Briefly stated, in a current embodiment of the invention, a parameter that is used to parameterize a parameterized polymorphic behavior object can be propagated in a design using the propagate constants process. The constants propagated to resolve atomic objects of a control portion of the behavior object can produce one or more values that give effect to such a parameter. That is the values produced by the atomic object resolution rules are used to make selections among different possible resolutions of the polymorphic object in the context of the synthesis process itself. As explained in FIGS. D1-10 a select object can be driven by the values produced by the atomic resolution rules.

Referring to FIG. L11, there is shown the variant compare object of FIG. D3. As explained in another part of this disclosure, the variant compare object 250 is part of the control portion 280 of a parameterized polymorphic ADD behavior object 230. Information rate is the parameter controlling the selective synthesis of the ADD behavior object 230. The compare object 250 in FIGS. D3 and L11 has variant type input nodes A and B and has three bit-type output nodes A=B, A>B and A<B as shown. The variant type compare object in FIG. L11 is a top-level compare object. It references a next level variant type behavior compare object 250' illustrated in FIG. L12. The variant compare behavior object 250' includes two instances of top-level compare object 250, two variant type data set exposer objects 720 and three multiplexer behavior objects 722, 724 and 726 connected as shown. The top-level compare object 250 also references atomic level add object 250', four instances of which are shown in FIG. L14. The compare behavior of the variant compare object will be understood by those skilled in the art from the descriptions in this and other section of this disclosure and shall not be explained further.

Referring to FIG. D3, assume in this example that the information rate is represented by a 4-bit value that requires a 4-bit data set type. Assume also that two constants representing two information rates are provided on source nodes 264 and 266 in FIG. D3. Further assume that the 4-bit data set type is provided on each of nodes 264 and 266. As explained in other sections of this disclosure the information rate and the data set type on source nodes 264 and 266 can be acquired or copied from other nodes in the design database in the context of or during the synthesis process itself. In particular, attribute rules specified on nodes 264 and 266 can be used to acquire or copy such information into these nodes during the synthesis process itself. It will be appreciated that the acquisition of parameters used to resolve a parameterized polymorphic behavior object in the context of the synthesis process used to resolve the object is a powerful feature of the selective symbolic substitution process of the present invention.

Referring to FIGS. L11-L14, the propagate data sets and flatten processes first resolve object 250 shown in FIG. L11 into object 250' shown in FIG. L12. Next, the propagate data sets and flatten processes resolve the object 250' shown in FIG. L12 into object 250-1 shown in FIG. L13. Finally, the propagate data sets and flatten processes resolve object 250-1 shown in FIG. L13 into object 250-2 shown in FIG. L14. Object 250-2 includes four instances of the atomic level compare object 250".

Assume that 4-bit constant values (using logic 1 and logic 0) representing the information rates on nodes 264 and 266 are provided to the input nodes of the atomic level operators. That is two logic values (A0, B0) are provided as inputs to one instance of the atomic level compare object 250". Two logic values (A1, B1) are provided as inputs to another instance of the atomic level compare object 250". Two logic values (A2, B2) are provided as inputs to another instance of the atomic level compare object 250". Two logic values (A3, B3) are provided as inputs to another instance of the atomic level compare object 250".

In this example, now that these logic values are provided directly to atomic level objects, the propagate constants process will apply the atomic object resolution rules to resolve each of the atomic object, giving effect to their operations in the context of the synthesis process itself. The resulting values are used to drive the other behavior objects in the control portion 280 of FIG. D3, which in turn, controls selective synthesis of the parameterized polymorphic ADD behavior object 230.

Propagate Information Rate Process

The propagate information rate process propagates information rate information from an output node of one object to the input node of another object. For a given output node, the propagate information rate process involves first determining whether an information rate value associated with the given output node is "set", that is whether it has a value other than its default value. The propagate information rate process also determines whether or not an information rate value is set for the input node connected to the given output node. If the information rate value is set for the given output node but is not set for the connected to input node, then the propagate information rate process copies the information rate associated with the given output node to the connected to input node.

If the information rate value is not set for the given output node then the propagate information rate process attempts to generate an information rate from attribute information of the given output node. The attributes of the given output node may include attribute calculator information that may specify parameters and operations to be used to calculate the information rate. The attribute calculator also may include information about location of such parameters in the design database. Moreover, that location information may describe the location of the parameter information in terms of the relative locations of the given output node and another node of a composite object of which both nodes are members. The description of location information in relative terms is significant since it can serve to isolate the generation of information rate information from the details of any particular design. Rather the information rate generated for the given output node will depend upon the information rate, or other parameter, propagated to the other node in the relative location described in the attribute calculator. Thus, the generated information rate can be made to be context dependent. That is, the generated information rate can be made to depend upon whatever information rate (or other parameter deemed relevant) has been propagated to, generated by or otherwise is in possession of that other node in the relative location in the context of the synthesis process.

Briefly, the attribute calculator in a present embodiment of the invention is structured as follows.

Token, Token 2, Operator

An example of tokens is as follows.

N2.C

In the syntax of a present embodiment of the invention, the symbol # signifies a relative location being the next object up in the composite object of which the given output node is a member. The symbols ## signifies two objects higher up in the composite object of which the given output node is a member. N2 signifies the second node of the indicated higher level object. The symbol C represents a data set type.

An example attribute calculator information is as follows.

N2.C, ###N3.C, +

In the syntax of a present embodiment of the invention, the above attribute calculator information causes the addition of the information rate at node 2 to the information rate at node 3. Node 2 is located at an object two levels up in the composite object, and node 3 is located three levels up in the composite object.

It will be appreciated that numerous different operators can be employed such as select the greater of or select the lesser of or divide by or multiply be, etc. Moreover, it will be appreciated that the attribute calculator to generate information rate can use different parameters other than information rate. For instance, information rate might instead be calculated based upon the data set type propagated to another node in prescribed relative position.

Alternatively, an attribute calculator may result in the use of an information rate suited to a specific to a target hardware environment. For example, it may be known that the behavioral description is to be synthesized into a design targeted to a particular FPGA architecture. In that case, the attribute calculator may obtain information from the other node in the prescribed relative position indicating the target FPGA hardware and a particular information rate for that hardware. In that case, the information rate could be calculated, or assigned, based on the particular target hardware.

Continuing with the explanation of the generate information rate process, if an information rate is successfully generated for the given output node, then the propagate information rate process attempts to propagate the information rate as described above. On the other hand, if the information rate is not generated then no information rate is propagated by the given output node. For example, the information rate might not be generated because one or more other nodes in the prescribed relative positions may not yet have propagated to them the required information rate or other parameter.

Referring to FIG. D3, it will be appreciated that the output nodes of each of source objects 264 and 266 include a respective attribute calculator as part of its respective attributes. The attribute calculator of source object 264 identifies an output node of source object 256 as having the needed information rate information. The attribute calculator of source object 266 identifies an output node of source object 258 as having the needed information rate information.

Flatten Process and Select Equivalent Function Processes

The flatten process operates as follows. For a given composite object, if all inputs to all connected nodes are known (data set types and constant values) then flatten the object. That is, call the select equivalent function process which selects an appropriate equivalent object to be substituted into the design by the flatten process in place of the variant behavior object. Then substitute the selected object into the design in place of the given object.

The select equivalent function process makes a selection among one or more lower-level objects referenced by a given composite object that has prompted the call to the select equivalent function process. Each candidate for substitution must have an equivalent behavior as determined using The Axiom System discussed in another section of this disclosure. Once candidate objects have been identified, the select equivalent function process attempts to identify the best match between a candidate object and the given composite object. A scoring system is used to determine the object with the best match the composite object to be replaced. Factors such as closeness of data set type and closeness of information rate and closeness of action latency are examples of factors considered in the scoring system. The manner in which these factors are weighted against each other in the scoring system may be adjusted depending upon design goals.

FIGS. M1-M3 illustrate the process whereby the flatten process substitutes into a design a lower-level object in place of a given composite object. FIG. M1 shows an example of a hypothetical higher level composite object 740. FIG. M2 shows an example of a hypothetical lower level object 742 selected by the select equivalent function process as the best match to the higher level object 740. FIG. M3 shows the lower level object 724 substituted into the design in place of the higher level object 740. Note that transport objects 744 and 746 are connected to object 740 in FIG. M1, and transport objects 744 and 746 are connected to object 242 in FIG. M3.

The rules substitution process is summarized with reference to the example in FIGS. M1-M3 as follows. Remove the high level composite object 740 from the design. Identify transport objects 748, 750 on the lower level object 742 that are to be connected to other transport objects 744 and 746 of the design. Remove source and sink nodes 752, 754 from the identified transport objects. Connected the identified transport objects into the design. Add the remaining behavior of the lower level object to the design database, leaving dangling sources and sinks 756, 758 for transport objects 760, 762 that are not to be connected into the design. These dangling sources and sinks 760, 762 will be removed later by the remove sourceless and sinkless process.

Propagate Data Sets Process

The propagate data sets process operates as follows. For all objects, if the data set type of a given output node is known, i.e. it is not variant, and the given output node is connected to an input node of another object, and the data set type of the input node of the other object is variant, then copy the data set type of the given output node to the connected to input node. For transport objects, add the following. If the input node of the transport object is not variant, then copy the data set type of the input node to all output nodes of the transport object.

Remove Sourceless and Sinkless Objects Process

The remove sourceless and sinkless objects process operates as follows. Remove each unconnected sink object that is not at a top level of the design hierarchy. A top-level sink may in fact terminate in the user interface and should not be removed. For instance it might be connected to supply information to a user interface graphical control element such as a meter, graph or display. Such top-level objects are labeled as such in a current implementation of the invention. Also, remove each unconnected source object. For sink objects, follow each transport connected to such unconnected sink object (nodes are doubly linked to each other) to determine whether the transport has output effects on any other objects in the design. If it does not, then remove the transport object. For unconnected source objects, remove the transport object connected thereto and all of its output nodes. If the removal of a transport object leaves another object in the design unconnected (other than the unconnected source object of course) then remove the other object as well.

Compress Transports Process

The compress transports process operates as follows. If an output node of one transport object is connected to the input node of another transport object then compress the two transport objects into a single transport object. Remember that a transport object can have more than one output node. The compress transports process is helps to remove redundant transport objects from the design database. It will be appreciated that such redundant transport objects can result from the flatten process, for example.

Note that the transport junction of FIG. 15 does not indicate the existence of multiple transport objects. Rather, it is a mechanism used in the graphical user interface environment of a current embodiment of the invention to more clearly depict the branching within a single transport object.

Generate Constants Process

The generate constants process operates as follows. A source node must originally propagate a constant value. Assume that the source node of FIG. N1 has acquired the value 9. For instance, the value 9 might signify an information rate. The value 9 may have been acquired as part of the propagate information rate process through the action of an attribute calculator. In any case, in this example, the generate constants process constructs the hierarchy of collector objects shown in FIG. N2. Basically, the individual logic values representative of the value 9 (1001 is 9 in base two) are provided to a descending hierarchy of collector objects that terminate in a transport object having an explicit data set type, 4-bit type, in this example.

Referring to FIGS. L11-L14, assume that respective output transport objects are connected to the respective input A and B nodes of object 250. Moreover, assume that each respective transport object corresponds to transport object 782 of FIG. N2 and is part of respective descending hierarchy of collector objects identical to those that in FIG. N2, but with different constant values applied to the input nodes of the collector objects. (That is assume that source object in essence is in the position akin to that of either source node 264 or 266 of FIG. D3.) Continuing with the example, it will be appreciated that the 4-bit type data sets will be propagated to the input nodes A and B of object 250 of FIG. L11, resulting in the resolution of the object 250 in FIG. L11 into the object 250-2 of FIG. L14 according to the processing described above.

At the end of the processing in FIGS. L11-L14, a respective descending hierarchy like that in FIG. N2 will be connected to each of the two exposer objects 720 in FIG. L13. Note the symmetry between the descending hierarchy of collector objects in FIG. N2 and the ascending hierarchy of exposer objects in FIG. L13. They are symmetrical data structures.

Remove Exposer and Collector Objects

The remove exposer and collector process operates as follows. If a transport object connects directly to both a collector object and an exposer object, and the collector object and the exposer object are symmetrical (i.e. same data set types), then replace the collector object and the exposer object with transport objects that connect the respective input transport objects and output transport objects of the respective removed collector and exposer objects. Repeat the process.

In the event that the input nodes of the collector objects are connected to constant values, the process can result in the removal of all collector and exposer objects leaving only constant values connected to transport objects. It will be appreciated that this process can be used to connect constant values on nodes 264 and 266 of FIG. D3 to the input nodes of the atomic objects 250" of FIG. L14. Note that consistent with the operation of the remove exposers and collectors process, the exposers shown in FIG. L13 are removed in FIG. L14, and constant values A0A1A2A3 and B0B1B2B3 are applied directly to the input nodes of the atomic operators.

FIGS. O1-O3 illustrate the operation of the remove collector and exposer objects process. FIG. O1 shows the original object structure that includes collector objects C1, C2, and C3 and exposer objects E1, E2 and E3. FIG. O2 shows the removal of collector object C3 and exposer object E1 and the connection of collector object C1 to exposer object E2. FIG. O2 also shows the connection of collector object C2 to exposer object E3. FIG. O3 shows the removal of all remaining collector and exposer objects and the connection of the constant values directly to the four remaining transport objects.

It will be appreciated that the remove collector and exposer objects process also can be used to simplify portions of the design that do not have constant values propagated to them. For instance, referring to the illustrative drawings of FIG. F8, the exposers and collectors in this portion of a design possibly could be removed by the remove collector and exposer object process. The result would be a much-simplified netlist.

Polymorphic Objects

In accordance with an aspect of the present invention, Polymorphic objects have been constructed that rely upon conditional branching using a select object to selectively synthesize a behavior in any of multiple implementations. Furthermore, polymorphic objects have been constructed in which the outcome of the conditional branching depends upon processing of one or more parameters through a control process implemented by a constituent control object. Specifically, polymorphic objects have been constructed which include or reference constituent objects that can be used to implement the same behavior in multiple different ways depending upon one or more parameters. Moreover, polymorphic objects have been constructed in which the object itself includes or references select objects to achieve conditional branching. Such polymorphic objects have been constructed in which the object itself includes or references constituent control objects to process one or more parameters so as to produce one or more select values to control the outcome of the branching, and therefore, to control the selective synthesis.

Polymorphic objects in accordance with a present embodiment of the invention present to a user the ability to specify a behavior at a very high level of abstraction and to rely upon the synthesis process to selectively synthesize the actual way in which that behavior is implemented. Basically, the synthesis process uses one or more select objects and one or more control objects built into (or referenced by) a polymorphic object to determine which implementation of a behavior to select. Such select objects and control objects, in essence, operate as compiler instructions built in to (or referenced by) the polymorphic object. More specifically, parameters provided to the one or more constituent control objects during the synthesis process are processed as part of the synthesis process to determine which implementation to select. Thus, by incorporating a polymorphic object into a design a user essentially automatically incorporates the synthesis (or compiler) instructions used to determine how to actually selectively synthesize the object.

Polymorphic ADD Example

A present embodiment of the invention includes a polymorphic ADD object. The polymorphic ADD is used to select between equivalent behavior topologies to perform a function, i.e., the ADD function. A present embodiment of the polymorphic ADD can be used to select between a serial add behavior topology and a parallel add behavior topology which are described below. The polymorphic ADD object can drive a selective synthesis process in accordance with the present invention to include within a design database either a serial add object or a parallel add object depending upon parameters tested in the course of the selective synthesis process. Each of these two different add objects (serial and parallel) represent the same function: they add together values provided to them. Thus, the polymorphic ADD permits the performance of the same function using different topology behaviors.

In object oriented programming terms, the polymorphic ADD object 200 can be viewed as the ADD class. The serial add object and the parallel add object can be viewed as two instances of the ADD class. The ADD object 200 is at the top of an ADD behavior object hierarchy. The serial add object and the parallel add object are child objects of the top-level object 200. The processes whereby the top-level ADD behavior object is transformed into either a serial add object or a parallel add object is called selective synthesis. The ADD class and its instances exist as library objects accessible through a computer user interface. Library objects are connected together with transports in order to create a design diagram and to build a corresponding design database. In the present embodiment, the moniker, "ADD" as denotes the ADD class of behavior.

The ability to selectively synthesize one or another behavior topology can be advantageous in trading of processing speed and process resources consumed. For instance, a parallel add topology may process more quickly than a serial add topology. However, a parallel add topology may consume far more processing resources than a serial add topology. The polymorphic ADD object can be constructed with a constituent control object that causes a selective synthesis process to choose between parallel and serial add behavior topologies based on prescribed parameters so as to optimize the speed versus resources tradeoff.

Referring to the illustrative drawing of FIG. D1, there is shown a top-level polymorphic ADD object 200 that can be included within a design diagram in accordance with a presently preferred embodiment of the invention. A corresponding top-level polymorphic ADD object is included within a design database when the polymorphic ADD object 200 is included within a design diagram. The design diagram is representative of corresponding behavior objects in the design database. The polymorphic ADD object 200 includes five input nodes and two output nodes. The five input nodes (from top to bottom) can be connected to receive the information and have data set types described in the following table.

| Polymorphic ADD Input Nodes | |
| --- | --- |
| Carry-in | bit |
| Value A | variant |
| Value B | variant |
| Load | bit |
| Clock | bit |

The two output nodes (from top to bottom) can be connected to provide the information and have the data set type described in the following table.

| Polymorphic ADD Output Nodes | |
| --- | --- |
| Sum Value | Variant |
| Carry-out | bit |

The top-level polymorphic ADD object when inserted in a design database serves as a token used by the synthesis process to reference the next level polymorphic ADD object located in the object library. The next level polymorphic ADD object includes or references the constituent objects combined to implement the polymorphic ADD object in an actual design database. During the synthesis process, the next level polymorphic ADD is referenced to selectively synthesize either the serial or the parallel add behavior topology. The following paragraphs describe the selective synthesis using a polymorphic ADD as an example.

Selective synthesis takes place during the synthesis process itself. In a present embodiment of the invention, a precursor to the actual performance of the synthesis process is the construction of a design diagram in a graphical user interface environment. The construction of the design diagram causes the creation of a design database in which behavior objects corresponding to behavior objects in the design diagram are connected together in the same way as the corresponding design diagram objects are interconnected with each other in the design diagram. Moreover, the synthesis process of the present embodiment of the invention proceeds through a propagation of information from object to object in the design. This propagation is achieved through the use of transport objects whose role is to propagate information between objects. Thus, before the polymorphic ADD object 200 can be used in selective synthesis, it is connected by transports to one or more other objects in a design database. Selective synthesis occurs when appropriate information is propagated to the polymorphic ADD object so as to trigger the selection of either a serial add topology or a parallel add topology within the design (database and diagram).

Referring to the illustrative drawing of FIG. D2, there is shown the polymorphic ADD object connected with transports that can cause the propagation of information to and from the polymorphic ADD object during the synthesis process. It will be appreciated that the transports may be connected to other behavior objects in the design, but these other objects are not shown so as to simplify the description of the polymorphic ADD and selective synthesis. The point is that, during synthesis process, the transports interconnected with the polymorphic ADD object 200 can propagate information to and from the object 200. The information propagated to the polymorphic ADD object 200 triggers the selective synthesis resulting in selection of a serial add topology or a parallel add topology.

As shown in FIG. D2, transport 202 connects node 204 with the Carry-in node of object 200. Transport 206 interconnects node 208 with the Value A node of the object 200. Transport 206 interconnects node 208 with the Value A node of the object 200. Transport 210 interconnects node 212 with the Value B node of the object 200. Transport 214 interconnects node 216 with the Load node of the object 200. Transport 218 interconnects node 220 with the Load node of the object 200. Transport 222 interconnects node 224 with the Sum Value node of the object 200. Transport 226 interconnects node 228 with the Carry-out node of the object 200.

Now, assume for the purposes of this example that the object 200 and the transports connected to it are connected to other objects (not shown) and that the synthesis process is in progress. Further, assume that information has been propagated from the other objects (not shown) to nodes 204, 208, 212, 216 and 220. Specifically, assume that these nodes have the following data set types propagated to them. Node 204 has a bit type data set type propagated to it. Node 208 has a byte type data set type propagated to it. Node 212 has a byte type data set type propagated to it. Node 216 has a bit type data set type propagated to it. Node 220 has a bit type data set type propagated to it.

Assume that, at this point in the propagation process, the synthesis process finds that it has reached an object, object 200, with variant type input nodes (Value A and Value B). The synthesis process cannot propagate data set information from one node to another unless those two nodes possess the same data set type. Hence, data set propagation cannot continue from node 208 to the Value A node and from node 212 to the Value B node. The data set types of the Value A and the Value B nodes must be brought into alignment with those of nodes 208 and 212 before data set propagation can continue. The manner in which the synthesis process brings the nodes into alignment is to reference the next level polymorphic ADD object shown in FIG. D3 so and to insert that object into the design database in place of the top-level ADD object 200. We call this flattening the hierarchy.

The illustrative drawing of FIG. D3 shows a next level polymorphic ADD behavior object 230. Object 230 is both data set polymorphic and "other parameter" polymorphic. In this example, the other parameter is information rate. However, it will be appreciated that the other parameter can be any parameter that can be related to nodes in the database, e.g., information rate, information rate pattern, data set, etc. It is data set polymorphic because it has variant input nodes. It is information rate polymorphic because the it is resolvable into either a serial add behavior object topology or a parallel add behavior object topology based upon the processing of information rate information by a composite control object associated with the object 230. Data set polymorphism is the subject of another section and shall not be discussed in this section. Information rate polymorphism shall be discussed in detail in the following paragraphs of this section.

The next level polymorphic ADD behavior object 230 includes a serial add behavior object 232 and a parallel add behavior object 234. It will be appreciated that the polymorphic ADD object 230, the serial add behavior object 232 and the parallel add behavior object 234 all are logical equivalents. That is, each achieves the same function. However, as best-illustrated in FIGS. D9 and D10, the topologies of the serial add object and the parallel add object are quite different. As explained in detail below, the synthesis process can use the polymorphic ADD object 230 to select between a serial add topology 232 and a parallel add topology 234 based upon one or more prescribed parameters. In this example, the parameter is information rate.

Referring to FIG. D3, each of the serial and parallel behavior objects is variant type since each has a variant type on at least one node. Object 230 includes seven select objects 236, 238, 240, 242, 244, 246 and 248. Each of the select objects is variant select object since each has a variant variable type on at least one node. Object 230 includes comparator objects 250 and 252. Object 230 includes source nodes 254, 256, 258, 260, 262, 264, 266 and 268. Object 230 includes sink nodes 270 and 272. Object 230 also includes numerous transport objects that connect the other constituent objects as shown. For instance, transport 274 connects source node 254 with the carry-in input node of the serial add behavior object and the carry-in input node of the parallel add object 234. Similarly, for example the composite transport object 276 connects the A>B output node of comparator 252 with the select input nodes of each of (variant) select objects 236, 238, 240, 242, 244 and 246. The composite transport object 278, for example, connects the source node 256 with the A Value input node of select object 236 and with the B Value input node of select object 240. Transport object 275 connects the output node of select object 236 to the Value A input node of serial add object 232. Transport object 277 connects the output node of select object 238 to the Value B input node of serial add object 232. Transport object 279 connects source node 258 with the Value A input node of select object 238 and with the Value B input node of select object 242. Transport object 281 connects the output node of select object 240 to the Value A input node of parallel add object 234. Transport object 283 connects the output node of select object 242 to the Value B input node of parallel add object 234. The connections made by the other constituent transport objects can be gleaned from the drawings.

The synthesis process inserts the polymorphic ADD behavioral object 230 into the design in place of the top-level polymorphic ADD behavior object 200. From FIGS. D2 and D3, it will be appreciated that source node 254 is connected to transport object 202. Source node 256 is connected to transport object 206. Source node 258 is connected to transport object 210. Source node 260 is connected to transport object 214. Source node 262 is connected to transport object 218. Sink node 270 is connected to transport object 222. Sink node 272 is connected to transport object 228.

The next level polymorphic ADD behavior object is a composite object in that it comprises other objects. These constituent objects cooperate to selectively synthesize either a serial add topology by causing selection of serial add object 232 or a parallel add topology by causing selection of parallel add object 234. The (variant) select objects 236, 238, 240, 242, 244, and 246 are connected to transports so that that through selective synthesis, they can provide alternative data paths. One alternative realized through selective synthesis results in transport objects that connect serial add object 232 with the source nodes 254, 256, 258, 260 and 262 and with the sink nodes 270 and 272. Another alternative realized through selective synthesis results in transport objects that connect parallel add object 234 with the source nodes 254, 256, 258 260 and 262 and with the sink nodes 270 and 272. Thus, the select objects 236, 238, 240, 242, 244, and 246 are employed to implement a branching function during the selective synthesis process.

The dashed lines labeled 280 delineate a portion of the next level polymorphic ADD behavior object used during selective synthesis to control the selection between the parallel and serial add objects 232 and 234. In this example, constant type parameters are provided on source nodes 264 and 266. The comparator 250, (variant) select object 248, source node 268 and comparator 252 process the parameters. A bit type output is provided on the A>B node of comparator 252. The bit type output is propagated by composite transport object 276 to the select inputs of (variant) select objects 236, 238, 240, 242, 244, and 246.

The evolution of the polymorphic ADD behavior object 230 during selective synthesis now will be described. At some point soon after the next level polymorphic ADD object 230 has been inserted into the design by the synthesis process, data set propagation will occur. Referring to FIG. D2, assume that the data set type on nodes 204, 216 and 220 is bit type. Assume that the data set type on nodes 208 and 212 is byte type. In that case, at some intermediate juncture of the data set propagation process data set propagation will result in the data set type on source nodes 254, 260 and 262 and on the clock and load input nodes of the serial and parallel add objects 232 and 234 being bit type. At that juncture, data set propagation will result in the data set type on source nodes 256 and 258 becoming byte type. At that juncture, data set propagation will result in the type on source nodes 264 and 266 being constant type. At that juncture, data set propagation will result in the data set type on Value A and Value B nodes of each of the (variant) select objects becoming byte type. The data set type on each of the select input nodes of each of the (variant) select objects is bit type. The data set type on the source node 268 is and remains constant type. At that juncture, data set propagation will result in the data set type on the Value A and Value B input nodes of the serial add and parallel add objects 232 and 234 remaining variant type for the time being. At that juncture, data set propagation will result in the data set on the Dout (Sum Value) and S (Sum value) output nodes of the serial and parallel add objects 232 and 234 remaining variant type for the time being. At that juncture, data set propagation will result in the data set of the carry-out nodes of the serial and parallel add objects 232 and 234 remaining bit type. The data set type on the output node of comparator 252 remains bit type. At that juncture, data set propagation will result in the data set types on the sink nodes 270 and 272 remains variant type.

At or about the juncture of the propagate data process described above, the synthesis process will identify the (variant) select objects 236, 238, 240 and 242 in the data propagation path. A select object is not "flattened" like other objects in a data propagation path by calling a lower level object in an object library and inserting the lower level object into a design in place of a higher level object. Rather, a select object is resolved through a control process that results in a select value that is provided to a select input node of the select object. In this example, the control process is implemented by synthesis process using the objects within dashed lines 280. Basically, the objects within dashed lines 280 collectively function as a control object that controls the selection of which add object 232 or 234 to connect and which add object 232 or 234 to leave unconnected. In essence, the collective control object 280 instructs the synthesis process (or compiler) how to resolve the alternative possible transport object connections described above.

In this example, a select value is propagated to each of the select objects via transport object 276. The select value determines which of the alternative connections will be created using the process (or algorithm) associated with the select objects. The select value must be derived. In this example, the select value is derived through a control process in which the information rates of the source nodes 256 and 258 are parameters. Briefly stated, the control process in this example first identifies the larger of the information rate on source nodes 256 and 258. The control process then compares the larger information rate with a predetermined information rate on source node 268. The comparison results in a constant value that is propagated to transport object 276 and that also is propagated to the select input nodes of each of the (variant) select objects. Once this value has been provide, an algorithm of the general type described above, can be used by the synthesis process to achieve one or the other of the alternative connections described above so as to select either the serial or the parallel add object 232 or 234.

In this example, the synthesis process uses a Propagate Constants process to calculate or to otherwise determine the select input value to be propagated on transport object 276 based upon the information rates on source nodes 264 and 266. During the Propagate Constants process, a constant value that has been propagated to an object is processed in accordance with the behavior of the object so as to compute a resulting value. The resulting value then can be propagated to another object to be processed in accordance with its behavior, etc.

More specifically, in this example, selective synthesis depends upon information rate of the data on source nodes 256 and 258. Source node 264 receives as its input a constant value, namely the information rate value on source node 256. Source node 266 receives as its input a constant value, namely the information rate on source node 258. Pursuant to the Propagate Constants process, these two values are propagated via transport objects 284 and 286 to the input nodes of comparator 250. In accordance with the behavior of comparator object 250, if the information rate on source nodes 256, 264 is less than the information rate on source nodes 258, 266 then the value propagated to transport object 282 is logical 1. Otherwise, the value propagated to transport object 282 is logical 0. Pursuant to the Propagate Constants process, the information rate values on source nodes 264 and 266 also are propagated via transport objects 288 and 290 to the data A input node and to the data B input node of the (variant) select object 248. The constant value propagated to transport object 282 is propagated to the select input node of select object 248. If the value propagated to the select input node is logical 1, then, in accordance with the select object algorithm associated with the select object 248, a transport object (not shown) is inserted into the design so as to connect the source node 266 to the data A input node of comparator 252 via transport object 292. On the other hand, if the value propagated to the select input node is logical 0 then, in accordance with the, a transport object (not shown) is inserted into the design so as to connect the source node 264 to the data A input node of comparator 252 via transport object 292. Thus, the larger of the information rates on source node 256 and source node 258 is propagated to the Value A input node of comparator 252. A constant value is provided on source node 268. In this example, the constant value on source node 268 also represents an information rate. Pursuant to the Propagate Constants process, the constant value on node 268 is propagated to the data B input node via transport object 294. Pursuant to the Propagate Constants process, the comparator 252 compares the information rate value on data A input node with the information rate value on its data B input node. If the information rate on the data A node is greater than the information rate on the data B input node then the output on the A>B node is logical 1. Otherwise, the output on A>B is logical 0.

Referring to the illustrative drawing of FIG. D4 there is shown a further evolution of the design as the selective synthesis process progresses through the polymorphic ADD object 230. It will be appreciated that the synthesis process actually involves multiple recursive descent algorithms that operate roughly in parallel and somewhat independently of each other. In addition to the data set propagation algorithm, the flatten algorithm and the propagate constants algorithm, there is a sourceless and sinkless removal algorithm that removes from the design (trims away) objects that have source or sink nodes that are not connected.

FIG. D4 shows an intermediate state of object 230 in the course of the synthesis process after comparator 250 has finished its comparison during the constant propagation process and after resolution of the select object 248 has caused an addition of a transport object 293. The added transport object 293 connects the source node 264 with the data A node of comparator 252. Also, the resolution of select object 248 leaves transport object 290 unconnected and, therefore, also leaves source node 266 unconnected. In FIG. D4, the sourceless and sinkless (trimming) algorithm has removed from object 230, source node 266, comparator 250, variant select 248 and transport objects 286, 290 and 282 because the resolution of select object 248 leaves source node 266 unconnected.

FIG. D5 shows another intermediate state of object 230 in the course of the synthesis process after the comparator 252 has finished its comparison during the constant propagation process and after the sinkless and sourceless (trimming) algorithm has processed some more. Assume that in this example, the information rate on source node 264 is greater than the information rate on source node 266 (comparison by comparator 250). Also, assume that the information rate on source node 264 is greater than the information rate represented by the constant value on source node 268 (comparison by comparator 252). With these assumptions, pursuant to the constant propagation process, the comparator 252 produces a logical 1 value on its A>B node. In FIG. D5, the sourceless and sinkless (trimming) algorithm has removed from object 230 source nodes 264 and 268, transport objects 288, 293, 294 and 292, and comparator 252 because source nodes 264 and 268 are unconnected. Since the value produced by the comparator 252 is logical 1, a logical 1 value is provided on a source node of transport 276 after the removal of the comparator 252 by the sourceless and sinkless (trimming) algorithm.

FIG. D6 shows another intermediate state of object 230 in the course of the synthesis process after the constant propagation process has processed some more and after the sinkless and sourceless (trimming) algorithm has processed some more. The propagate constants algorithm has propagated the logical value 1 via transport object 276 (which has been removed in FIG. D6) to the select input node of each of the (variant) select objects 236, 238, 240, 242, 244 and 246. With the propagation of the logical 1 value at the select input node of the select objects, the select objects now have the information necessary on each input for the synthesis process to proceed with resolution of the select objects. Specifically, each of the select objects has a value propagated to its select input node.

Thus, in FIG. D6, the synthesis process has run a branching algorithm responsive to the (select) value (logical 1 in this example) produced by the control process (implemented with the objects in dashed lines 280 in FIG. D3 in this example). In accordance with a branching algorithm employed in this example, a logical 1 select value propagated to the select input node of a select object causes the creation of a transport object between the Value B input node and the output node. The value A input node of the select object is left unconnected. Referring to FIG. D6, the branching algorithm has resulted in the addition of a new transport object 296 to the design to connect transport objects 278 and 281. Also, the branching algorithm has resulted in the addition of a new transport object 298 to the design to connect transport objects 279 and 283. The branching algorithm has left transport object 278 unconnected to transport object 275. Also, the branching algorithm has left transport object 279 unconnected to transport object 277.

In a present embodiment of the invention, the synthesis process recognizes that a select object is used to implement branching of the synthesis process itself. In a current embodiment, the synthesis process does not attempt to "flatten" the select object to discern any next level behavior object associated with it. The role of the select object is to provide a branching function to the synthesis process, not to reference a behavior topology. Once a select object have performed its branching function, the select object is no longer required as part of the design and can be removed.

Referring again to FIG. D6, The branching algorithm has been run for each of the select objects 236, 238, 240, 242, 244 and 246. The branching algorithm result for select object 236 is that transport object 278 which is connected to the Value A input node is left unconnected to transport object 275 which is connected to the output node of select object 236. The branching algorithm result for select object 238 is that transport object 279 which is connected to the Value A input node is left unconnected to transport object 277 which is connected to the output node of select object 238. The branching algorithm result for select object 240 (shown in FIG. D3) is that a new transport object 296 is added to the design that connects transport object 278 and transport object 281. The branching algorithm result for select object 242 (shown in FIG. D3) is that a new transport object 298 is added to the design that connects transport object 279 and transport object 283. The branching algorithm result for select object 244 (shown in FIG. D3) is that a new transport object 300 is added to the design that connects transport object 291 and transport object 293. A further branching algorithm result for the select object 244 is that transport object 285 which is connected to the Value A input node is left unconnected to transport object 293 which is connected to the output node of select object 244. The branching algorithm result for select object 246 (shown in FIG. D3) is that a new transport object 302 is added to the design that connects transport object 289 and transport object 295. A further branching algorithm result for the select object 246 is that transport object 287 which is connected to the Value A input node is left unconnected to transport object 295 which is connected to the output node of select object 246.

In FIG. D6, select objects 240, 242, 244 and 246 are not shown because they have been removed from the design. The synthesis process has caused them to be replaced in the design (diagram and database) by the transport objects (composite transports in this case) that result from the branching algorithm. Select objects 236 and 238 are shown in FIG. D6. Note the absence of transport objects connecting an input node to an output node in the select objects 236 and 238. The synthesis process interprets an absence of a transport connection as an unconnected source and unconnected sink. The sinkless and sourceless (trimming) process causes the removal of dangling objects as described below. In FIG. D6, the sourceless and sinkless (trimming) algorithm already has caused the removal of transport object 276 since the select value (logical 1 in this example) already has been propagated to the select input nodes of the select objects.

FIG. D7 shows another intermediate state of object 230 in the course of the synthesis process after the sinkless and sourceless (trimming) algorithm has processed some more. Briefly, the sinkless portion of the sinkless and sourceless algorithm works backwards through the design. That it is it processes the design in a direction opposite to the direction of information flow in the design. Basically, it seeks out sink nodes that are not connected, and it removes the objects that have no connected sink nodes. In other words, if an object has no sink node connected to another downstream (in the normal propagation direction through a design) object in the design, then the object is removed. The theory behind this sinkless removal process is that if an object has no sink node that contributes to downstream processing then the objet is superfluous and can be removed. Pursuant to the sinkless removal process, the serial add object 232 has been removed since it has dangling sinks, transports objects 285 and 287. Further, pursuant to the sinkless removal process, the transport objects 285,287, 275, 277, 299 and 301 connected to the removed serial add object 232 also have been removed. Note that the removal of transport objects 299 and 301 leaves source nodes 260 and 262 dangling.

FIG. D8 shows another intermediate state in the evolution of object 230 in the course of the synthesis process. The sinkless and sourceless (trimming) algorithm has processed some more. The compress transport algorithm has removed unnecessary junctions in the transport objects of FIG. D7.

Specifically, the sinkless algorithm portion has removed sources 260 and 262 since they do not connect with any downstream object. Also, the transport object branches of composite transports 278 and 279 that had been connected to select objects 236 and 238 had been removed since they had been left with dangling sinks (see FIG. D7). Note how the sinkless algorithm portion has progressed in a direction that can be described as upstream or opposite to the direction of information (e.g., data set) propagation in the design. First, the serial add object 232 and all (transport) objects connected to it were (see FIGS. D6 and D7) removed since the serial add object 232 was not connected to any downstream object. Next, the sinkless algorithm portion moved upstream in the design to the two source nodes 260 and 262 which have been left sinkless due to the removal of the serial add object and its transports. These source nodes 260 and 262 are removed from the design because they have become sinkless due to the progression of the sinkless algorithm itself. Note also the recursive nature of the sinkless algorithm portion. It searches for sinkless objects (e.g., serial add object 232) and removes them. Then it recourses to seek objects (e.g., source nodes 260 and 262) that may have become sinkless due to the earlier removal of other sinkless objects.

Moreover in FIG. D8, transport objects 304, 306, 308, 310 and 312 have been created in the design to replace the various composite transport objects that had existed before. For instance, transport object 306 replaces the composite transport object comprising transport objects 278, 296 and 281 (see FIG. D7). It will be appreciated that the consolidation of composite transport objects into one (or more) simpler objects by the compress transports process removes unnecessary and perhaps redundant transport objects from the design.

Recall that the source nodes 256 and 258 both have byte type data sets on them. The source node 254 has a bit type data set. In a presently preferred embodiment of the invention, a parallel add behavior object 234 has variant type Value A and Value B input nodes and a bit type Carry-in node. At the stage of the synthesis process illustrated in FIG. D8, the synthesis process calls the propagate data set process which causes the byte type data set to propagate from source nodes 256 and 258 to the Value A and Value B nodes of the serial add object 234. It will be appreciated that a variant type node can have a data set of any other type propagated to it. After the propagation of the byte type data set from the source nodes 256 and 258, the Value A and Value B nodes of the serial add object 234 also have a byte type data set on them.

The parallel add object 234 of FIG. D8 is a top-level parallel add object. As such, the synthesis process regards it as a token used to reference a next level parallel add object 310 shown in FIG. D9. Specifically, upon completion of the propagation of data sets to the input nodes of the parallel add object 234, the synthesis process calls the flatten process. (TRUE?) The next level parallel add object 310 illustrated in FIG. D9 is inserted into the design in place of the top level parallel add object 234. The next level parallel add object 310 is a self-referential object that includes: source nodes 318, 320, and 322, sink nodes 324 and 326, variant exposers 312 and 314, a variant data set collector 316, parallel add objects 328 and 330 (self-references) and various transport objects. The synthesis process employs a recursive flatten process described elsewhere in this disclosure to resolve the parallel add object 310.

For the sake of completeness, FIG. D10 provides an illustration of a next level serial add object 330. The serial add object 232 of FIG. D3 is a top-level serial add object. As such, the synthesis process regards it as a token used to reference a next level serial add object 330 shown in FIG. D10. If the propagate constants process had resulted in production of a logical 0 value by comparator 252, then the synthesis process would have resolved the polymorphic ADD object 230 down to the top-level serial add object 232 and its associated transport objects, sources and sinks. The top-level serial add object 232 references the next level object 330 of FIG. D10. We will not go into depth concerning the next level serial add object 310. We note, however, that it includes variant shift-in objects 332 and 334, a top-level parallel add object 336, a variant multiplexer 338, an assign object 340 (memory), a variant shift-out object 342 and a variant type object 344. As explained above, the synthesis uses a recursive flatten process described elsewhere in this disclosure to resolve the serial add object 330.

One advantage of behavior objects in general is that it facilitates optimized synthesis in which tradeoffs are made between different parameters. For example, in system design, the tradeoff between hardware resources and speed often is a factor in deciding what topology to use to realize a desired behavior. Polymorphic behavior objects can be used to optimize the synthesis process based upon a tradeoff between different parameters such as hardware resources and speed. For instance, using the polymorphic ADD object behavior again as just one example, one illustrative hardware substrate or platform in which an add behavior can be implemented is a Vertex field programmable gate array (FPGA), produced by Xilinx, Inc. of San Jose, Calif. By way of comparison, a 128 bit wide add can be implemented as either a serial add or as a parallel add. It is believed that a 128 bit wide serial add topology would require approximately five combinational logic blocks (CLBs) of the FPGA and would require one clock cycle per bit to perform the add (i.e., 128 clock cycles). In contrast, it is believed that a 128 bit wide parallel add topology would require approximately one hundred and twenty-eight CLBs and would require only one clock cycle for all one hundred and twenty-eight bits. The serial add topology requires fewer hardware resources but is slower. The parallel add topology requires more hardware resources but is faster. Thus, there is an obvious hardware resources versus speed tradeoff. A synthesis process in accordance with a present embodiment of the invention can employ a polymorphic object behavior (the add behavior is just one example.) to automatically and selectively synthesize object behavior topologies based upon parameters such as information rate, data set type or information rate pattern, for example.

Code reuse is another advantage of polymorphic behavior objects. For instance, a given polymorphic behavior object can be used to achieve the same logical function (e.g., add, multiply, shift, divide, cast, etc.) in different designs. A synthesis process in accordance with the present invention can selectively synthesize logically equivalent objects in each design to achieve the desired function. However, the topologies of the logically equivalent objects may differ from one design to the next. The given polymorphic object includes (or references) the controls used by the synthesis process to determine what topology to selectively synthesize in any given design to achieve the equivalent function consistent with the parameters specified for that design.

Example of Propagate and Flatten Processes Used to Resolve Data Set Polymorphic Variant Object This section provides data set polymorphic variant behavior object. By data set polymorphic it is meant that the resolution of the object in the course of the synthesis process is data set dependent. The resolution is different for different data sets. Although the variant invert behavior object is the focus of this example, the principles explained in this section apply to other data set polymorphic variant behavior objects as well. This example will show a behavior object that effects a pattern of behavior that references another object. In particular, the variant form of the invert behavior object effects a pattern of behavior that is references another object. More specifically, the variant form of the invert behavior object effects a pattern of behavior that is self-referential. That is, the behavior defined for a variant invert object references the variant invert object itself.

This section also will illustrate that the propagate data process and the flatten algorithm are mutually dependent. As one variant invert object after another is instantiated due to the flatten process, the data set propagation process responds by propagating data sets from a previously instantiated variant invert object to a more recently instantiated variant invert object. Conversely, as one instantiated variant invert object after another has data sets propagated to it due to the propagate data process, the flatten algorithm responds by instantiating another invert object each time a data set has been propagated to all input nodes of an invert object referenced in a previously instantiated variant invert object.

This section also demonstrates the use of the propagate data set and the flatten functions to "solve" the hardware needed to solve a logical problem for a given data set. The invert function is a fundamental logic function. It converts a logical 1 to a logical 0. Conversely, it converts a logical 0 to a logical 1. This section demonstrates the manner in which the recursive flatten and propagate data processes cooperate to build a composite structure to implement the invert function for a given data set. At the end of the propagate data and flatten processes, the resulting structure comprises basic objects that can be used to implement the invert function for a given data set.

FIG. F1 is an illustrative drawing of a portion of an object library pertaining to the invert equivalent function. This portion of the object library includes a top-level invert object 500, a variant invert object 502 and an atomic invert object 504. The top-level invert object 500 references both the variant invert object 502 and the atomic invert object 504.

FIG. F2 shows a representation of the top-level invert function 500. It includes a data set input node 506 and a data set output node 508. The top-level invert object 500 is variant type. It can be inserted into a design to effect the invert function.

FIG. F3 shows an illustrative diagram representing the variant invert object 502. It includes a data set exposer object 510 and a data set collector object 512. It also includes two variant invert objects 500. The input node of the exposer 510 is variant type. Abstract transport object 514 connects one output node of the exposer object 510 to an input node of one variant inverter object 500. Abstract transport object 516 connects another output node of the exposer object 510 to an input node of another variant inverter object 500. Abstract transport object 520 connects another output node of one invert object 500 to another input node of the collector object 512. All nodes of the variant object 502 are variant type.

FIG. F4 shows an illustrative diagram of the atomic invert object. It includes an atomic invert object. Transport 524 interconnects anode of source object to an input of the atomic invert object. Transport 528 interconnects a node of sink object 530 to an output of the atomic invert object 522. All nodes of the atomic object 522 are bit type.

FIGS. F5-F8 show illustrative diagrams of the evolution of an invert object in a design in response to the propagation of a nibble (4-bit) data set to its input node. FIG. 5 shows a portion of a design in which a top-level or parent-level invert object 500 has been inserted. The invert object 500 includes a input node 506 and an output node 508. In this example, for the sake of simplicity, only a few other objects in an overall design are shown. Specifically, transport object 532 connects a source 534 to the input node 506, and transport object 536 connects the output node 508 to sink object 538. Transport object 532 is disposed upstream in the design from top-level invert object 500. Transport object 536 is disposed downstream in the design from top-level invert object 500. For completeness, the nodes 540 and 542 of transport object 532 are shown, and the nodes 544 and 546 of transport object 536 are shown. Also, the node 548 of source object 534 is shown, and the node 550 of sink object 538 is shown.

Assume in this example, that in the course of the synthesis process the propagate data sets process propagates a nibble type data set (i.e., 4-bits) to the input node 506 of the invert object 500 of FIG. F5. At this juncture of the synthesis process, the synthesis process will determine that all nodes of the invert object 500 have data sets defined for (propagated to) them. It also will determine that the invert object 500 is a variant type object. The flatten algorithm uses the invert object 500 to find other equivalent functions that are candidates to be inserted into the design in place of object 500.

More particularly, in a present embodiment of the invention, a name is associated with the invert object 500. Specifically, the name "invert." The flatten algorithm uses this name to find the portion of the object library shown in FIG. F1. The invert object 500 references the variant invert object 502 and the atomic invert object 504. Note that in a current embodiment, object naming is used to denote equivalency of function. Each of these objects is an equivalent function of the other. Therefore, each shares the invert name.

The flatten algorithm determines whether there is an explicit match between an invert object in library portion of FIG. F1 and the data set propagation status of the invert object 500 in FIG. F5. That is, the flatten algorithm determines whether there is an invert object in the object library with an explicit nibble type data set on its input node. There is not. Thus, the flatten algorithm selects the variant invert object 502 from the library for insertion into the design in place of object 500.

FIG. F6 shows the resulting insertion of the variant invert object 502 into the design. An input node of variant exposer object 510 is connected to a node 542 of transport 532. An output node of collector object 512 is connected to a node 544 of transport object 536. Note that from the perspective of other objects in the design, the data set propagation pattern is unchanged following insertion of the variant invert object into FIG. F6. That is, in FIGS. F5 and F6, before and after the insertion, transport object 532 propagated a 4-bit type data set to a single input node of the object connected to it. Also, in FIGS. F5 and F6, before and after the insertion, transport object 538 was connected to receive a data set propagated to it from another object. Thus, the pattern of processing effected by the top-level invert object 500 in FIG. F5 and the variant invert object in FIG. F6 is unchanged from the perspective of other objects in the design.

At this juncture of the synthesis process, the variant invert object 502 has been inserted in place of invert object 500, and the nibble data set has been propagated to the input node of the data set exposer object 510 of the variant invert object 502. The flatten algorithm again searches the object library, this time for an explicit match to the data set exposer object 510 of FIG. F6. Assume that in this example the object library has an explicit match to a data set exposer object (not shown) with a nibble (4-bit) input node and two Dbit (2-bit) output nodes. The flatten algorithm inserts that explicitly matching exposer object into the design in place of the variant exposer object 510. For the sake of simplicity, this data set exposer insertion is not shown in FIG. F6. The insertion of another data set exposer object is indicated in FIGS. F6 F7 by labeling the inserted exposer object with reference numeral 510'.

At this juncture of the synthesis process, the propagate data process propagates the 4-bit data set type through data set exposer object 510' which outputs a 2-bit type data set type on each of its two output nodes. The two respective 2-bit data set types are propagated to respective transport objects 514' and 516' and then to the respective input nodes of the two top-level objects 500. The respective transport objects are labeled 514' and 516' to indicate that the abstract transport objects 514 and 516 of the variant invert object 502 have been resolved, through the propagate data sets process, to 2-bit data set type transport objects. Still referring to FIG. F6, at this stage of the synthesis process, the propagate data sets process has propagated 2-bit data sets to the input nodes of the two invert objects 500 of FIG. F6.

It will be appreciated from the following discussion that the embedding of a variant object inside another object creates a conditional branch in the process of synthesizing a design that includes the embedding object. Specifically, note the implications of the self-referential nature of the variant invert object 502. More generally, note the implications of a reference within one object to another variant object (whether the reference is self-referential or not). In particular, variant invert object 502 in FIGS. F3 and F6 references the top-level variant invert object 500 of FIG. F2. As shown in FIG. F1, the top-level object 500 in turn references the variant invert object 502. Moreover, as will be appreciated from the discussion of FIG. F7, this self-reference creates an opportunity for the flatten process to select among the multiple invert objects 502 and 504 the object library portion of FIG. F1. Thus, references within one object (variant invert object 502 in this case) to another variant object (top-level invert object 500 in this case) create an opportunity for the synthesis process to branch among different synthesis alternatives (between the insertion of object 502 or 504 into the design in this case). In effect, this is a conditional branch opportunity. One condition of the branch is the type of data set propagated to the one or more (one in this case) input nodes of the referenced variant object (object 500 in this case) embedded in another object (object 502 in this case). Another condition of the branch is the nature of the equivalent function objects in the object library referenced by the referenced object (object 500 in this case).

At this stage of the synthesis process in which 2-bit type data sets are propagated to the respective input node of the two variant invert objects 500, the flatten algorithm again references the object library portion illustrated in FIG. F1. This time it searches for an explicit match between an object with the invert equivalent function behavior and an explicit 2-bit type data set on its input node. There is no match. Therefore, as shown in FIG. F7, the flatten algorithm causes a respective instance of the variant invert object 502 to be inserted into the design in place of each in stance of the top-level invert object 500 in FIG. F6. Thus, at this juncture of the synthesis process, two instances of the variant invert object 502 are located in the design between transport objects 532 and 536.

It will be appreciated from FIG. F7 that from the perspective of other objects in the design, the data set propagation pattern is unchanged following insertion of the two instances of the variant invert object 502 into the design of FIG. F6. That is, in FIGS. F6 and F7, before and after the insertion, transport object 532 is connected to propagate a 4-bit type data set to a single input node of the object connected to it. Also, in FIGS. F6 and F7, before and after the insertions, transport object 538 is connected to receive a data set propagated to it from another object. Furthermore, in FIGS. F6 and F7, before and after the insertions, each of transport objects 514' and 516' propagated a 2-bit type data set to respective objects connected to them. Thus, the pattern of processing effected by the top-level invert object 500 in FIG. F5 and the variant invert object in FIG. F6 and the two variant invert objects of FIG. F7 is unchanged from the perspective of other objects in the design.

The flatten process operates in the manner described above to insert two instances of an explicit data set exposer object 510" shown in FIG. F7 in place of the two instances of the variant data set exposer object 510 of the variant invert object of FIG. F3. Next, the data sets propagation process operates to respectively propagate the 2-bit type data set on each of the respective output nodes of the two data set exposers 510". The two instances of data set exposer 510" provide on their respective output nodes respective 1-bit type data sets. The propagate data sets process propagates the four respective 1-bit type data sets to the respective transport objects 514" and 516". It will be appreciated that abstract transports 514 and 516 of the respective instances of the variant invert object 502 have been transformed into transport objects 514" and 516" suited to propagate a 1-bit type data set. This transformation is achieved by the cooperation of the propagate data sets and flatten processes.

Note that at this juncture of the synthesis process, the design includes three instances of abstract transport object 518 and three instances of abstract transport object 520. It also includes three instances of variant collector object 512. These objects will not be resolved into explicit type objects until after the instances of the top-level invert object 500 have been resolved.

Next, the propagate data sets process propagates the four respective 1-bit type data sets to the four respective instances of the top-level invert object 500 shown in FIG. F7. Since a 1-byte type data set has been propagated to the input nodes of each of the four instances of the top-level invert object 500, the flatten algorithm searches for an equivalent function object with an explicit 1-bit type data set on its input node. Specifically, the flatten algorithm searches the object library portion illustrated in FIG. F1 for a match. This time there is an explicit match. The atomic invert object matches. It has a 1-bit type data set on its input node, and it has an equivalent function. Therefore, as shown in FIG. F8, the atomic invert object 504 is inserted into the design in place of the top-level invert function 500.

It will be appreciated that this time the synthesis process has branched to select an explicit data set type object (i.e., atomic invert object 504) rather than a variant type object (i.e., variant invert object 502). The selected explicit 1-bit type data set atomic invert object shares an equivalent function with the top-level invert object as indicated by its association with the top-level invert object 500 indicated in FIG. F1. It also has an explicit type data set (1-bit type) that matches the data set type propagated to the top-level invert object referenced in the design at this stage of the synthesis process.

At this juncture of the synthesis process, the top-level invert object 500 of FIG. F5 has been resolved into the four atomic invert objects of FIG. F8. Referring to FIGS. F7 and F8, the propagate data sets process respectively propagates the 1-bit type data set through the four respective atomic invert objects 504. The propagate data sets and flatten processes cooperate to respectively transform the four respective abstract transports 518 (two of them) and 520 (two of them), shown in FIG. F7, connected to the output nodes of the four respective top-level invert objects 500 into four respective transport objects 518" (two of them) and 520" (two of them), shown in FIG. F8, connected to the output nodes of four respective atomic invert objects 504. Each of transport objects 518" and 520" is suited to transport a 1-bit type data set. Similarly, the propagate data process and flatten process cooperate to respectively transform the respective two variant data set collector objects 512 in FIG. F7 into two respective explicit data set collector objects 512" in FIG. F8 suited to receive a 1-bit type data set on each of its two input nodes. Similarly, respective transport objects 518 and 520 connected between variant data set collector objects in FIG. F7 are transformed into respective transport objects 518' and 520' in FIG. F8 suited to transport 2-bit type data set. Finally, variant data set collector object 512 connected to transport object 536 in FIG. F7 is resolved into an explicit data set collector objects 512' in FIG. F8 suited to receive a 2-bit type data set on each of its two input nodes.

Thus, the variant type top-level invert object 500 of FIG. F5 has been resolved into four atomic invert objects 504 in FIG. F8.

Note that the pattern of processing from the perspective of other objects in the design (transport objects 532 and 536 in this example) remains unchanged. This is the case even though each atomic invert object 504 in FIG. F8 can receive and propagate only a 1-bit type data set, whereas a 4-bit type data set is propagated to the top-level variant object in FIG. F5. That is, transport object 532 propagates a 4-bit type data set to a single node in FIG. F5 and in FIG. F8. Transport object 536 still is connected to a single node in FIG. F5 and in FIG. F8.

Also note that the resolution process involved several levels of conditional branching at different stages of the data set propagation and flatten processes. The conditional branching was dependent upon the nature of the data set propagated to a referenced variant object at these stages. The nature of the propagated data sets changed (evolved) from one stage to the next. Thus, the variant invert object 502 and the top-level invert object 500 that references it (and that it references in turn) are data set polymorphic. Their resolution during at different stages of the synthesis process is dependent upon the nature of the data set(s) propagated at such different stages.

Also note that a network of explicit transport objects in FIG. F8 has been automatically created or evolved into existence so as to match the data set propagated by transport object 532 to the input node 506 of the top-level variant invert object 500 of FIG. F5. More specifically, the synthesis process creates transport objects to match data set requirements that can be specified (or changed) after a design has been constructed. That is, a design is constructed using variant objects. Later, one or more data sets are propagated through the design to resolve the variant objects. During the resolution process, transport objects are created (or evolved) to match the resolved variant objects.

Computational Polymorphic Objects

In one aspect, the present invention provides a computational polymorphic object. A computational polymorphic object is one that can be synthesized in accordance with one or more computations. More particularly, a computational polymorphic object includes a control portion that performs a computation using one or more parameters, which may have been generated or propagated to it during a synthesis process, to produce control information that directs the synthesis of the polymorphic object.

FIGS. P1-P7 shall be used to provide a hypothetical example of such a computational polymorphic object. The hypothetical polymorphic object performs an add behavior. The add behavior adds data sets propagated to input A to data sets propagated to input B. The polymorphism of this add object permits the object to be synthesized differently to achieve varying degrees of parallelism depending upon data set type propagated to input nodes A and B, information rates propagated to input nodes A and B and information rate capacity of the target hardware system of the synthesis process.

Referring to FIGS. P1 and P2, there are shown examples of a one bit serial add and a two bit serial add. The purpose of the drawings of FIGS. P1 and P2 is to illustrate different degrees of parallelism in a serial add function.

FIG. P3 shows a hypothetical computational polymorphic add object 800. Object 800 includes a variant data set type parallel add object 802, shift-in objects 804 and 806 and a shift-out object 808. The shift-in objects 804 and 806 and the shift-out object 808 respectively shift in and shift out a number of bits of data at a time that is dependent upon data set type. The object 800 also includes a control portion 810 shown within dashed lines. The function of objects 812 and 814 of control portion 810 are the same as those of corresponding objects shown in FIG. D3. The divider object 816 performs a computational function resulting in a constant value. Specifically, it divides the selected information rate provided by object 814 into the maximum information rate of the system, a constant value provided by source node 819. Selector object 818 produces a data set type signal based upon the result of the divide computation. Note that multiple data set signals are provided on source nodes 822 as possible data set type selections. The selected data set type is provided to the type input nodes of the shift-in objects 804 and 806 to determine how many bits at a time they shall shift in to the add object 802. The selected data set type also is provided to the type input node of the shift-out objects 808 to determine how many bits at a time it shall shift out.

Inside each of the respective Shift-in objects 804 and 806 and inside the shift-out object 808 is a shift-by-type object that is part of an object hierarchy illustrated in FIGS. P4-P7. FIG. P4 illustrates the topology of a variant type data set shift-by-type object. FIG. P5 shows a topology of a terminal leaf of the variant shift-by-type object. It includes an RCR (rotate through carry right) object, also known as arithmetic shift right. FIG. P6 illustrates the topology of a variant type data set RCR object. FIG. P7 illustrates the topology of a terminal leaf RCR object.

Of course, the overall synthesis of object 800 involves much more that will be understood by those skilled in the art from explanations in other sections of this disclosure. Nevertheless, it will be appreciated that during the synthesis process in accordance with the invention, a shift-by-type object will be synthesized in accordance with the selection by selector 818. Of course the selector 818 selects based upon a computation by object 816. Thus, the resolution of add object 800 depends upon a computation performed by a control portion 810 of the add object itself. The resolution of the input and output shift-by-type objects, in turn, influences the overall synthesis of the polymorphic add object hypothetical computatorial.

Information Rate Pattern Polymorphism

The amount of buffering that is required between two components of a system may depend on the information rate pattern and the comparative ability of the two components to operate at different information rates. There are numerous approaches to categorizing information rate patters. Here are a few examples: continuous, block continuous, block scaling, variable, variable scaling, complex (FFT or DCT) and indeterminate. Thus, information rate parameter can be an important parameter for use in a synthesis process. For instance, it can be important in deciding the depth and width of a FIFO circuit. It will be appreciated that information rate pattern is available as a synthesis parameter in a current embodiment of the invention.

Underloading

There have been shortcomings in object oriented programming techniques that impact the ability to modify an already complex class object hierarchy. Specifically, as an object class hierarchy becomes more complex, it becomes more difficult to add additional levels of abstraction to the hierarchy. Basically, the need to maintain consistency with objects previously built into the hierarchy limits the ability to alter abstractions at higher levels in the hierarchy.

Variant objects in accordance with the present invention create the ability to more easily add new abstraction to even the most complex object hierarchies. Basically, a new variant object easily can be added "under" a higher level object. At synthesis time, the synthesis process may select the new variant object or not depending upon parameters propagated or generated or otherwise imposed during the synthesis process. There is not a need to expend as much effort to ensure consistency with the prior hierarchy. The synthesis process either selects the new variant object or it does not. Other objects are not significantly impacted. The ability to "underload" a hierarchy in this manner is believed to make programming more efficient by promoting ease of code reuse in a variety of different behavioral descriptions and system designs.

Computer Program and Data Structure Implementation Encoded in Computer Readable Media It will be appreciated that computer program processes implement the various synthesis threads and other synthesis processes described throughout this document including calculations performed using attributer calculator information.

Moreover, it will be appreciated that the various threads and processes are implemented with computer programs stored in computer readable media. Furthermore the basic object class hierarchy and the various composite behavior objects and atomic objects including their associated methods, information and data structures are stored in computer readable media.

Thus, it will be appreciated that a behavioral description in accordance with a present embodiment of the invention is encoded in a computer readable medium. For instance, each variant behavior object includes a behavior code unit implemented in computer readable code which is associated with an input node and an output node The input node the output are implemented with computer readable code. The input node can be associated with a data set type. Such variant behavior object also can be associated with behavior code that effects a pattern for processing of a data set and that references another behavior object. The reference to another behavior object can be a self-reference. An abstract transport object can effect transport of a data set from the input node to the other behavior code unit.

What is claimed is:

1. A computer implemented method of converting a data set of a first type to a data set type of a second type, the computer having a processor and a computer readable media storing code that, when executed, performs the method, the method comprising:

casting up a first data set of a first type to a prescribed data set type that is large enough to encompass a data set of a second type, wherein the first data set is stored on the computer readable media; and casting down the casted up first data set from the prescribed data set type to the second data set of the second data set type, wherein the second data set is stored on the computer readable media.

2. The computer implemented method of claim 1, wherein casting up includes increasing a number of bits in the first data set such that an increased number of bits in the first data set matches a number of bits in the prescribed data set type, and wherein casting down includes reducing a number of bits in the casted up first data set such that a reduced number of bits in the first set matches a number of bits in the second data set type.

3. The computer implemented method of claim 1, wherein casting up includes adding a number of bits in the first data set such that a number of bits in the added to first data set matches a number of bits in the prescribed data set type, and further including the step of, assigning each of the added bits a prescribed value, and wherein casting down includes eliminating a number of the added bits from the casted up first data set such that a number of bits in the eliminated from first data set matches a number of bits in the second data set type.

4. The computer implemented method of claim 1, further comprising inserting a cast behavior object into a design to cast an abstract transport behavior object to the prescribed data set type.

5. The computer implemented method of claim 4, wherein the prescribed data set type is cast to a word data set.

6. The computer implemented method of claim 4, wherein a transport object that is cast to the prescribed data set type is cast to a word data set type.

7. The computer implemented method of claim 4, wherein transports on both inputs of an add object are cast to be matching word type data sets.

8. The computer implemented method of claim 1, further comprising determining the first and second type based on a fixed value.

9. The computer implemented method of claim 1, further comprising determining the first and second type based upon a data set type propagated within a design during a synthesis process.

* * * * *